(12) United States Patent
Zhou et al.

(10) Patent No.: US 12,363,484 B2
(45) Date of Patent: Jul. 15, 2025

(54) LOUDSPEAKERS

(71) Applicant: SHENZHEN SHOKZ CO., LTD., Guangdong (CN)

(72) Inventors: Wenbing Zhou, Shenzhen (CN); Lei Zhang, Shenzhen (CN); Fengyun Liao, Shenzhen (CN); Xin Qi, Shenzhen (CN); Shanyong Gu, Beijing (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 0 days.

(21) Appl. No.: 18/916,684

(22) Filed: Oct. 15, 2024

(65) Prior Publication Data
US 2025/0039610 A1    Jan. 30, 2025

Related U.S. Application Data

(63) Continuation of application No. PCT/CN2024/087645, filed on Apr. 14, 2024.

(30) Foreign Application Priority Data

| Apr. 14, 2023 | (CN) | 202310425028.9 |
| Apr. 14, 2023 | (CN) | 202310444739.0 |
| Apr. 14, 2023 | (CN) | 202310446118.6 |

(51) Int. Cl.
*H04R 17/00* (2006.01)
*H10N 30/80* (2023.01)
*H10N 30/88* (2023.01)

(52) U.S. Cl.
CPC .......... *H04R 17/00* (2013.01); *H10N 30/802* (2023.02); *H10N 30/88* (2023.02)

(58) Field of Classification Search
CPC ...... H04R 17/00; H04R 1/02; H04R 2499/11; H04R 7/045; H04R 9/06; H04R 9/02;
(Continued)

(56) References Cited

U.S. PATENT DOCUMENTS

| 4,156,801 A | 5/1979 | Whelan et al. |
| 2003/0170381 A1* | 9/2003 | Kashiwaya ............. A61P 29/00 427/376.2 |

FOREIGN PATENT DOCUMENTS

| CN | 211744726 U | 10/2020 |
| CN | 217693709 U | 10/2022 |

(Continued)

OTHER PUBLICATIONS

International Search Report in PCT/CN2024/087645 mailed on Jun. 20, 2024, 7 pages.
(Continued)

*Primary Examiner* — Angelica M McKinney
(74) *Attorney, Agent, or Firm* — METIS IP LLC

(57) ABSTRACT

Disclosed is a loudspeaker, including: a casing, a driving unit, and a vibration unit. The driving unit is fixed to the casing and is drivingly connected with the vibration unit. The driving unit includes a plurality of driving beams, each of the plurality of driving beams includes a fixed region and an overhanging region. Each of the plurality of driving beams is connected with the casing through its fixed region, and each of the plurality of driving beams is connected with the vibration unit through its overhanging region.

19 Claims, 44 Drawing Sheets

(58) Field of Classification Search
CPC .. H04R 2400/11; H10N 30/802; H10N 30/88; A61P 29/00
See application file for complete search history.

(56) References Cited

FOREIGN PATENT DOCUMENTS

| | | |
|---|---|---|
| CN | 217935867 U | 11/2022 |
| CN | 115914951 A | 4/2023 |
| WO | WO-2023051372 A1 * | 4/2023 ............... H04R 1/02 |

OTHER PUBLICATIONS

Written Opinion in PCT/CN2024/087645 mailed on Jun. 20, 2024, 11 pages.

* cited by examiner

LOUDSPEAKERS

CROSS-REFERENCE TO RELATED APPLICATIONS

This application is a Continuation of International Application No. PCT/CN2024/087645, filed on Apr. 14, 2024, which claims priority to Chinese application No. 202310444739.0, filed on Apr. 14, 2023, claims priority to Chinese application No. 202310446118.6, filed on Apr. 14, 2023, and claims priority to Chinese application No. 202310425028.9, filed on Apr. 14, 2023, the entire contents of each of which is incorporated herein by reference.

TECHNICAL FIELD

The present disclosure relates to the field of acoustic technology, and in particular, to a loudspeaker.

BACKGROUND

The piezoelectric loudspeaker uses an inverse piezoelectric effect of piezoelectric materials to produce vibrations that emit sound waves outward. Compared to traditional electrodynamic loudspeakers, it offers advantages such as high electromechanical transducer efficiency, low energy consumption, compact size, and a high degree of integration. With the current trend of device miniaturization and integration, piezoelectric loudspeakers have significant potential and promising prospects. A loudspeaker typically includes three core components: the driving part, the vibration part, and the support auxiliary part. A common challenge faced by conventional piezoelectric speakers, particularly micro-speakers, is the insufficient driving capability of the driving part. This limitation results in a lower Sound Pressure Level (SPL) within specific frequency ranges (e.g., 20 Hz to 20 kHz), leading to reduced sensitivity within the audible range.

SUMMARY

Embodiments of the present disclosure provide a loudspeaker. The loudspeaker may include: a casing, a driving unit, and a vibration unit, wherein: the driving unit is fixed to the casing and is drivingly connected with the vibration unit; the driving unit includes a plurality of driving beams, each of the plurality of driving beams includes a fixed region and an overhanging region, each of the plurality of driving beams is connected with the casing through its fixed region, and the each of the plurality of driving beams is connected with the vibration unit through its overhanging region.

BRIEF DESCRIPTION OF THE DRAWINGS

The present disclosure will be further illustrated by way of exemplary embodiments, which will be described in detail by means of the accompanying drawings. These embodiments are not limiting, and in these embodiments, the same numbering denotes the same structure, wherein.

DETAILED DESCRIPTION

Figure 1A:
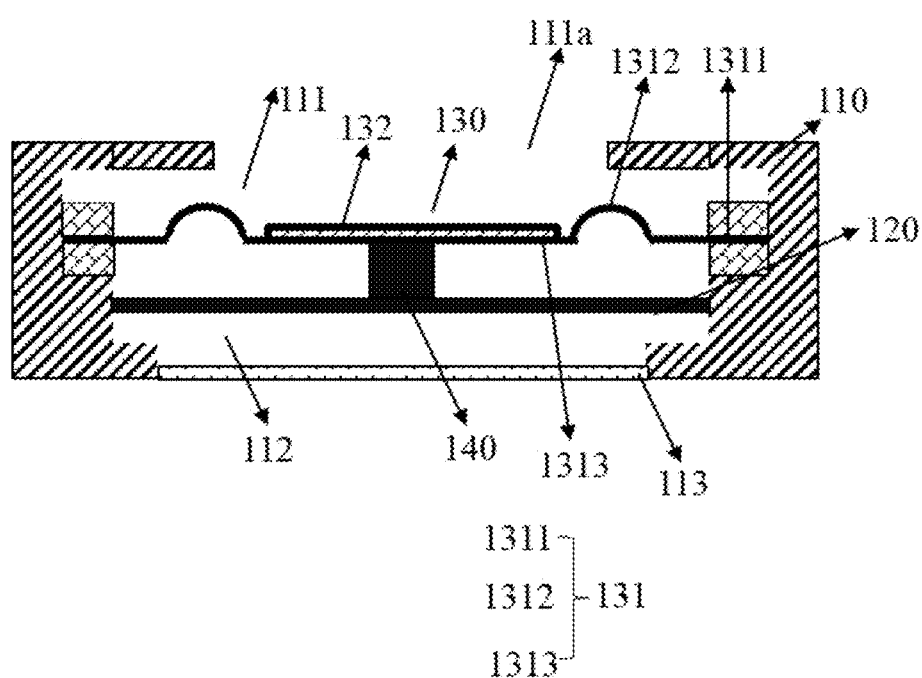
FIG. 1A is a schematic diagram illustrating an exemplary internal structure of a loudspeaker according to some embodiments of the present disclosure.

In order to more clearly illustrate the technical solutions of the embodiments of the present disclosure, the accompanying drawings required to be used in the description of the embodiments are briefly described below. Obviously, the accompanying drawings in the following description are only some examples or embodiments of the present disclosure, and it is possible for a person of ordinary skill in the art to apply the present disclosure to other similar scenarios in accordance with the accompanying drawings without creative labor. Unless obviously obtained from the context or the context illustrates otherwise, the same numeral in the drawings refers to the same structure or operation.

It should be understood that the terms "system", "device", "unit" and/or "module" as used herein is a way to distinguish between different components, elements, parts, sections or assemblies at different levels. The words may be replaced by other expressions if other words accomplish the same purpose.

Unless the context clearly suggests an exception, the words "a", "an", "one", and/or "the" do not refer specifically to the singular, but may also include the plural. Generally, the terms "including" and "comprising" suggest only the inclusion of clearly identified steps and elements that does not constitute an exclusive list, and the method or apparatus may also include other steps or elements.

Flowcharts are used in the present disclosure to illustrate operations performed by a system in accordance with embodiments of the present disclosure. It should be appreciated that the preceding or following operations are not necessarily performed in an exact sequence. Instead, steps can be processed in reverse order or simultaneously. Also, it is possible to add other operations to these processes or remove a step or steps from them.

Figure 1B:
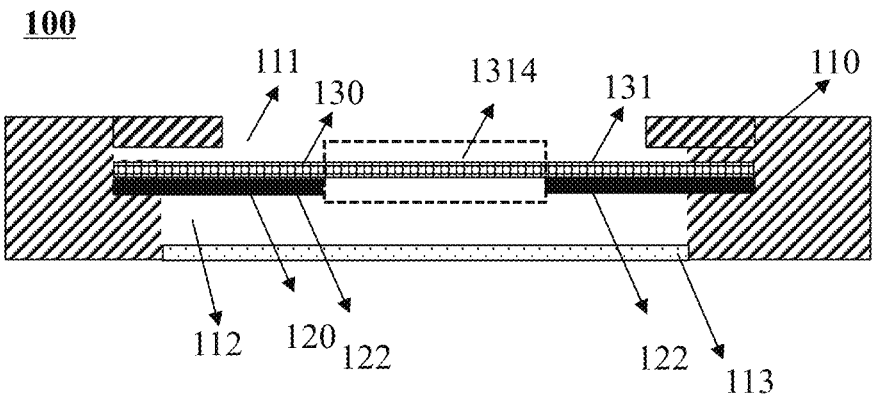
FIG. 1B is a schematic diagram illustrating another exemplary internal structure of a loudspeaker according to some embodiments of the present disclosure.
Figure 2:
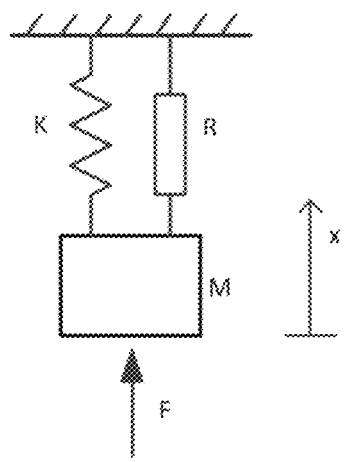
FIG. 2 is a schematic diagram illustrating an exemplary model of a mass-spring-damping system according to some embodiments of the present disclosure.
Figure 3:
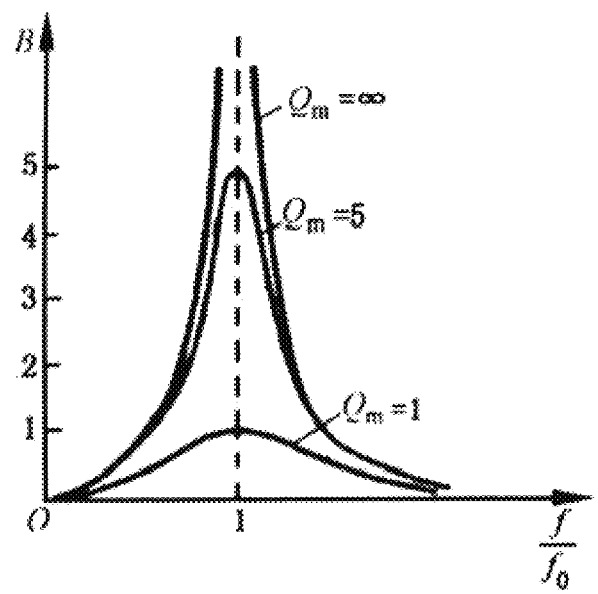
FIG. 3 is a diagram illustrating a velocity resonance curve of a mass-spring-damping system according to some embodiments of the present disclosure.
Figure 4:
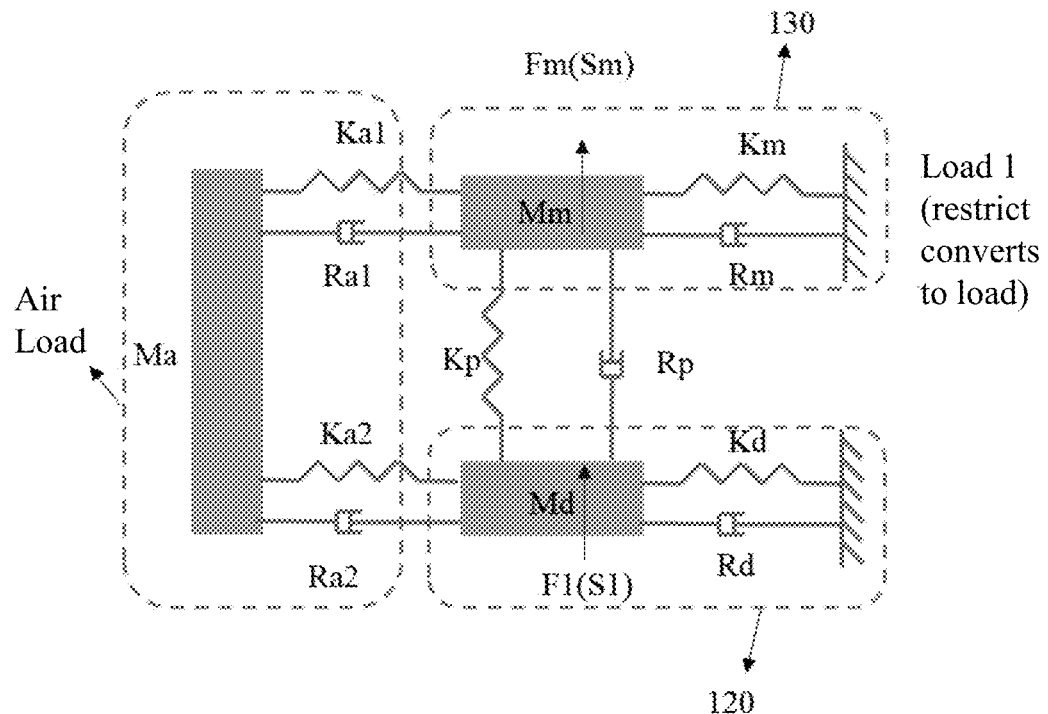
FIG. 4 is a schematic diagram illustrating an equivalent mechanical model of a loudspeaker according to some embodiments of the present disclosure.

FIG. 1A is a schematic diagram illustrating an exemplary internal structure of a loudspeaker according to some embodiments of the present disclosure. FIG. 1B is a schematic diagram illustrating another exemplary internal structure of a loudspeaker according to some embodiments of the present disclosure. FIG. 2 is a schematic diagram illustrating an exemplary model of a mass-spring-damping system according to some embodiments of the present disclosure. FIG. 3 is a diagram illustrating a velocity resonance curve of a mass-spring-damping system according to some embodiments of the present disclosure. FIG. 4 is a schematic diagram illustrating an equivalent mechanical model of a loudspeaker according to some embodiments of the present disclosure. A vibration process of a loudspeaker is described below in conjunction with FIG. 1A to FIG. 4.

Referring to FIG. 1A, in some embodiments, a loudspeaker 100 may include a casing 110, a driving unit 120, a vibration unit 130, etc. In some embodiments, the driving unit 120 is fixed to the casing 110, and the driving unit 120 is drivingly connected with the vibration unit 130.

The loudspeaker 100 may be configured to convert an audio signal (e.g., an electrical signal including acoustic information) into a sound signal. In some embodiments, the loudspeaker 100 may be a bone-conduction loudspeaker, an air-conduction loudspeaker, or a combined bone-air-conduction loudspeaker. In some embodiments, the loudspeaker 100 may be applied to glasses, a smart bracelet, a headset, a hearing aid, a smart helmet, a smartwatch, a smart garment, a smart backpack, a smart accessory, etc., or any combination thereof. For example, the loudspeaker 100 may be applied to functional myopia glasses, presbyopia glasses, cycling glasses, sunglasses, etc. As another example, the loudspeaker 100 may be intelligent glasses, such as audio glasses with the function of headphones. In some embodiments, the loudspeaker 100 may also be applied to a head-mounted device such as a helmet, an Augmented Reality (AR) device, or a Virtual Reality (VR) device. In some embodiments, the AR device or the VR device may include a virtual reality headset, virtual reality glasses, an augmented reality headset, augmented reality glasses, or the like, or any combination thereof. For example, the VR device and/or the AR device may include Google Glass, Oculus Rift, Hololens, Gear VR, or the like.

The driving unit 120 serves as a driving end of the loudspeaker 100 and provides a driving force for the loudspeaker 100 by converting electrical energy into mechanical energy. A type of the driving unit 120 may include, but is not limited to, electromagnetic, electrostatic, piezoelectric, or the like. The vibration unit 130 serves as a load end of the loudspeaker 100 and includes a diaphragm 131 and a center reinforcement member 132. In some embodiments, the diaphragm 131 may include an edge fixing portion 1311, a folded ring portion 1312, and a center portion 1313. The edge fixing portion 1311 may be fixedly connected with the casing 110 of the loudspeaker 100, and the center portion 1313 may be provided with the center reinforcement member 132. In some embodiments, the center reinforcement member 132 may be a single part disposed on an upper side or a lower side of the center portion 1313. In some embodiments, the center reinforcement member 132 may also be a plurality of parts disposed on the upper side and the lower side of the center portion 1313. The driving unit 120 may be connected with the center reinforcement member 132 or be directly connected with the center portion 1313 of the diaphragm 131 to realize the transmission of mechanical energy from the driving end (the driving unit 120) to the load end (the vibration unit 130). In some embodiments, the loudspeaker 100 may include a support auxiliary structure, and the support auxiliary structure mainly includes a connection and fixation portion (e.g., a vibration transmission unit 140) between the driving unit 120 and the vibration unit 130, the casing 110, etc. In some embodiments, the diaphragm 131 may separate a space within the casing 110 into two acoustic cavities (e.g., a front cavity 111 and a rear cavity 112), and the loudspeaker 100 may be provided with corresponding structures in the two acoustic cavities (e.g., the front cavity 111 and the rear cavity 112). For example, the casing 110 is provided with a corresponding sound outlet hole (e.g., a sound outlet hole 111a that is connected with the front cavity 111), a damping mesh 113 disposed on the sound outlet hole, etc., so as to realize the adjustment of the sensitivity and Q value of a frequency response curve of the loudspeaker 100 and improve the output performance of the loudspeaker 100.

In some embodiments, the loudspeaker 100 may be equivalently modeled as a plurality of mass-spring-damping systems connected via series connection and/or parallel connection. In practice, when an operation frequency of the loudspeaker 100 is far away from an intrinsic frequency $f_0$ of a particular mass-spring-damping system, the mass-spring-damping system undergoes a forced vibration under an excitation load to transmit a force and displacement. When the operation frequency of the loudspeaker 100 is close to an intrinsic frequency $f_0$ of a particular mass-spring-damping system, the mass-spring-damping system resonates, causing the loudspeaker 100 to vibrate at a larger speed in a local structure corresponding to the mass-spring-damping system, which is ultimately reflected as peaks and valleys in the frequency response curve of the loudspeaker 100.

Referring to FIG. 2, a single mass-spring-damping system shown in FIG. 2 is analyzed. The movement of the single mass-spring-damping system shown in FIG. 2 may be described by the following equation (1):

$$M\frac{d^2x}{dt^2} + R\frac{dx}{dt} + Kx = F\cos\omega t, \tag{1}$$

where M denotes the mass of the system, R denotes the damping of the system, K denotes the elasticity coefficient of the system, F denotes the amplitude of a driving force, x denotes the displacement of the system, and w denotes the angular frequency of an external force.

Solving a steady-state velocity of the above equation (1) yields:

$$v = v_a \cos\left(\omega t - \theta + \frac{\pi}{2}\right), \tag{2}$$

where v denotes the movement velocity, and $v_a$ denotes the amplitude of the movement velocity.

Combining equation (1) with equation (2), the amplitude of the movement velocity of the system is determined as:

$$v_a = \frac{F}{|Z|} = \frac{FQ_m z}{\omega_0 M\sqrt{z^2 + (z^2-1)^2 Q_m^2}}, \tag{3}$$

where $Q_m$ denotes a mechanical quality factor, $$Q_m = \frac{\omega_0 M}{R}; z = \frac{\omega}{\omega_0}.$$

Through dividing $v_a$ by a normalization factor $$\frac{F}{\omega_0 M},$$

a normalized velocity $v_B$ may be obtained by a following equation (4):

$$v_B = \frac{FQ_m z}{\sqrt{z^2 + (z^2-1)^2 Q_m^2}}, \tag{4}$$

Referring to FIG. 3, when an operation frequency f of the system is equal to the intrinsic frequency $f_0$ of the mass-spring-damped system, i.e., when $f=f_0$, an output movement velocity of the mass-spring-damping system reaches a maximum value as:

$$v_{amax} = \frac{F}{|Z|} = \frac{FQ_m}{\omega_0 M}. \tag{5}$$

An amplitude of an output sound pressure (a sound pressure level) of the loudspeaker 100 is positively related to the output movement velocity of the mass-spring-damping system, i.e., $p_a \propto v_a$.

Thus, the output sound pressure level of the loudspeaker 100 may be modulated by designing an amplitude of an output movement velocity of each mass-spring-damping system of the loudspeaker 100.

Referring to FIG. 4, in some embodiments, various units of the loudspeaker 100 (e.g., the driving unit 120, the vibration unit 130) may be equivalently modeled as a mechanical model shown in FIG. 4.

One end of the driving unit 120 is fixedly connected with the casing 110 and the other end of the driving unit 120 is connected with the vibration unit 130 while the driving unit 120 is in contact with the air. Since the driving unit 120 has a corresponding mass Md, a damping R, and a stiffness K, it may be equivalently represented by a spring with a stiffness Kd and a damper with a damping Rd to be connected with the casing 110, and may serve as an inertial unit with the mass Md. In some embodiments, the driving unit 120 is connected with the vibration unit 130 via a spring Kp and a damping Rp, and the driving unit 120 is connected with an air load via a spring Ka2 and a damping Ra2. In some embodiments, the driving unit 12 may be used as an electrical energy-mechanical energy conversion unit to output a force F1 or a displacement S1 for a vibration system of the loudspeaker 100. In order to enhance the output sound pressure level of the loudspeaker 100, it is necessary to enhance the force F1 or the displacement S1 output by the driving unit 120 and to match an impedance between the driving unit 120 and the vibration unit 130, so that the force F1 or the displacement S1 output by the driving unit 120 may be transmitted to the vibration unit 130 with a minimum loss, causing the vibration unit 130 to output a maximum displacement or velocity.

In the vibration unit 130, all masses of the diaphragm 131, the center reinforcement member 132, and the vibration transmission unit 140 may be equated to a total mass Mn, and the diaphragm 131 is connected with the casing 110 via a spring with a stiffness Km and a damper with a damping Rm, while the diaphragm 131 is connected with the air load through a spring Ka1 and a damping Ra1 to realize the radiation of the sound pressure by pushing the air to move. A load of the diaphragm 131 varies with a movement displacement of the diaphragm 131, and thus the diaphragm 131 is a variable load. In some embodiments, the load of the vibration unit 130 also includes a load of the air pushed by the diaphragm 131, which is an inertial load that is primarily determined by an amount of air pushed by the diaphragm 131, and the amount of air pushed by the diaphragm 131 also determines a size of the sound pressure level that is output by the loudspeaker 100. In some embodiments, the vibration unit 130 may also be referred to as a diaphragm assembly.

In summary, in order to enhance the output performance (e.g., the output sound pressure level) of the loudspeaker 100, the amount of air pushed by the diaphragm 131 may be designed to be enhanced (i.e., the vibration amplitude of the vibration unit 130 may be enhanced). In order to enhance the vibration amplitude of the vibration unit 130, on the one hand, the force and displacement output from the driving unit 120 may be designed to be enhanced (e.g., by designing a structure of a driving beam 122 of the driving unit 120, etc.), and on the other hand, the transmission efficiency of the force and displacement between the driving unit 120 and the vibration unit 130 may be designed to be enhanced (e.g., by designing a coupled elastic structure 124 of the driving unit 120).

In some embodiments, the driving unit 120 includes a plurality of driving beams, and each of the driving beams includes a fixed region and an overhanging region. Each of the driving beams is fixedly connected with the casing 110 through the fixed region, and each of the driving beams is in drive-connection with the vibration unit 130 through the overhanging region, so as to drive the vibration unit 130 to vibrate to produce a sound output. In some embodiments, a structure of the driving unit 120 may be designed to enhance the driving capability (the output force and displacement) from the driving unit 120, thereby enhancing the output sound pressure level of the loudspeaker 100. In some embodiments, the overhanging region has a length dimension in a direction extending from the fixed region to the overhanging region; and the overhanging region has a thickness dimension in a vibration direction of the vibration unit 130 (the diaphragm 131). During the process of vibration of the driving beams, deformation is mainly generated in the overhanging region to provide a driving force and a displacement for the vibration unit 130. By designing the dimension of the overhanging region of the driving beam, it is possible to regulate the deformation degree of the driving beam, so as to enhance the driving ability of the driving beam and enhance the output of the loudspeaker 100. On the other hand, the driving unit 120, which is used as a mass-spring-damping system, may provide a stiffness and a mass to the entire loudspeaker 100, thereby affecting the resonance frequency of the loudspeaker 100. By designing structural parameters of the driving beam, the stiffness and mass of the driving unit 120 may be adjusted to regulate vibration modes of the loudspeaker 100, thereby optimizing the output performance of the loudspeaker 100.

Figure 5:
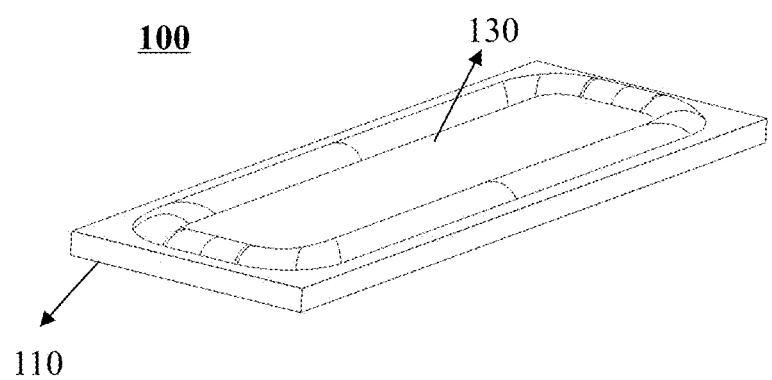
FIG. 5 is a schematic diagram illustrating an exemplary loudspeaker according to some embodiments of the present disclosure.
Figure 6:
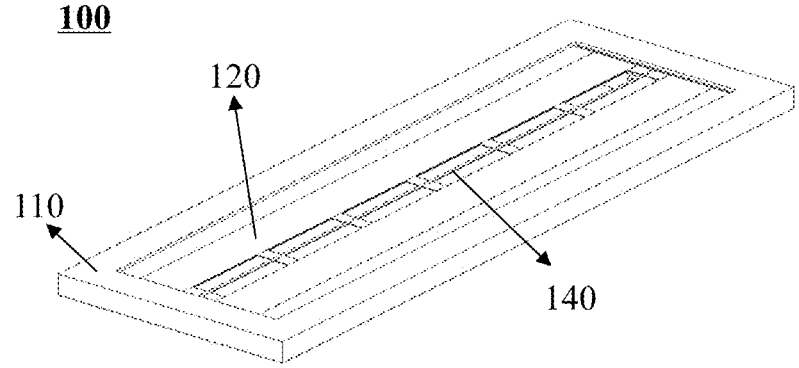
FIG. 6 is a schematic diagram illustrating another view of a loudspeaker according to some embodiments of the present disclosure.
Figure 7:
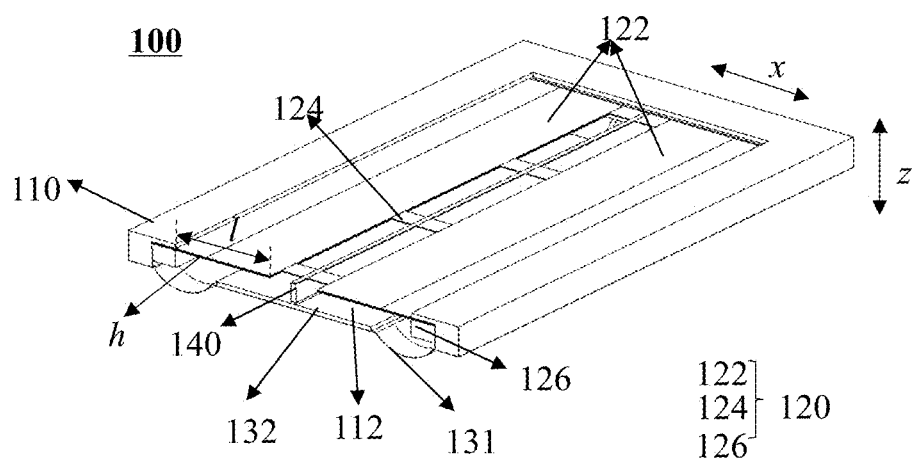
FIG. 7 is a schematic diagram illustrating a cross-section of the loudspeaker shown in FIG. 6 according to some embodiments of the present disclosure.
Figure 8:
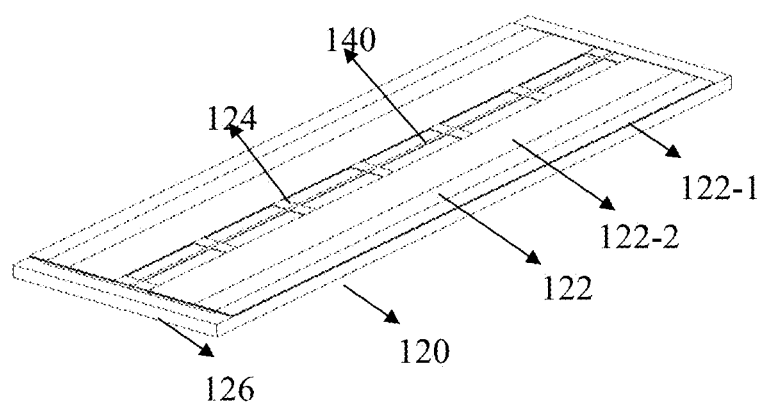
FIG. 8 is a schematic diagram illustrating an exemplary structure of a driving unit according to some embodiments of the present disclosure.
Figure 9:
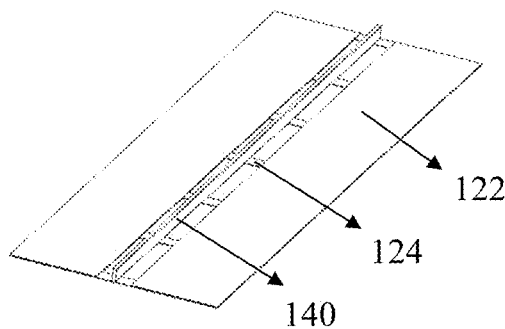
FIG. 9 is a schematic diagram illustrating a connection between a driving beam and a vibration transmission unit according to some embodiments of the present disclosure.
Figure 10:
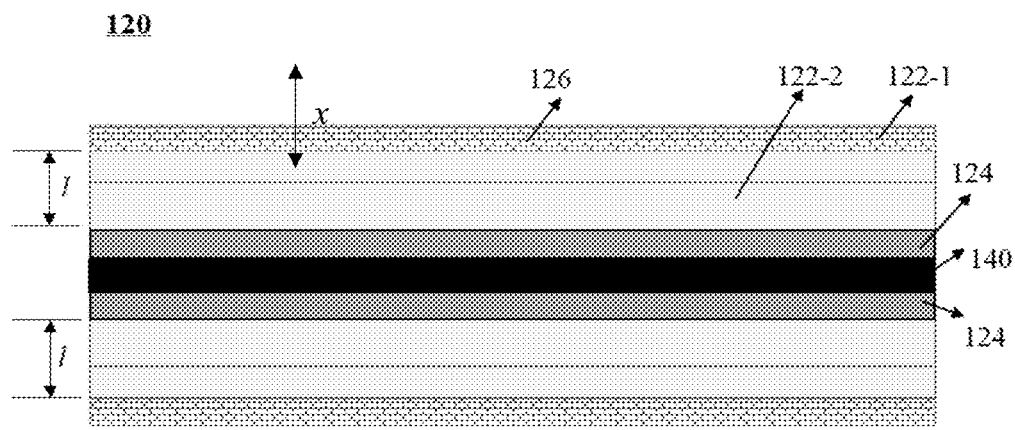
FIG. 10 is a schematic diagram illustrating another exemplary structure of a driving unit according to some embodiments of the present disclosure.
Figure 11:
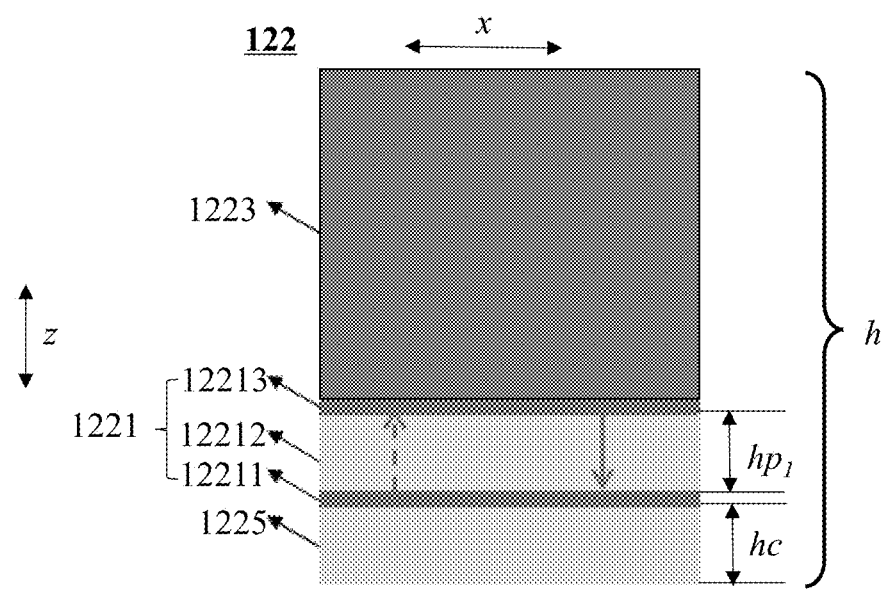
FIG. 11 is a schematic diagram illustrating an exemplary internal structure of a driving beam according to some embodiments of the present disclosure.

FIG. 5 is a schematic diagram illustrating a loudspeaker according to some embodiments of the present disclosure. FIG. 6 is a schematic diagram illustrating another view of a loudspeaker according to some embodiments of the present disclosure. FIG. 7 is a diagram illustrating a cross-section of the loudspeaker shown in FIG. 6. FIG. 8 is a schematic diagram illustrating an exemplary structure of a driving unit according to some embodiments of the present disclosure. FIG. 9 is a schematic diagram illustrating a connection between a driving beam and a vibration transmission unit according to some embodiments of the present disclosure. FIG. 10 is a schematic diagram illustrating another exemplary structure of a driving unit according to some embodiments of the present disclosure. FIG. 11 is a schematic diagram illustrating an exemplary internal structure of a driving beam according to some embodiments of the present disclosure.

Referring to FIG. 5, FIG. 6, and FIG. 7, in some embodiments, the loudspeaker 100 may include the casing 110, the driving unit 120, and the vibration unit 130. The casing 110 mainly provides a platform for mounting and fixing other components of the loudspeaker 100. In some embodiments, the shape of the casing 110 may be circular, oval, quadrilateral (including, but not limited to, square, rectangular, rhombus, zigzag, etc.), pentagonal, hexagonal, octagonal, and other polygonal shapes. The following content is an exemplary illustration of the loudspeaker 100 when the shape of the casing 110 is rectangular. In some embodiments, the casing 110, the driving unit 120, and the vibration unit 130 may enclose an acoustic cavity (e.g., the rear cavity 112), as shown in FIG. 7. In some embodiments, the vibration of the vibration unit 130 may drive the air inside the rear cavity 112 to vibrate to produce a sound output. In some embodiments, the vibration of the vibration unit 130 may also drive air on a side of the vibration unit 130 that is back away from the rear cavity 112 to produce a sound output.

The driving unit 120 is fixed to the casing 110, and the driving unit 120 is in drive-connection with the vibration unit 130. The driving unit 120 may drive the vibration unit 130 to vibrate to generate a sound output. Referring to FIG. 8 and FIG. 10, in some embodiments, the driving unit 120 may include the driving beam 122, and the driving beam 122 may be a beam-like structure. The driving beam 122 may include a fixed region 122-1 and an overhanging region 122-2, the driving beam 122 is connected with the casing 110 via the fixed region 122-1, and the driving beam 122 is drivingly connected with the vibration unit 130 via the overhanging region 122-2 (or a free end of the driving beam 122). Referring to FIGS. 8, 10, and 11, in some embodiments, in a direction extending from the fixed region 122-1 to the overhanging region 122-2, the overhanging region 122-2 has a length dimension l; and in a vibration direction of the vibration unit 130, the overhanging region 122-2 (the driving beam 122) has a thickness dimension h. Since the vibration of the vibration unit 130 is generated by the deformation of the driving beam 122, the vibration direction of the vibration unit 130 is the deformation direction of the driving beam 122. The length dimension l and the thickness dimension h of the overhanging region 122-2 may affect the deformation of the overhanging region 122-2, thereby affecting a force and a displacement output by the driving beam 122, and thereby affecting the output sound pressure level of the loudspeaker 100. Thus, the length dimension l and the thickness dimension h of the overhanging region 122-2 may be designed to enhance the output sound pressure level of the loudspeaker 100.

Referring to FIG. 7 to FIG. 10, in some embodiments, the driving unit 120 may further include the coupled elastic structure 124, and the overhanging region 122-2 of the driving beam 122 is drivingly connected with the vibration unit 130 via the coupled elastic structure 124, and the coupled elastic structure 124 may effectively transmit the force and displacement generated by the deformation of the driving beam 122 to the vibration unit 130. In some embodiments, there may be one or more driving beams 122, and each driving beam 122 may correspond to one or more coupled elastic structures 124. In some embodiments, the coupled elastic structure 124 may be made of a semiconductor material, a polymer material, or the like. Exemplary semiconductor materials may include silicon (Si), silicon dioxide ($SiO_2$), silicon nitride (SiNx), silicon carbide (SiC), or the like. Exemplary polymeric materials may include polyimide (Polyimide, PI), poly-p-xylene (Parylene), polydimethylsiloxane (Polydimethylsiloxane, PDMS), hydrogels, photoresists, silicone gels, silicone gels, silicone sealants, or the like. In some embodiments, the coupled elastic structure 124 may have a single-layer or multi-layer structure. For example, the coupled elastic structure 124 may have a single-layer structure made of a semiconductor material (e.g., Si, $SiO_2$) or a polymer material (e.g., polyimide). As another example, the coupled elastic structure 124 may have a multi-layer structure made of a plurality of semiconductor materials (e.g., Si/$SiO_2$ bilayer structure, Si/SiNx bilayer structure, etc.). As a further example, the coupled elastic structure 124 may have a multi-layer structure made of a plurality of polymeric materials. As a further example, the coupled elastic structure 124 may have a multi-layer structure made of one or more polymeric materials and one or more semiconductor materials.

Referring to FIG. 7, FIG. 8, and FIG. 10, in some embodiments, the driving unit 120 may also include a substrate 126 through which the driving unit 120 is fixed to the casing 110. In some embodiments, the shape of the substrate 126 may be consistent with the shape of the casing 110. For example, when the casing 110 is rectangular, the substrate 126 may be a rectangular ring. Referring to FIG. 10, in some embodiments, the fixed region 122-1 of the driving beam 122 is fixed to the substrate 126. In the direction extending from the fixed region 122-1 to the overhanging region 122-2, a length of the fixed region 122-1 may be considered to be the same as a width of the substrate 126. In some embodiments, the length of the fixed region 122-1 may be less than the width of the substrate 126. When the length of the fixed region 122-1 is considered to be the same as the width of the substrate 126, correspondingly, the length dimension l of the overhanging region 122 may be obtained by subtracting the width of the corresponding substrate 126 from a total length of the driving beam 122.

In some embodiments, the vibration unit 130 may receive a force or a displacement transmitted by the driving unit 120 to generate a corresponding vibration to push the air to move. Referring to FIG. 5 and FIG. 7, in some embodiments, the vibration unit 130 mainly includes the diaphragm 131 and the center reinforcement member 132. The diaphragm 131 is drivingly connected with one or more overhanging regions 122-2 of the one or more driving beams 122 through the coupled elastic structure 124, and the force and displacement generated by the deformation of the one or more overhanging regions 122-2 are transmitted to the diaphragm 131 to drive the diaphragm 131 to vibrate. The diaphragm 131 may be considered to be connected with an inertial load of the air by a spring and damping to realize radiation of sound pressure by air movement. The load of the air pushed by the diaphragm 131 is the inertial load, which is mainly determined by the amount of air that is pushed by the diaphragm 131. At the same time, the amount of air pushed by the diaphragm 131 affects the sound pressure level outputted by the loudspeaker 100. By enhancing the driving performance of the driving unit 120, a maximum displacement or velocity output by the diaphragm 131 may be increased, the amount of air pushed by the diaphragm 131 may be increased, and the output performance of the loudspeaker 100 can be enhanced. In some embodiments, a material of the diaphragm 131 may be a material including, but not limited to, an organic polymer material, or the like. In some embodiments, the organic polymeric material may be Polyethylene Terephthalate (PET), Polyetherimide (PEI), Polyimide (PI), Polyetheretherketone (PEEK), silica gel, etc., or any combination thereof. In some embodiments, the diaphragm 131 may have a single-layer or multi-layer structure. For example, the diaphragm 131 may have a single-layer structure made of a polymeric material (e.g., polyimide). As another example, the diaphragm 131 may have a multi-layer structure made of a plurality of polymeric materials.

In some embodiments, the center reinforcement member 132 is disposed in a center region of the diaphragm 131. The center reinforcement member 132 may adjust a stiffness of the diaphragm 131, thereby adjusting the vibration modes of the diaphragm 131, improving the vibration modes of the loudspeaker 100, and enhancing the output performance of the loudspeaker 100. For example, the center reinforcement member 132 may adjust a higher-order vibration mode of the diaphragm 131 at a high frequency. A range of high frequencies corresponding to different scenarios may vary. For example, in some scenarios, the high frequency refers to a frequency more than 3 kHz. As another example, in other scenarios, the high frequency refers to a frequency in a range of 10 kHz to 20 kHz, etc. In some embodiments, the center reinforcement member 132 may be disposed on a side of the diaphragm 131 close to the rear cavity 112 (as shown in FIG. 7) or on a side of the diagram 131 back from the rear cavity 112. In some embodiments, a material of the center reinforcement member 132 may include a metal, a semiconductor, an anisotropic material, or the like. Exemplary metallic materials may include stainless steel, aluminum alloys, magnesium-lithium alloys, copper, copper alloys, or the like. Exemplary anisotropic materials may include carbon fiber, FR4 epoxy fiberglass sheets, or the like. Exemplary semiconductor materials may include silicon (Si), silicon dioxide ($SiO_2$), silicon nitride (SiNx), silicon carbide (SiC), or the like. In some embodiments, the material of the center reinforcement member 132 is a semiconductor, and the center reinforcement member 132 may have a single-layer or multi-layer structure. For example, the center reinforcement member 132 may have a single-layer structure made of a semiconductor material (e.g., Si, $SiO_2$). As another example, the coupled elastic structure 124 may have a multi-layer structure made of a plurality of semiconductor materials (e.g., Si/$SiO_2$ bilayer structure, Si/SiNx bilayer structure, etc.).

Referring to FIGS. 7, 8, and 9, in some embodiments, the loudspeaker 100 may further include the vibration transmission unit 140, the vibration transmission unit 140 is drivingly connected with the driving unit 120 (e.g., the driving beam 122 or the coupled elastic structure 124) and the diaphragm 131, respectively, and the vibration transmission unit 140 may transmit the force and displacement output by the driving unit 120 to the diaphragm 131 to push the diaphragm 131 to vibrate to produce sound output. In some embodiments, the vibration transmission unit 140 may use a material that has a high stiffness and a low density to minimize a transmission loss of the force and displacement between the driving unit 120 and the diaphragm 131. In some embodiments, the material of the vibration transmission unit 140 may include a metal, a semiconductor, or the like. Exemplary metallic materials may include stainless steel, aluminum alloys, magnesium-lithium alloys, copper, copper alloys, or the like. Exemplary semiconductor materials may include silicon (Si), silicon dioxide ($SiO_2$), silicon nitride (SiNx), silicon carbide (SiC), or the like. In some embodiments, when the vibration transmission unit 140 is made of a semiconductor material, the center reinforcement member 132 may have a single-layer or multi-layer structure. For example, the vibration transmission unit 140 may have a single-layer structure made of a semiconductor material (e.g., Si, SiO2). As another example, the vibration transmission unit 140 may have a multi-layer structure made of a plurality of semiconductor materials (e.g., Si/$SiO_2$ bilayer structure, Si/SiNx bilayer structure, etc.).

In some embodiments, a single driving beam 122 may be considered as a beam-like cantilever beam structure with a load, an intrinsic frequency of the beam structure may be obtained by the following equation (6):

$$\omega_n = (\beta_n l)^2 \left( \frac{Eh^2}{12\rho l^4} \right)^{1/2}, n = 1, 2, \ldots \ldots, \quad (6)$$

where $\beta_n l$ denotes a constant term, which has different values with different values of n as follows: $\beta_1 l=1.875104$, $\beta_2 l=4.694091$, $\beta_3 l=7.854757$, $\beta_4 l=10.995541$, $\beta_5 l=14.1372$; E denotes the Young's modulus of a material of the driving beam 122, I denotes a moment of inertia, $\rho$ denotes a density of the material of the driving beam 122, l denotes a length of a cantilever beam (i.e., the length dimension of the overhanging region 122 of the driving beam 122), and h denotes a thickness of the cantilever beam (i.e., the thickness dimension of the driving beam 122 and the overhanging region 122-2).

According to equation (6), by designing the structure and dimension of the driving beam 122, the intrinsic frequency of the driving beam 122 may be adjusted to improve the output performance of the loudspeaker 100.

In some embodiments, refer to FIG. 7, FIG. 10, and FIG. 11, for each of the driving beams 122, in the direction extending from the fixed region 122-1 to the overhanging region 122-2 (i.e., an x-direction shown in the figure), the overhanging region 122-2 has the length dimension l; and in the vibration direction of the vibration unit 130 (i.e., the z-direction shown in the figure), the overhanging region 122-2 has the thickness dimension h.

In some embodiments, a square root of a ratio of the thickness dimension of the overhanging region 122-2 to a square of the length dimension of the overhanging region 122-2 may be in a range of 0.01 to 0.3. In some embodiments, a parameter a may be defined to represent a relationship between the length dimension l and the thickness dimension h of the overhanging region 122-2. That is, $\alpha$ denotes the square foot of the ratio of the thickness dimension h to the square of the length dimension l. For example, $\alpha$ may be expressed by an equation (7):

$$\alpha = \left( \frac{h}{l^2} \right)^{1/2}. \quad (7)$$

In some embodiments, the value of a may indicate a stiffness of the overhanging region 122-2 of the driving beam 122. When the value of $\alpha$ is relatively smaller, the thickness dimension h of the overhanging region 122-2 is relatively smaller, the length dimension l is relatively larger, and the overhanging region 122-2 is prone to deformation and has a less stiffness. When the value of $\alpha$ is relatively larger, the thickness dimension h of the overhanging region 122-2 is relatively larger, the length dimension l is relatively smaller, and the overhanging region 122-2 is less prone to deformation and has a larger stiffness. In some embodiments, the value of a may be in a range of 0.01 to 0.3 for designing the deformation of the overhanging region 122-2 and the stiffness and mass of the driving unit 120, so as to enhance the sensitivity of the loudspeaker 100, optimize the vibration modes of the loudspeaker 100, and enhance the output performance of the loudspeaker 100. For more information about $\alpha$, please refer to FIG. 12 and related contents thereof, which will not be repeated here.

Figure 12:
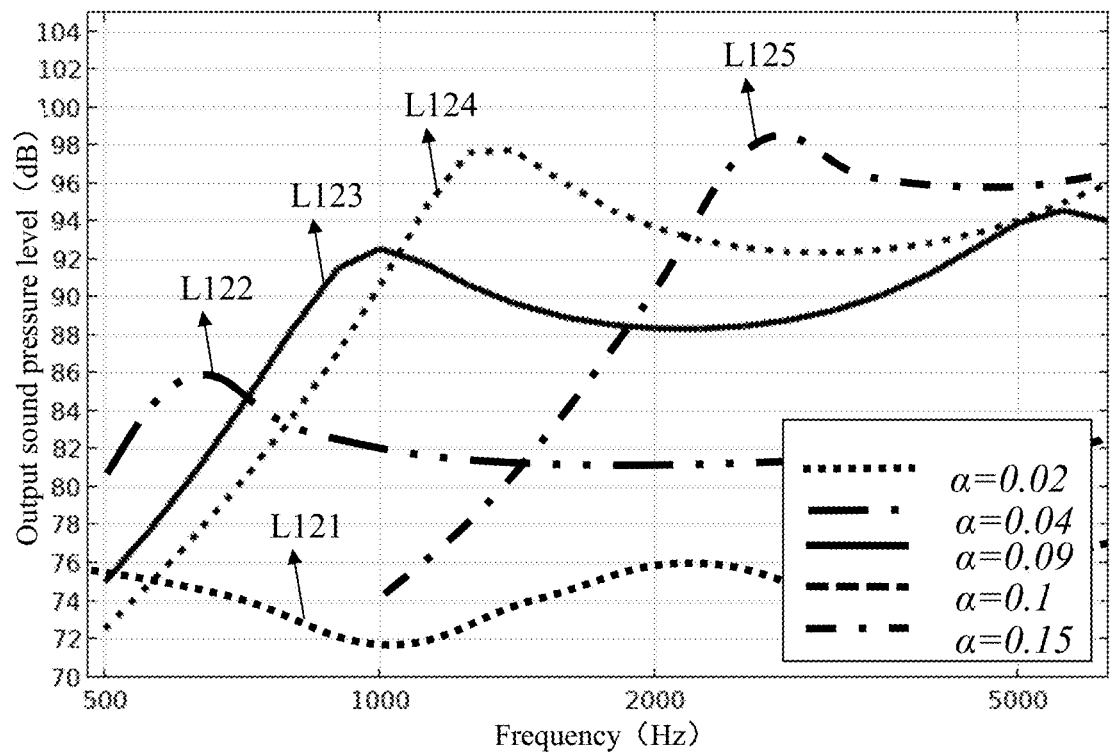
FIG. 12 is a schematic diagram illustrating the frequency response curves of a loudspeaker corresponding to different parameters α according to some embodiments of the present disclosure.

FIG. 12 is a schematic diagram illustrating an exemplary frequency response curve of a loudspeaker corresponding to different parameters $\alpha$ according to some embodiments of the present disclosure. As shown in FIG. 12, a curve L121 represents a frequency response curve corresponding to the loudspeaker 100 when $\alpha$=0.02, a curve L122 represents a frequency response curve corresponding to the loudspeaker 100 when $\alpha$=0.04; a curve L123 represents a frequency response curve corresponding to the loudspeaker 100 when $\alpha$=0.09; a curve L124 represents a frequency response curve corresponding to the loudspeaker 100 when $\alpha$=0.1; and a curve L125 represents a frequency response curve corresponding to the loudspeaker 100 when $\alpha$=0.15. As shown in FIG. 12, when $\alpha$=0.02, which is a case where the stiffness of the driving beam 122 is very small, the driving beam 122 may not drive a load efficiently, an output of the loudspeaker 100 is very low, an overall height of the curve L121 is low, and a second-order mode is generated in lower frequency bands (e.g., a band from 500 Hz to 2000 Hz), resulting in a peak and a valley of the frequency response. When $\alpha$=0.04, the stiffness of the driving beam 122 is smaller, an overall height of the curve L122 is lower, the output of the loudspeaker 100 is lower, and a position of a resonance peak corresponding to the curve L122 is to the left, a corresponding resonance frequency f is in a low frequency range such as in a range of 500 Hz to 1000 Hz in. Compared to $\alpha$=0.02, the output of the loudspeaker 100 increases at $\alpha$=0.04, the curve L122 is located above the entire curve L121, and the curve L122 does not have a peak and a valley in the lower frequency bands (e.g., the band from 500 Hz, to 2000 Hz), and frequency response characteristics of the loudspeaker 100 become significantly better. With a value of a gradually increasing from 0.04 to 0.15, a corresponding curve is gradually shifted upward, a position of a resonance peak of the corresponding curve is gradually shifted to the right, and a corresponding resonance frequency f is gradually increased. When $\alpha=0.1$, the curve L124 corresponds to a resonance peak between 1000 Hz, to 2000 Hz, i.e., the corresponding resonance frequency f is located between 1000 Hz to 2000 Hz; an overall height of curve L124 is higher, and the output of the loudspeaker 100 is higher at low frequencies (e.g., a frequency in a range of 500 Hz-2000 Hz) but lower at mid-to-high frequencies (e.g., a frequency above 2000 Hz). When $\alpha=0.15$, the stiffness of the driving beam 122 is larger, a position of a corresponding resonance peak of the curve L125 is to the right, a corresponding resonance frequency f is located in a range of 2000 Hz-5000 Hz; an overall height of the curve L125 is higher, and the loudspeaker 100 has a higher output sound pressure level at the mid-to-high frequencies (e.g., a frequency above 2000 Hz), but the loudspeaker 100 has a lower output at the low frequencies (e.g., a frequency in a range of 1000 Hz to 2000 Hz). All things considered, in order to make the loudspeaker 100 have a certain output at both the low frequencies and the mid-to-high frequencies, the value of a may be determined in a range of 0.04 to 0.15. In some embodiments, in order to enhance the output of the loudspeaker 100 at both the low frequencies and the mid-to-high frequencies, the value of a may be determined in a range of 0.05 to 0.13. For example, the value of a may be 0.1, such that the loudspeaker 100 has a high output at both the low frequencies and mid-to-high frequencies.

It should be noted that, according to different application scenarios of the loudspeaker 100, a range of frequency bands in which the loudspeaker 100 is mainly used may be determined, so that a parameter $\alpha$ with different values may be used. For example, when the loudspeaker 100 is mainly used in a high-frequency scenario, the value of a may be determined as 0.15, the resonance frequency f corresponding to the loudspeaker 100 is in a range of 2000 Hz to 5000 Hz, and the loudspeaker 100 has a larger output at the mid-to-high frequencies. For example, when the loudspeaker 100 is mainly used in a full-range application scenario, an effective frequency band of the loudspeaker 100 needs to be as wide as possible, at this time, the value of a may be 0.09 and correspond to the frequency response curve L123 of the loudspeaker 100, which has a wide range of flat areas and has a large output both at low frequencies (e.g., a frequency in a range of 500 Hz-2000 Hz) and mid-to-high frequencies (e.g., a frequency above 2000 Hz).

Since the vibration of the vibration unit 130 is generated by the deformation of the driving beam 122, the vibration direction of the vibration unit 130 is a deformation direction of the driving beam 122 (i.e., a z-direction). In some embodiments, as shown in FIG. 11, the driving beam 122 includes a substrate layer 1225, a first electrode layer 12211, a piezoelectric layer 12212, a second electrode layer 12213, and a reinforcement layer 1223 stacked in the vibration direction of the vibration unit 130 (i.e., the z-direction).

In some embodiments, as shown in FIG. 11, the first electrode layer 12211, the piezoelectric layer 12212, and the second electrode layer 12213 may form a piezoelectric structure 1221, with the first electrode layer 12211 and the second electrode layer 12213 disposed on opposite sides of the piezoelectric layer 12212, respectively. In some embodiments, the piezoelectric structure 1221 may cause the driving unit 120 to output vibration from the overhanging region 122-2 in response to an electrical signal. In a direction extending from the fixed region 122-1 to the overhanging region 122-2, the piezoelectric structure 1221 may partially or completely cover the overhanging region 122-2.

In some embodiments, the piezoelectric structure 1221 may deform in response to a drive voltage, thereby generating the vibration. In some embodiments, the piezoelectric layer 12212 may be made of a material with a piezoelectric effect (e.g., piezoelectric ceramics, piezoelectric quartz, piezoelectric crystals, piezoelectric polymers, etc.). Exemplarily, the material of the piezoelectric layer 12212 may include, but is not limited to, aluminum nitride (AlN), lead zirconate titanate (PZT), zinc oxide (ZnO), or the like. In some embodiments, the first electrode layer 12211 and the second electrode layer 12213 may be made of a more electrically conductive material (e.g., a metal, an alloy, an electrically conductive polymer material, etc.). For example, the first electrode layer 12211 and the second electrode layer 12213 may include silver (Ag), molybdenum (Mo), copper (Cu), gold (Au), titanium-gold alloy (Ti/Au), titanium (Ti), aluminum (Al), or the like.

The reinforcement layer 1223 may alter mechanical properties of the driving unit 120, for example, the reinforcement layer 1223 may enhance a damping and stiffness of the driving unit 120. In some embodiments, the reinforcement layer 1223 may be affixed to the piezoelectric structure 1221 (e.g., the second electrode layer 12213 which is away from the substrate layer 1225). The piezoelectric structure 1221 may drive the reinforcement layer 1223 to vibrate. In some embodiments, the reinforcement layer 1223 may be made of a semiconductor material, a polymer material, or the like. Exemplary semiconductor materials may include silicon (Si), silicon oxide ($SiO_2$), silicon nitride (SiNx), silicon carbide (SiC), or the like. Exemplary polymeric materials may include polyimide (Polyimide, PI), poly-p-xylene (Parylene), polydimethylsiloxane (Polydimethylsiloxane, PDMS), hydrogels, photoresists, silicone gels, silicone gels, silicone sealants, or the like. In some embodiments, when the reinforcement layer 1223 is made of a semiconductor material, the reinforcement layer 1223 may have a single-layer or multi-layer structure. For example, the reinforcement layer 1223 may have a single-layer structure made of a semiconductor material (e.g., Si or SiO2). As another example, the reinforcement layer 1223 may have a multi-layer structure made of a plurality of semiconductor materials (e.g., $Si/SiO_2$ bilayer structure, Si/SiNx bilayer structure, etc.). In some embodiments, the reinforcement layer 1223 may also be made of an anisotropic material. Exemplary anisotropic materials may include carbon fiber, FR4 epoxy fiberglass sheets, or the like. In some embodiments, the reinforcement layer 1223 may also be made of a metallic material. Exemplary metallic materials may include stainless steel, aluminum alloys, magnesium-lithium alloys, copper, copper alloys, or the like.

In some embodiments, the driving beam 122 may also include a piezoelectric seed layer (not shown in the figures), and the piezoelectric seed layer may be disposed on a side of the piezoelectric structure 1221 away from the reinforcement layer 1223. The piezoelectric seed layer may enable the piezoelectric layer 12212 to have a better 001 crystal orientation. In some embodiments, a material of the piezoelectric seed layer may include a conductive material, such as strontium oxide (SrO), zirconium oxide ($ZrO_2$), or the like. In some embodiments, the driving beam 122 may also include a cushioning layer (not shown in the figures), and the cushioning layer may be disposed on a side of the piezoelectric structure 1221 away from the reinforcement layer 1223. For example, the cushioning layer may be disposed on a side of the piezoelectric seed layer close to the reinforcement layer 1223. The cushioning layer may also enable the piezoelectric layer 12212 to have a better 001 crystal orientation. In some embodiments, a material of the cushioning layer may include but is not limited to, lithium niobate (LiNbO$_3$), or the like.

In some embodiments, the driving beam 122 may also include the substrate layer 1225 (as shown in FIG. 11), and the substrate layer 1225 is disposed on a side of the piezoelectric structure 1221 away from the reinforcement layer 1223. For example, the substrate layer 1225 may be disposed on a side of the cushioning layer away from the reinforcement layer 1223. The substrate layer 1225 may cooperate with the reinforcement layer 1223 to adjust the stiffness and damping of the driving unit 120, and a position of a neutral plane (not shown in the figure) of the driving unit 120, so as to adjust the output performance of the driving unit 120. For example, a thickness of the substrate layer 1225 may be adjusted so that the entire piezoelectric structure 1221 is disposed on a side of the neutral plane of the driving beam 122 (e.g., the neutral plane is disposed within the reinforcement layer 1223), so that when the driving unit 120 is bent, an elongation (or compression) deformation produced by tensile (or compressive) stresses in the piezoelectric structure 1221 may generate greater vibration. For example, the stiffness of the driving unit 120 may be adjusted by setting the substrate layer 1225, so as to adjust vibration modes of the driving unit 120 and to enhance the output performance of the loudspeaker 100. In some embodiments, a material of the substrate layer 1225 may include but is not limited to, a semiconductor material. Exemplary semiconductor materials may include silicon (Si), silicon dioxide (SiO$_2$), silicon nitride (SiNx), silicon carbide (SiC), or the like. In some embodiments, the substrate layer 1225 may have a single-layer or multi-layer structure. For example, the substrate layer 1225 may have a single-layer structure made of a semiconductor material (e.g., Si, SiO$_2$). As another example, the substrate layer 1225 may have a multi-layer structure made of a plurality of semiconductor materials (e.g., Si/SiO$_2$ bilayer structure, Si/SiNx bilayer structure, etc.). In some embodiments, the substrate layer 1225 may be directly made of Silicon On Insulator (SOI) wafer top silicon.

In some embodiments, referring to FIG. 11, when the driving beam 122 includes only one piezoelectric structure 1221, the substrate layer 1225 is equivalent to an internal load for the driving beam 122 relative to the piezoelectric layer 12212. By reasonably designing the relationship between a thickness hp$_1$ of the piezoelectric layer 12212 and a thickness hc of the substrate layer 1225, an effective adjustment of the output sound pressure level of the loudspeaker 100 may be realized. For example, a parameter β may be defined as a ratio of the thickness hc of the substrate layer 1225 to the thickness hp$_1$ of the piezoelectric layer 12212, and according to schematic diagrams of frequency response curves of the loudspeaker 100 corresponding to different β, a reasonable relationship between the thickness hp$_1$ of the piezoelectric layer 12212 and the thickness hc of the substrate layer 1225 is determined. More description of the relevant contents can be found in FIG. 13 and related description thereof.

In some embodiments, the parameter β may be defined as the ratio of the thickness hc of the substrate layer 1225 to the thickness hp$_1$ of the piezoelectric layer 12212 as follows:

$$\beta = \frac{hc}{hp_1}. \tag{8}$$

Figure 13:
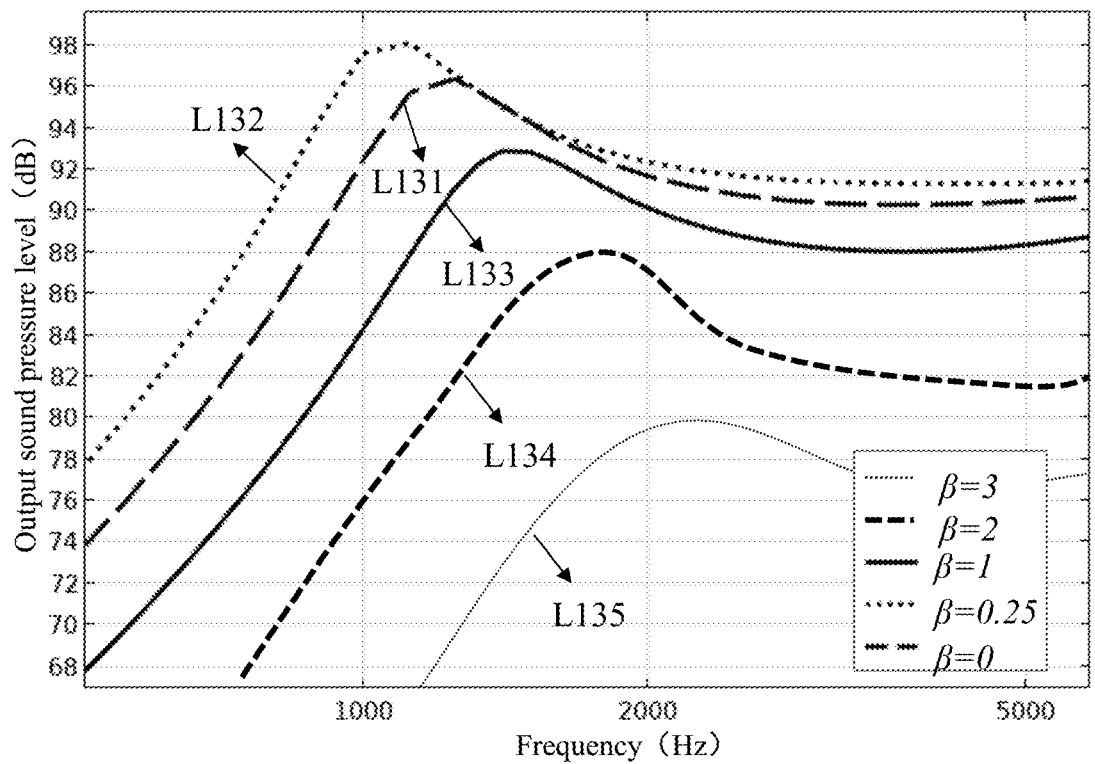
FIG. 13 is a schematic diagram illustrating the frequency response curves of a loudspeaker corresponding to different parameters β according to some embodiments of the present disclosure.

FIG. 13 is a schematic diagram illustrating exemplary frequency response curves of a loudspeaker corresponding to different β according to some embodiments of the present disclosure. As shown in FIG. 13, a curve L131 represents a frequency response curve corresponding to the loudspeaker 100 when β=0; a curve L132 represents a frequency response curve corresponding to the loudspeaker 100 when β=0.25; a curve L133 represents a frequency response curve corresponding to the loudspeaker 100 when β=1; a curve L134 represents a frequency response curve corresponding to the loudspeaker 100 when β=2; and a curve L135 represents a frequency response curve corresponding to the loudspeaker 100 when β=3. As shown in FIG. 13, when β=2, the thickness hc of the substrate layer 1225 is larger as compared to the piezoelectric layer 12212, thus providing a larger internal load for the piezoelectric layer 12212 and limiting the movement of the driving beam 122, which in turn reduces the output of the loudspeaker 100, which corresponds to a lower overall height of the curve L134. When β=3, the thickness hc of the substrate layer 1225 is larger compared to that of the substrate layer 1225 when β=2, thus providing a larger internal load for the piezoelectric layer 12212, restricting the movement of the driving beam 122, and the output of the loudspeaker 100 is significantly lower, and the entire curve L135 lies below the curve L134. When the value of β is reduced from 2 to 1, the thickness hc of the substrate layer 1225 is significantly reduced compared to the piezoelectric layer 12212, and thus the internal load provided by the substrate layer 1225 is significantly reduced, the movement restriction of the driving beam 122 is significantly reduced, and thus the output of the loudspeaker 100 is significantly increased, which corresponds to a significant overall upward shift of the curve L133 with respect to the curve L134. When the value of β is reduced from 1 to 0.25, the thickness hc of the substrate layer 1225 is further reduced compared to the piezoelectric layer 12212, and thus the internal load provided by the substrate layer 1225 is further reduced, and the movement restriction of the driving beam 122 is further decreased, and the output of the loudspeaker 100 further increases, which corresponds to an apparent overall upward shift of the curve L132 with respect to the curve L133. When the value of β is reduced from 2 to 0.25, the resonance peak of the corresponding curves gradually shifts to the left, and the output at low frequencies (e.g., a frequency in a range of 0 Hz-2000 Hz) of the loudspeaker 100 gradually increases. When the value of β is reduced to 0, the internal load provided by the substrate layer 1225 is 0 compared to the piezoelectric layer 12212, i.e., the output of the loudspeaker 100 may increase without the substrate layer 1225, which corresponds to an obvious overall upward shift of the curve L131 with respect to the curve L133 and the curve L134, and the curve L131 is obviously located below the curve L132 at the low frequencies (e.g., a frequency below 1000 Hz), and the curve L131 differs little from the curve L132 and the curve L131 at mid-to-high frequencies (e.g., a frequency above 1500 Hz). For the structure of the loudspeaker 100, the design of the substrate layer 1225 and the reinforcement layer 1223 in the thickness direction of the driving beam 122 may serve to regulate the stiffness and the resonance frequency f of the driving beam 122, increase reliability, adjust the position of the neutral plane of the driving beam 122, and adjust the internal load of the driving beam 122. In some embodiments, the driving beam 122 may be designed to not include the substrate layer 1225, i.e., the driving beam 122 may be designed as a structure when β=0. In some embodiments, during the processing of the driving beam 122, the substrate layer 1225 may be processed as a cutoff layer, thus the design of the substrate layer 1225 may improve the yield (i.e., a pass rate) of the driving beams 122. Considering all things, the value of β may be in a range of 0 to 2 so that the loudspeaker 100 may have a high output across a full frequency band. In some embodiments, in order to further enhance the output performance of the loudspeaker 100, the value of β may be in a range of 0 to 1.5.

In some embodiments, the structure of the driving unit 120 may also affect the driving force, the displacement, and the resonance frequency f output by the driving unit 120, thereby affecting the output performance, resonance frequency f, reliability, and manufacturing process of the loudspeaker 100.

FIG. 14A to FIG. 14E are schematic diagrams illustrating different structures of a driving beam according to some embodiments of the present disclosure.

Figure 14A:
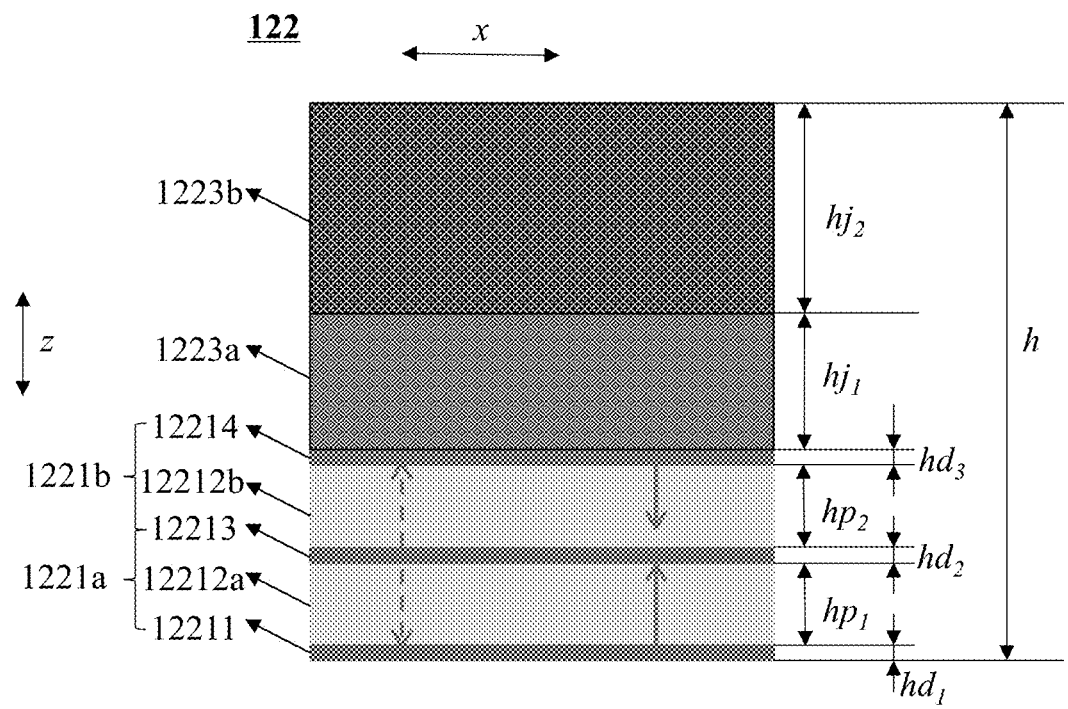
FIG. 14A to FIG. 14E are schematic diagrams illustrating different structures of a driving beam according to some embodiments of the present disclosure.

In some embodiments, as shown in FIG. 14A, the driving beam 122 may include two piezoelectric structures (i.e., a first piezoelectric structure 1221a and a second piezoelectric structure 1221b) and two reinforcement layers (i.e., a first reinforcement layer 1223a and a second reinforcement layer 1223b). In a thickness direction (i.e., hereinafter referred to as a z-direction) of the driving beam 122, the first piezoelectric structure 1221a, the second piezoelectric structure 1221b, the first reinforcement layer 1223a, and the second reinforcement layer 1223b are connected sequentially from bottom to top. For two adjacent piezoelectric structures (i.e., the first piezoelectric structure 1221a and the second piezoelectric structure 1221b), the second electrode layer 12213 disposed between the two piezoelectric structures may be shared, as shown in FIG. 14A. That is, in the thickness direction of the driving beam 122, the first electrode layer 12211, the first piezoelectric layer 12212a, the second electrode layer 12213, the second piezoelectric layer 12212b, a third electrode layer 12214, the first reinforcement layer 1223a, and the second reinforcement layer 1223b are disposed sequentially from bottom to top. The first reinforcement layer 1223a and the second reinforcement layer 1223b may be made of a same material or different materials.

To make the driving beam 122 have a large displacement in the vibration direction (i.e., the z-direction) of the vibration unit 130, it is possible to choose to make deformation directions of piezoelectric layers located on a side of the neutral plane of the driving beam 122 be the same, i.e., be the same as elongation deformation or shortening deformation, by designing polarization directions of the piezoelectric layers (e.g., the first piezoelectric layer 12212a and the second piezoelectric layer 12212b) and the positive or negative of an applied voltage. By designing thickness dimensions of the piezoelectric layer and the reinforcement layer, the neutral plane is disposed inside the first reinforcement layer 1223a or the second reinforcement layer 1223b. In some embodiments, the polarization directions of any two adjacent piezoelectric layers (e.g., the first piezoelectric layer 12212a and the second piezoelectric layer 12212b) may be designed as opposite (as two cases represented by dashed arrows and solid arrows shown in FIG. 14A). Additionally, when a voltage is applied to the driving beam 122, a potential direction of each piezoelectric layer (e.g., the first piezoelectric layer 12212a or the second piezoelectric layer 12212b) may either be the same as the polarization direction or be opposite to the polarization direction.

In some embodiments, in the thickness direction of the driving beam 122, a thickness $hd_1$ of the first electrode layer 12211, a thickness $hd_2$ of the second electrode layer 12213, and a thickness $hd_3$ of the third electrode layer 12214 may be in a range of 20 nm to 200 nm. In some embodiments, according to equation (7), in order to adjust the thickness h of the driving beam 122, design the value of the parameter α, and adjust the stiffness of the driving beam 122, the thickness $hd_1$ of the first electrode layer 12211, the thickness $hd_2$ of the second electrode layer 12213, and the thickness $hd_3$ of the third electrode layer 12214 may be in a range of 40 nm to 130 nm. The thickness $hd_1$ of the first electrode layer 12211, the thickness hd: of the second electrode layer 12213, and the thickness $hd_3$ of the third electrode layer 12214 may be same or different.

In some embodiments, the thickness $hp_1$ of the first piezoelectric layer 12212a and the thickness $hp_2$ of the second piezoelectric layer 12212b may be in a range of 1 μm to 5 μm. In some embodiments, according to equation (7), in order to adjust the thickness h of the driving beam 122, design the value of the parameter α, and adjust the stiffness of the driving beam 122, the thickness $hp_1$ of the first piezoelectric layer 12212a and the thickness $hp_2$ of the second piezoelectric layer 12212b may be in a range of 1.5 μm to 2.5 μm. The thickness $hp_1$ of the first piezoelectric layer 12212a and the thickness $hp_2$ of the second piezoelectric layer 12212b may be same or different.

In some embodiments, when a material of the reinforcement layer is a polymer material such as PI, PEEK, PET, PEI, silica gel, silicone gel, etc., the thickness $hj_1$ of the first reinforcement layer 1223a and the thickness $hj_2$ of the second reinforcement layer 1223b may be in a range of 5 μm to 40 μm. In some embodiments, according to equation (7), in order to adjust the thickness h of the driving beam 122, design the value of the parameter α, and adjust the stiffness of the driving beam 122, and when the reinforcement layer is made of a polymer material, such as PI, PEEK, PET, PEI, silicone gel, silicone gel, etc., the thickness $hj_1$ of the first reinforcement layer 1223a and the thickness $hj_2$ of the second reinforcement layer 1223b may be in a range of 5 μm to 25 μm. The thickness $hj_1$ of the first reinforcement layer 1223a and the thickness $hj_2$ of the second reinforcement layer 1223b may be same or different.

In some embodiments, when the reinforcement layer has a single-layer structure or a multi-layer structure made of a semiconductor material (e.g., Si, $SiO_2$, SiNx, SiC, etc.), the thickness $hj_1$ of the first reinforcement layer 1223a and the thickness $hj_2$ of the second reinforcement layer 1223b may be in a range of 2 μm to 15 μm. In some embodiments, according to the equation (7), in order to adjust the thickness h of the driving beam 122, design the value of the parameter α, and adjust the stiffness of the driving beam 122, when the reinforcement layer has a single-layer structure or a multi-layer structure made of semiconductor material (e.g., Si, $SiO_2$, SiNx, SiC, etc.), the thickness $hj_1$ of the first reinforcement layer 1223a and the thickness $hj_2$ of the second reinforcement layer 1223b may be in a range of 3 μm to 10 μm. The thickness $hj_1$ of the first reinforcement layer 1223a and the thickness $hj_2$ of the second reinforcement layer 1223b may be same or different.

In some embodiments, by designing a structure and dimension of the driving beam 122, the force and displacement output by the driving beam 122 may be adjusted to enhance the output performance of the loudspeaker 100.

Figure 14B:
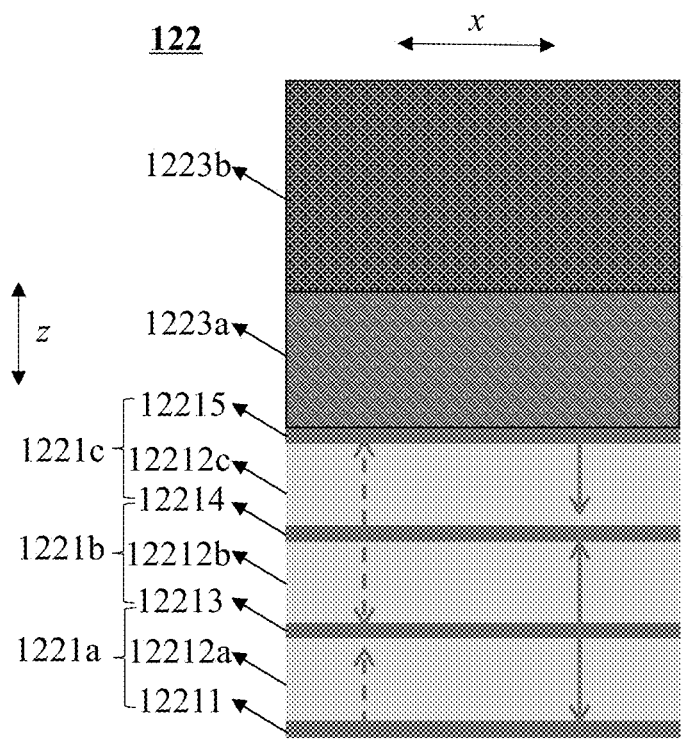

Referring to FIG. 14B, in some embodiments, the driving beam 122 may include three piezoelectric structures (i.e., the first piezoelectric structure 1221*a*, the second piezoelectric structure 1221*b*, and a third piezoelectric structure 1221*c*) and two reinforcement layers (i.e., the first reinforcement layer 1223*a* and the second reinforcement layer 1223*b*). In the thickness direction of the driving beam 122, from bottom to top, the first piezoelectric structure 1221*a*, the second piezoelectric structure 1221*b*, the third piezoelectric structure 1221*c*, the first reinforcement layer 1223*a*, and the second reinforcement layer 1223*b* are sequentially connected. For any two adjacent piezoelectric structures, an electrode layer disposed between the two adjacent piezoelectric structures may be shared, as shown in FIG. 14B. The first piezoelectric structure 1221*a* and the second piezoelectric structure 1221*b* may share the second electrode layer 12213, and the second piezoelectric structure 1221*b* and the third piezoelectric structure 1221*c* may share the third electrode layer 12214. That is, in the thickness direction of the driving beam 122, from bottom to top, the first electrode layer 12211, the first piezoelectric layer 12212*a*, the second electrode layer 12213, the second piezoelectric layer 12212*b*, the third electrode layer 12214, a third piezoelectric layer 1221*c*, a fourth electrode layer 12215, the first reinforcement layer 1223*a*, and the second reinforcement layer 1223*b* are disposed sequentially. The two reinforcement layers (i.e., the first reinforcement layer 1223*a* and the second reinforcement layer 1223*b*) may be made of a same material or different materials. In some embodiments, a piezoelectric seed layer, a cushioning layer, or the like, may also be disposed below the first electrode layer 12211 in the thickness direction of the driving beam 122.

Figure 14C:
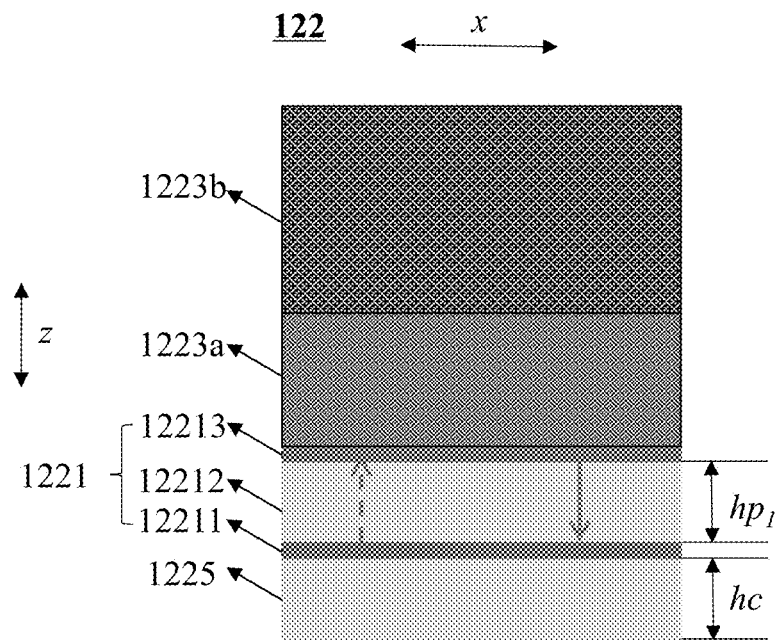

Referring to FIG. 14C, in some embodiments, the driving beam 122 may include one piezoelectric structure 1221, two reinforcement layers (i.e., the first reinforcement layer 1223*a* and the second reinforcement layer 1223*b*), and one substrate layer 1225. In the thickness direction of the driving beam 122, from bottom to top, the substrate layer 1225, the piezoelectric structure 1221, the first reinforcement layer 1223*a*, and the second reinforcement layer 1223*b* are connected in sequence. That is, in the thickness direction of the driving beam 122, from bottom to top, the substrate layer 1225, the first electrode layer 12211, the piezoelectric layer 12212, the second electrode layer 12213, the first reinforcement layer 1223*a*, and the second reinforcement layer 1223*b* are sequentially distributed. The two reinforcement layers may be made of a same material or different materials. In some embodiments, the piezoelectric seed layer, the cushioning layer, or the like, may also be disposed between the first electrode layer 12211 and the substrate layer 1225 (i.e., below the first electrode layer 12211 and above the substrate layer 1225) in the thickness direction of the driving beam 122. In some embodiments, a thickness hic of the substrate layer 1225 may be in a range of 100 nm to 5000 nm. In some embodiments, according to equation (7), to adjust the thickness h of the driving beam 122, design the value of the parameter α, and regulate the stiffness of the driving beam 122, the thickness hc of the substrate layer 1225 may be in a range of 200 nm to 2000 nm.

Figure 14D:
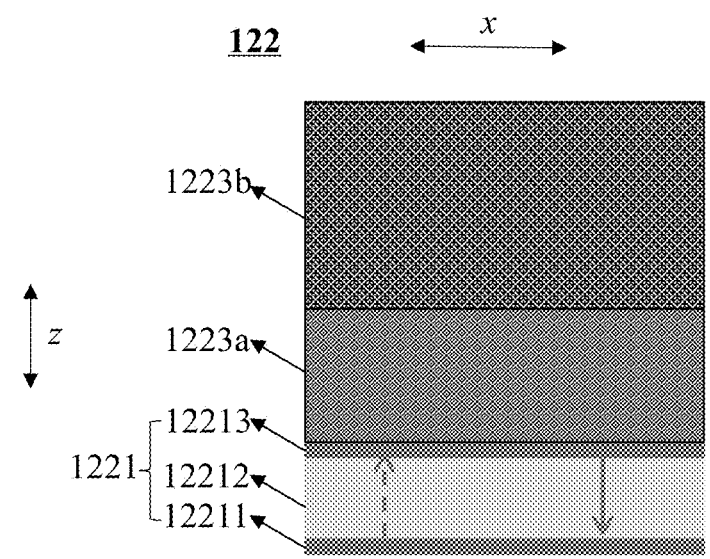

Referring to FIG. 14D, in some embodiments, the driving beam 122 may include one piezoelectric structure 1221 and two reinforcement layers (i.e., the first reinforcement layer 1223*a* and the second reinforcement layer 1223*b*). In the thickness direction of the driving beam 122, from bottom to top, the piezoelectric structure 1221, the first reinforcement layer 1223*a*, and the second reinforcement layer 1223*b* are connected sequentially. That is, in the thickness direction of the driving beam 122, from bottom to top, the substrate layer 1225, the first electrode layer 12211, the piezoelectric layer 12212, the second electrode layer 12213, the first reinforcement layer 1223*a*, and the second reinforcement layer 1223*b* are sequentially distributed. The two reinforcement layers may be made of a same material or different materials. In some embodiments, the piezoelectric seed layer, the cushioning layer, or the like, may also be disposed below the first electrode layer 12211 in the thickness direction of the driving beam 122.

Figure 14E:
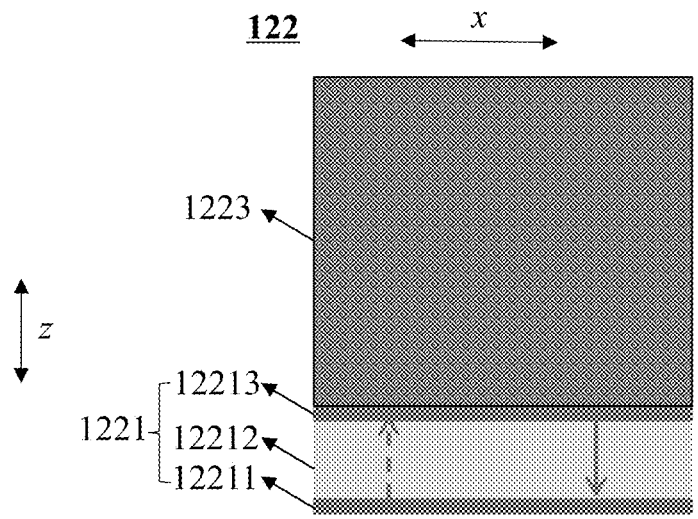

In some embodiments, the driving beam 122 may be provided with one or more reinforcement layers 1223. As shown in FIG. 11, in some embodiments, the driving beam 122 may include one piezoelectric structure 1221, one reinforcement layer 1223 and one substrate layer 1225. In the thickness direction of the driving beam 122, the substrate layer 1225, the piezoelectric structure 1221, and the reinforcement layer 1223 are connected in sequence from bottom to top. That is, in the thickness direction of the driving beam 122, from bottom to top, the substrate layer 1225, the first electrode layer 12211, the piezoelectric layer 12212, the second electrode layer 12213, and the reinforcement layer 1223 are sequentially distributed. In some embodiments, the piezoelectric seed layer, the cushioning layer, or the like, may also be disposed between the first electrode layer 12211 and the substrate layer 1225 (i.e., below the first electrode layer 12211 and above the substrate layer 1225) in the thickness direction of the driving beam 122. As shown in FIG. 14E, in some embodiments, the driving beam 122 may include one piezoelectric structure 1221 and one reinforcement layer 1223. The piezoelectric structure 1221 is sequentially connected with the reinforcement layer 1223 in the thickness direction of the driving beam 122 from bottom to top. That is, in the thickness direction of the driving beam 122, from bottom to top, the substrate layer 1225, the first electrode layer 12211, the piezoelectric layer 12212, the second electrode layer 12213, and the reinforcement layer 1223 are sequentially distributed. In some embodiments, the piezoelectric seed layer, the cushioning layer, or the like, may also be disposed below the first electrode layer 12211 in the thickness direction of the driving beam 122.

In some embodiments, the stiffness of the driving unit 120 may be adjusted by directly increasing the thickness of the substrate layer 1225 and/or the thickness of the reinforcement layer 1223. However, increasing the thickness of the substrate layer 1225 and/or the reinforcement layer 1223 thickness may cause an increased load on the piezoelectric layer 12212, resulting in a reduced output of the driving unit 120. To address the above issues, in some embodiments, the driving beam 122 includes a piezoelectric structure and one or more reinforcement layers stacked in the vibration direction (i.e., the z-direction) of the vibration unit 130, and a reinforcement layer furthest away from the piezoelectric structures (e.g., the second reinforcement layer 1223*b* shown in FIG. 14A to FIG. 14D) may be provided with a slot structure.

In some embodiments, in a direction extending from the fixed region 122-1 to the overhanging region 122-2, the slot structure includes a plurality of reinforcement members spaced apart, with a slot disposed between any two adjacent reinforcement members.

Figure 15A:
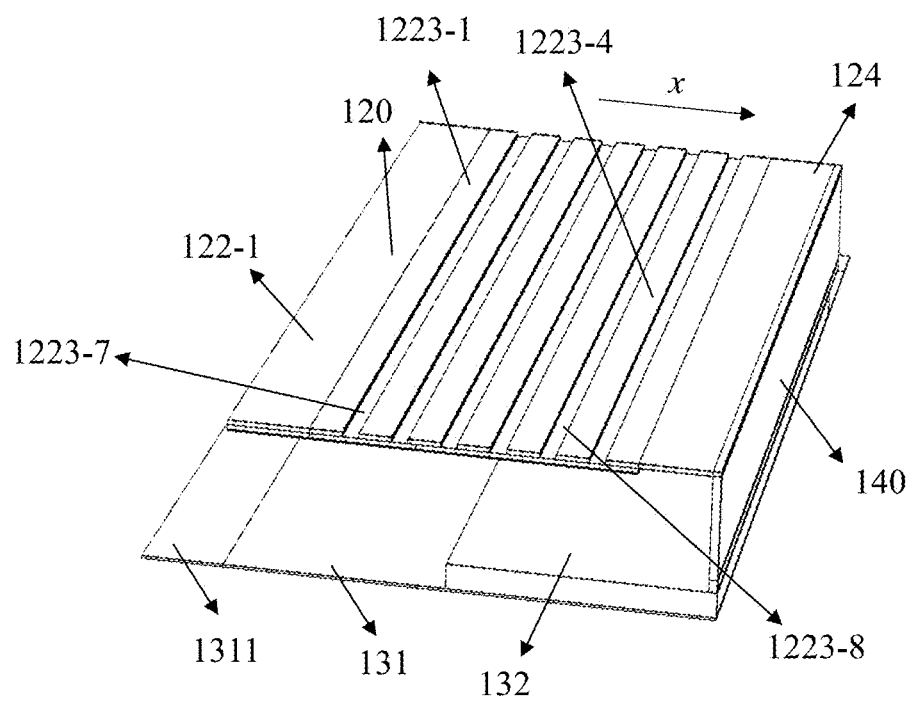
FIG. 15A is a schematic diagram illustrating a localized structure of a loudspeaker according to some embodiments of the present disclosure.
Figure 15B:
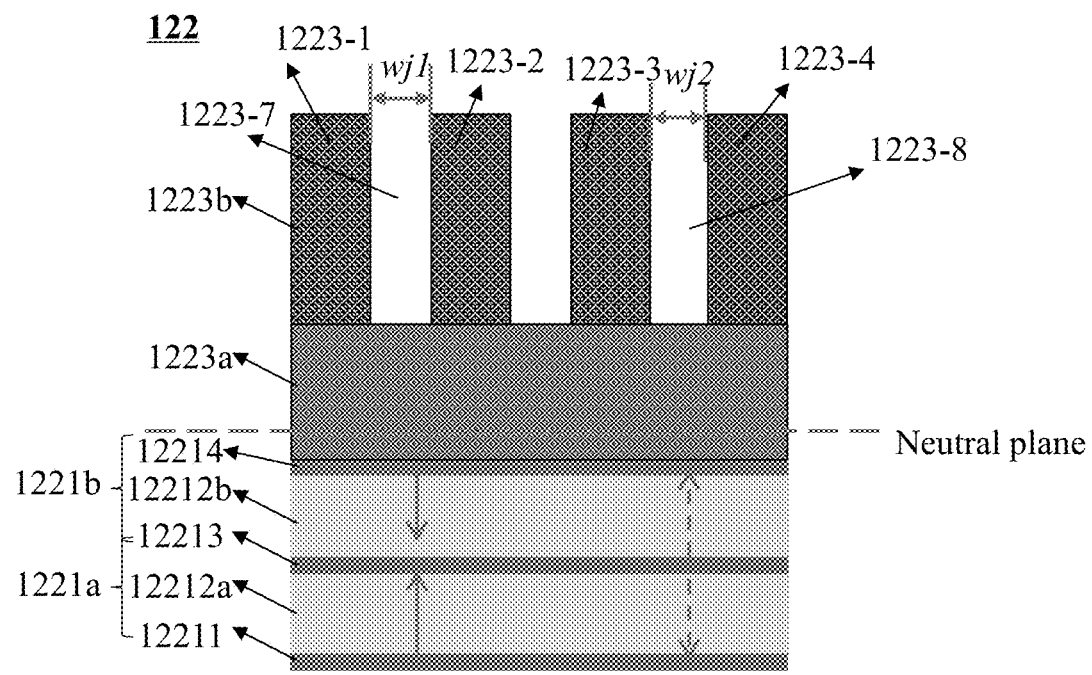
FIG. 15B is a schematic diagram illustrating an exemplary internal structure of a driving unit of the loudspeaker shown in FIG. 15A according to some embodiments of the present disclosure.
Figure 15C:
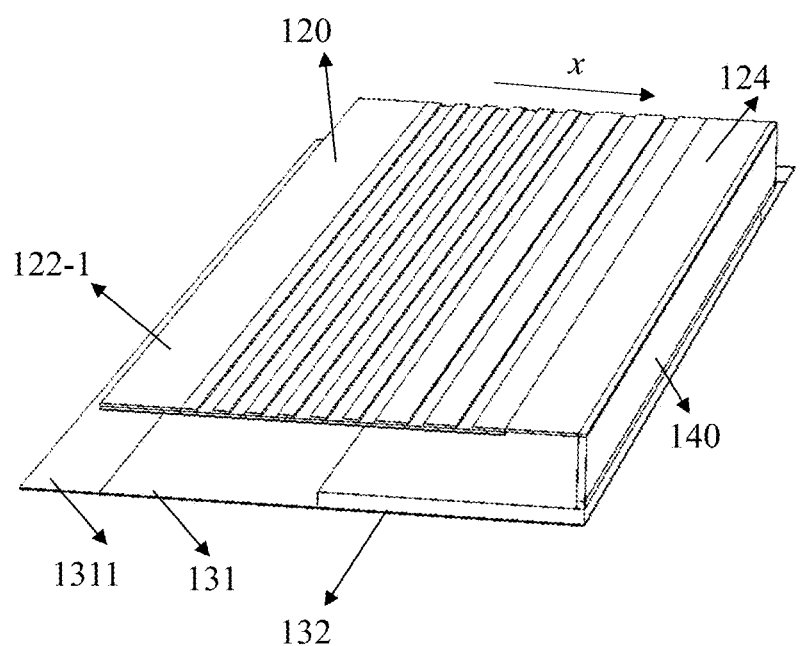
FIG. 15C is a schematic diagram illustrating a localized structure of a loudspeaker according to some embodiments of the present disclosure.
Figure 15D:
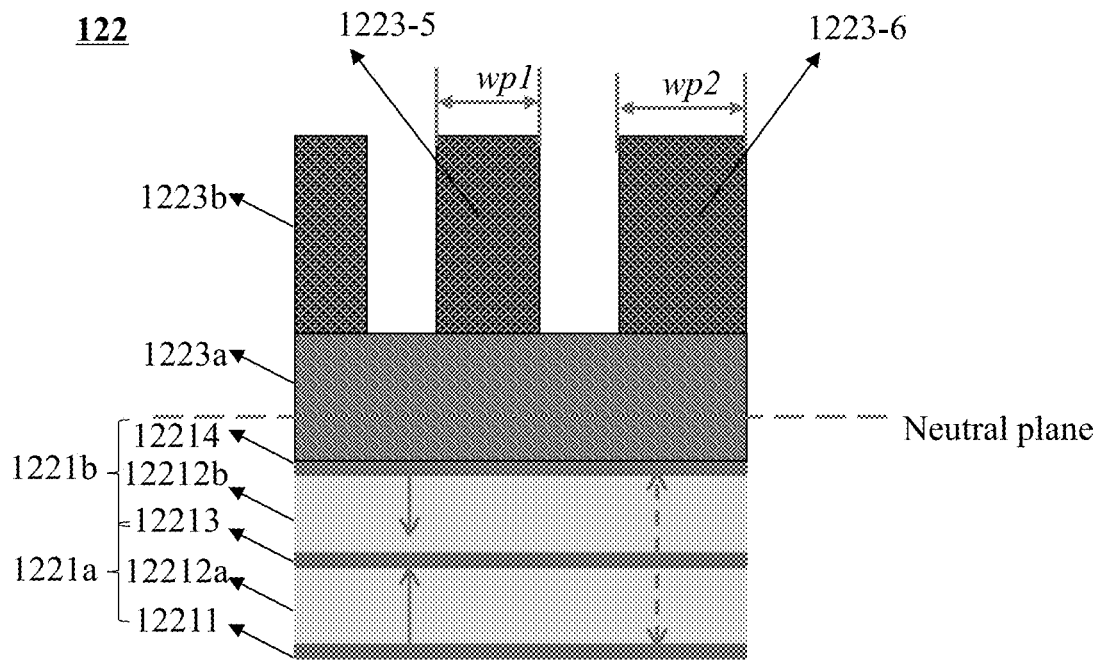
FIG. 15D is a schematic diagram illustrating an exemplary internal structure of a driving unit of the loudspeaker shown in FIG. 15 C according to some embodiments of the present disclosure.

FIG. 15A is a schematic diagram illustrating an exemplary local structure of a loudspeaker according to some embodiments of the present disclosure. FIG. 15B is a schematic diagram illustrating an exemplary internal structure of a driving unit of the loudspeaker shown in FIG. 15A. FIG. 15C is a schematic diagram illustrating an exemplary local structure of a loudspeaker according to some embodiments of the present disclosure. FIG. 15D is a schematic diagram illustrating an exemplary internal structure of a driving unit of the loudspeaker shown in FIG. 15C.

As shown in FIG. 15A and FIG. 15B, the reinforcement layer 1223 may include a plurality of reinforcement members spaced apart in a length direction (i.e., the x-direction shown in FIG. 15A) of the driving beam 122. By arranging the plurality of reinforcement members spaced apart in the length direction of the driving beam 122, on one hand, it is possible to increase a distance between a neutral plane of the driving unit 120 and a geometrically intermediate plane of the piezoelectric layer 12212 and simultaneously keep a load (i.e., a total mass of the substrate layer 1225 and the reinforcement layer 1223) constant or decreasing while continuing to increase a thickness (e.g., a thickness of each reinforcement member) of the reinforcement layer 1223. On the other hand, arranging the reinforcement members spaced apart also enables a stiffness of the driving unit 120 to be adjusted and realizes impedance matching between the driving unit 120 and the load, thereby integrally improving the output performance of the driving unit 120.

In some embodiments, the plurality of reinforcement members and a spacing between adjacent reinforcement members collectively constitute a slot structure.

In some embodiments, the slot structure includes a plurality of slots in a direction (i.e., the x-direction shown in FIG. 15A) extending from the fixed region 122-1 to the overhanging region 122-2, with a dimensions of a slot that is proximate to the fixed region 122-1 being larger than a dimension of a slot that is further away from the fixed region 122-1, so as to minimize constraint of reinforcement members proximate to the fixed region 122-1 of the driving beam 122 on bending and deformation of a beam-like structure.

In some embodiments, referring to FIG. 15A and FIG. 15B, a reinforcement member 1223-1 may be arranged as a first reinforcement member at a position of the driving beam 122 proximate to the fixed region 122-1, and a reinforcement member 1223-4 may be arranged as a second reinforcement member at a position of the driving beam 122 proximate to the overhanging region 122-2. Other reinforcement members (e.g., a reinforcement member 1223-2, a reinforcement member 1223-3, etc.) may be spaced between the first reinforcement member and the second reinforcement member in an extension direction of a beam-like structure of the driving beam 122. In some embodiments, the plurality of reinforcement members may have the same or different thicknesses in a vibration direction of the driving beam 122. For example, the plurality of reinforcement members may be of a same thickness in the vibration direction of the driving beam 122 to facilitate the preparation of the reinforcement layer 1223 (or the driving unit 120). As another example, the plurality of reinforcement members may have different thicknesses in the vibration direction of the driving beam 122. Specifically, since the reinforcement members proximate to the overhanging region 122-2 of the driving beam 122 have less constraint on the bending and deformation of the beam-like structure during, and reinforcement members located in an intermediate region of the beam-like structure of the driving beam 122 have more constraint on the bending and deformation of the beam-like structure, thicknesses of the reinforcement members proximate to the overhanging region 122-2 of the driving beam 122 may be greater than thicknesses of the reinforcement members located in the intermediate region of the beam-like structure of the driving beam 122.

In some embodiments, as shown in FIG. 15A, the spacing between adjacent reinforcement members forms a plurality of slots of the slot structure (e.g., a slot 1223-7, a slot 1223-8, etc.), and the stiffness of the driving unit 120 may be adjusted by adjusting a dimension of the slot (i.e., a dimension of the spacing between two adjacent reinforcement members in the extension direction of the beam structure of the driving beam 122). In some embodiments, each slot may have the same or different dimensions in the extension direction of the beam-like structure of the driving beam 122. For example, as shown in FIG. 15B, a dimension wj1 of the slot 1223-7 between the reinforcement member 1223-1 and the reinforcement member 1223-2 and a dimension wj2 of the slot 1223-8 between the reinforcement member 1223-3 and the reinforcement member 1223-4 may be different.

In some embodiments, the dimensions of the slot that is proximate to the fixed region 122-1 is larger than the dimension of the slot that is further away from the fixed region 122-1. For example, the dimension wj1 of the slot 1223-7 is larger than the dimension wj2 of the slot 1223-8.

In some embodiments of the present disclosure, vibration close to the fixed region 122-1 has a greater effect on the vibration of the driving beam 122, and by designing the dimension of the slot that is proximate to the fixed region 122-1 to be larger than the dimension of the slot that is further away from the fixed region 122-1, the effect of the vibration proximate to the fixed region 122-1 may be increased.

In some embodiments, the plurality of reinforcement members may have the same or different dimensions in the extension direction (the x-direction) of the beam-like structure of the driving beam 122. For example, as shown in FIG. 15D, a dimension wp1 of a reinforcement member 1223-5 in the extension direction (x-direction) of the beam-like structure of the driving beam 122 may be different from a dimension wp2 of a reinforcement member 1223-6 in the extension direction (x-direction) of the beam-like structure of the driving beam 122.

In some embodiments, different positions of the driving beam 122 contribute differently to the bending and deformation, and typically the deformation of the driving beam proximate to the fixed region 122-1 of the driving unit 120 contributes more to the overall deformation of the driving beam than the overhanging region 122-2 of the driving beam 122. Therefore, in some embodiments, according to a deformation amount contributed by different positions of the piezoelectric layer 12212 in the extension direction of the beam-like structure of the driving beam 122 during an actual operation, and in combination with an average stress distribution of the piezoelectric layer 12212 in the extension direction of the beam-like structure of the driving beam 122, reinforcement members of different dimensions may be arranged at different positions in the extension direction of the beam-like structure, so that the load of the driving unit 120 and the overall stiffness of the driving unit 120 may be adjusted while adjusting a position of the neutral plane of the driving unit 120, thereby causing the driving unit 120 to output a larger displacement, and at the same time realizing the impedance matching or substantial impedance matching between the driving unit 120 with the load (e.g., a vibration part of the loudspeaker), so that a displacement generated by the loudspeaker 100 may be effectively transmitted.

In some embodiments, a width of a reinforcement member that is further away from the fixed region 122-1 is greater than a width of a reinforcement member that is proximate to the fixed region 122-1. For example, as shown in FIG. 15C and FIG. 15D, the dimension wp2 of the reinforcement member 1223-6 in the extension direction (x-direction) of the beam-like structure of the driving beam 122 is larger than the dimension wp1 of the reinforcement member 1223-5 proximate to the fixed region 122-1 in the extension direction (x-direction) of the beam-like structure of the driving beam 122.

In some embodiments of the present disclosure, the vibration proximate to the fixed region 122-1 has a greater effect on the vibration of the driving beam 122, and by making the width of the reinforcement member that is further away from the fixed region 122-1 larger than the width of the reinforcement member that is close to the fixed region 122-1, the effect of the vibration proximate to the fixed region 122-1 may be increased.

In some embodiments, in order to take into account the reliability of the driving beam 122 while enhancing the output capacity of the driving unit 120, the plurality of reinforcement members may be arranged in the extension direction of the beam-like structure of the driving beam 122 in a manner of first decreasing and then increasing in dimensions. In other words, reinforcement members with a larger dimension may be arranged at a free end or the fixed region 122-1 of the driving beam 122, and reinforcement members with a smaller dimension may be arranged at a middle region of the beam-like structure. Specifically, by arranging a larger-dimensioned reinforcement member proximate to the free end of the driving beam 122 (i.e., an end of the driving beam 122 away from the fixed region 122-1), the thickness of the reinforcement member may be adjusted in a region of smaller strain through the reinforcement members with a larger dimension, and at the same time, the constraint on the deformation of the beam-like structure of the driving beam 122 can be reduced. By arranging the reinforcement members with a larger dimension proximate to the fixed region 122-1, the stiffness of the beam-like structure of the driving beam 122 can be enhanced through the reinforcement members with a larger dimension in a region of larger strain, so that the beam-like structure of the driving beam 122 is less likely to break during bending and vibration, and the reliability of the beam-like structure of the driving beam 122 is enhanced. By arranging reinforcement members with a smaller dimension in the middle region of the beam-like structure of the driving beam 122, it is possible to increase the stiffness of the beam-like structure while the constraint on the deformation of the reinforcement member on the beam-like structure is minimized, thereby reducing a deformation resistance of the beam-like structure of the driving beam 122 and making the beam-like structure more deformable.

In some embodiments, the driving unit 120 includes two sets of driving beams disposed on opposite sides of the casing 110, each set of the two sets of driving beams includes one or more driving beams, and a shape of the driving beam includes a rectangle, a trapezoid, or a rounded chamfered corner.

FIG. 16A to FIG. 16G are schematic diagrams illustrating different structures of a driving unit of according to some embodiments of the present disclosure.

Figure 16A:
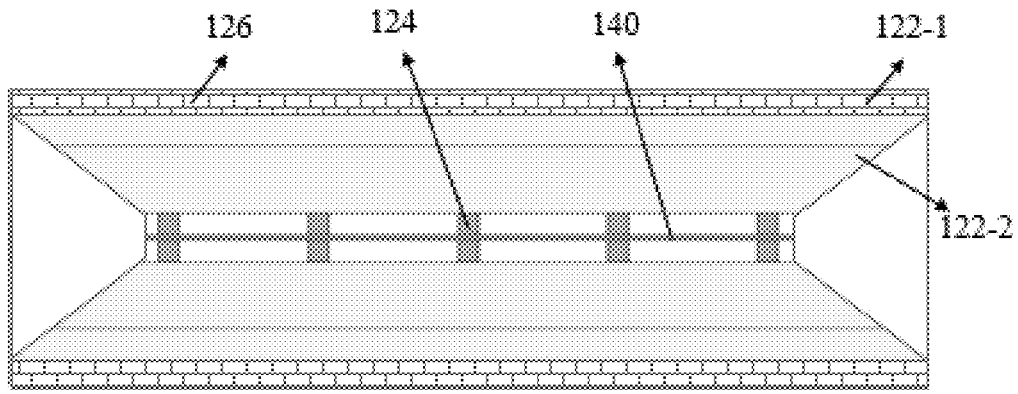
FIG. 16A to FIG. 16G are schematic diagrams illustrating different structures of a driving unit according to some embodiments of the present disclosure.
Figure 16B:
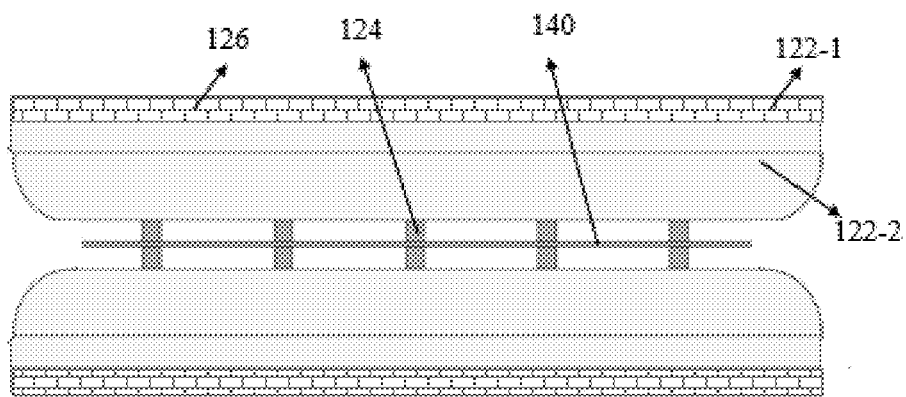

Referring to FIG. 10, FIG. 16A and FIG. 16B, in some embodiments, by designing a shape of the driving beam 122 of the driving unit 120, the output performance, resonance frequency f, reliability, and manufacturing process of the loudspeaker 100 may be adjusted.

In some embodiments, as shown in FIG. 10, the driving unit 120 may include two driving beams 122, and both of the two driving beams 122 are of a rectangular structure, and the fixed region 122-1 and the overhanging region 122-2 are disposed at end portions where two opposite sides of the rectangular structure are located. The fixed region 122-1 of each of the two driving beams 122 is disposed at each of two long sides of the substrate 126 of a rectangular ring structure. The overhanging region 122-2 of each of the two driving beams 122 is drivingly connected with the vibration transmission unit 140 via one or more coupled elastic structures 124, and a vibration signal is transmitted via the vibration transmission unit 140 to the vibration unit 130.

In some embodiments, as shown in FIG. 16A, the driving unit 120 may include two driving beams 122, and both of the two driving beams 122 are in a shape of a trapezoidal structure, with the fixed region 122-1 being disposed at one end of the trapezoidal structure at which a longer lower bottom is located, and the overhanging region 122-2 being disposed at one end of the trapezoidal structure at which a shorter upper bottom is located. The fixed region 122-1 of each of the two driving beams 122 is disposed at each of two long sides of the substrate 126 of the rectangular ring structure. The overhanging region 122-2 of each of the two driving beams 122 is drivingly connected with the vibration transmission unit 140 via one or more coupled elastic structures 124, and the vibration signal is transmitted via the vibration transmission unit 140 to the vibration unit 130. Compared with the driving beams 122 of the rectangular structure illustrated in FIG. 10, the design of the driving beams 122 of the trapezoidal structure illustrated in FIG. 16A can reduce stress on a localized region of the driving beam 122 and improve the reliability; at the same time, the stiffness of the driving beam 122 is adjusted to affect the output performance of the loudspeaker 100 and the resonance frequency f.

In some embodiments, as shown in FIG. 16B, the driving unit 120 may include two driving beams 122, and both of the driving beams 122 include rounded corners. Specifically, the driving beams 122 are provided with rounded corners with rounded transitions at one end where the overhanging region 122-2 is located, as shown in FIG. 16B. In some embodiments, the rounded corner corresponds to an arc radius that is no greater than a length/of the overhanging region 122-2. The fixed region 122-1 of each of the two driving beams 122 is disposed at each of two long sides of the substrate 126 of the rectangular ring structure, respectively. The overhanging region 122-2 of each of the two driving beams 122 is drivingly connected with the vibration transmission unit 140 via one or more coupled elastic structures 124, and the vibration signal is transmitted via the vibration transmission unit 140 to the vibration unit 130. Compared with the trapezoid-structured driving beams 122 shown in FIG. 16A, the design of the driving beams 122 including rounded corner structures shown in FIG. 16B can further reduce the stress of the localized region of the driving beam 122 and improve the reliability; meanwhile, the stiffness of the driving beam 122 is adjusted, which affects the output performance and the resonance frequency f of the loudspeaker 100.

In some embodiments, by designing a count of the driving beams 122 of the driving unit 120, it is also possible to regulate the output performance, the resonance frequency f, the reliability, and the manufacturing process of the loudspeaker 100.

Figure 16C:
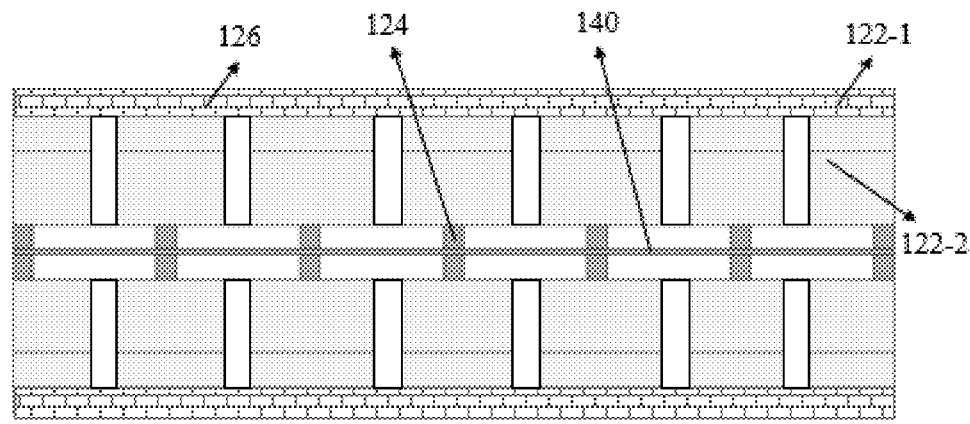

In some embodiments, as shown in FIG. 16C, the driving unit 120 may include a driving beam 122 including a plurality of rectangular structures (or a plurality of trapezoidal structures, a plurality of rounded corner structures, etc.), the plurality of driving beams 122 may be disposed on each of the two long sides of the substrate 126 of the rectangular ring structure, respectively, and the count of the driving beams 122 disposed on both long sides may be the same or different. The fixed region 122-1 of each of the driving beams 122 is connected with a long side of the substrate 126. The overhanging region 122-2 of each of the driving beams 122 may transmit a vibration signal to the vibration unit 130 through the vibration transmission unit 140 via a corresponding coupled elastic structure 124. In some embodiments, the overhanging regions 122-2 of the driving beams 122 may be connected with each other or may be independent of each other without connection. In some embodiments, a count of resonance frequencies of the plurality of driving beams 122 may be at least one, i.e., the resonance frequencies of the plurality of driving beams 122 may be all the same, or at least one may be different, thereby elevating a count of resonance peaks of the loudspeaker 100 and enhancing the output performance of the loudspeaker 100.

In some embodiments, the driving unit 120 further includes two sets of driving beams 122 located on another pair of opposite sides of the casing 110.

Figure 16D:
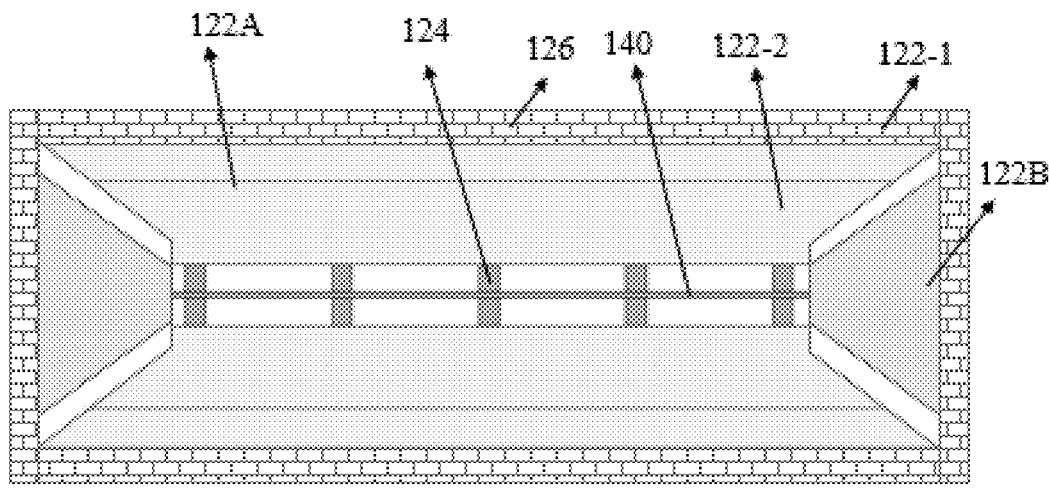

In some embodiments, as shown in FIG. 16D, the driving unit 120 may include four driving beams 122, each of the four driving beams 122 is in the shape of a trapezoidal structure, and the fixed region 122-1 is disposed at an end of the trapezoidal structure at which the longer lower bottom is located, the overhanging region 122-2 is disposed at an end of the trapezoidal structure at which the shorter upper bottom is located. Fixed regions 122-1 corresponding to one pair of the four driving beams 122 are disposed on each of the two long sides of the substrate 126 of the rectangle ring structure, respectively. For the purposes of the present disclosure, the pair of driving beams 122 may be defined as long-side driving beams 122A. Fixed regions 122-1 corresponding to the other pair of driving beams 122 are disposed on each of the two short sides of the substrate 126 of the rectangular ring structure. For the purposes of the present disclosure, the pair of driving beams 122 may be defined as short-side driving beams 122B. The overhanging region 122-2 corresponding to each of the four driving beams 122 is drivingly connected with the vibration transmission unit 140 via one or more coupled elastic structures 124, and the vibration signal is transmitted to the vibration unit 130 via the vibration transmission unit 140. In some embodiments, by the design of the driving beams 122 disposed on all four sides of the substrate 126, the tilting and flipping modes of the loudspeaker 100 can be reduced and the output performance of the loudspeaker 100 can be improved. In some embodiments, by adjusting a dimension of the long-side driving beam 122A and a dimension of the short-side driving beam 122B, a driving force and displacement output by the driving unit 120 may be enhanced, thereby causing an output sound pressure level of the loudspeaker 100 to increase. In some embodiments, by designing the dimensions of the long-side driving beam 122A and the short-side driving beam 122B, a resonance frequency of the long-side driving beam 122A is located at a different frequency band from a resonance frequency of the short-side driving beam 122B, it is possible to make the loudspeaker 100 to have a plurality of resonance frequencies, thereby increasing a range of frequency bands covered by the loudspeaker 100, and enhancing the output performance of the loudspeaker 100. It should be noted that in the present disclosure, resonance frequencies of two driving beams 122 included in a pair of driving beams 122 (e.g., rectangular symmetric driving beams shown in FIG. 10, trapezoidal symmetric driving beams shown in FIG. 16A, symmetric driving beams with rounded corners shown in FIG. 16B, two long-side driving beams 122A and two short-side driving beams 122B shown in FIG. 16D, etc.) may also be the same or different to enhance the count of resonance peaks and output performance of the loudspeaker 100.

Figure 16E:
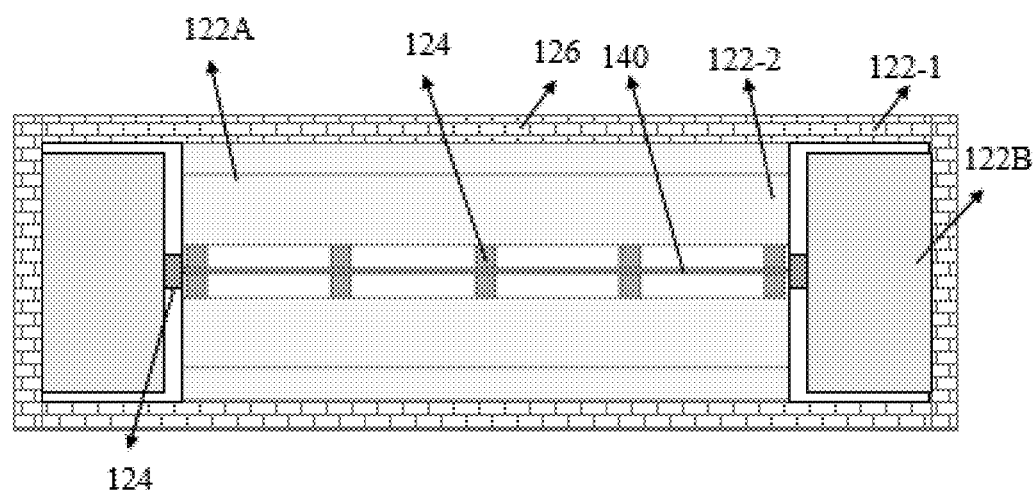

In some embodiments, as shown in FIG. 16E, the driving unit 120 may include four driving beams 122 of a rectangular structure (or with a rounded corner structures, etc.), one pair of driving beams 122 may be disposed on two long sides of the substrate 126 of the rectangular ring structure, and the other pair of driving beams 122 may be disposed on two short sides of the substrate 126 of the rectangular ring structure. In some embodiments of the present disclosure, the pair of driving beams 122 disposed on the two long sides of the substrate 126 may be defined as the long-side driving beams 122A, and the pair of driving beams 122 disposed on the two short sides of the substrate 126 may be defined as the short-side driving beams 122B. The fixed regions 122-1 of the driving beams 122 are connected with the long side of the substrate 126, respectively. The overhanging regions 122-2 of the driving beams 122 transmit the vibration signal to the vibration unit 130 through the vibration transmission unit 140 via a corresponding coupled elastic structure 124. Compared to the driving unit 120 shown in FIG. 16C, the design shown in FIG. 16E, in which the driving beams 122 are disposed on all four sides of the substrate 126, reduces tilting and flipping modes of the loudspeaker 100, while further enhancing the output performance of the loudspeaker 100.

In some embodiments, by designing the structure of the vibration transmitting unit 140, the transmission effect of force and displacement between the driving unit 120 and the vibration unit 130 may be improved, thereby enhancing the output performance of the loudspeaker 100.

Figure 16F:
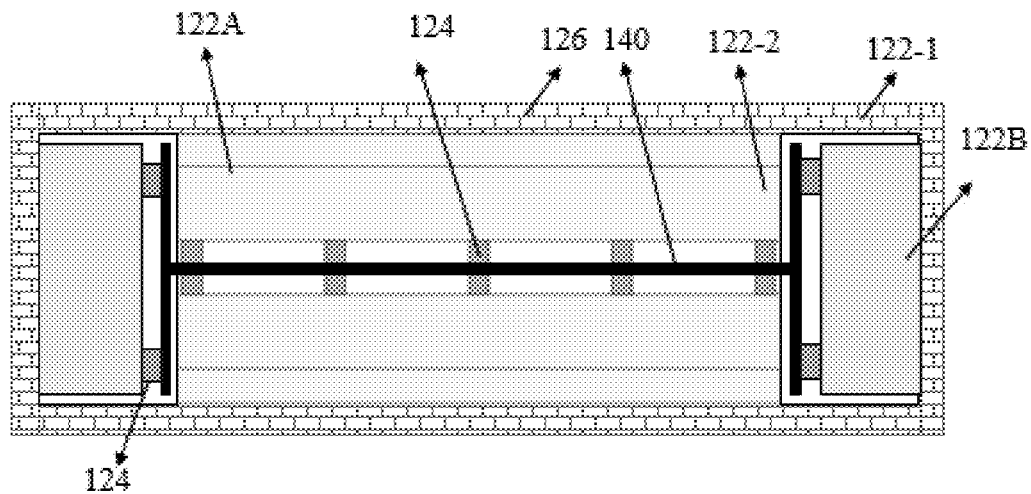

In some embodiments, as shown in FIG. 16 F, the vibration transmission unit 140 shown in FIG. 16F may include a structure shaped as a character "工" as compared to the structure of the vibration transmission unit 140 shown in FIG. 16E. The design of the structure shaped as a character "工" enables the forces and displacements generated by the short-side driving beams 122B to be efficiently transmitted to the vibration unit 130, thereby enhancing the efficiency of the energy transmission from the driving unit 120 to the vibration unit 130 and enhancing the output performance of the loudspeaker 100.

In some embodiments, by designing the coupled elastic structure 124 of the driving unit 120, the vibration properties of the driving unit 120 may be adjusted, thereby affecting the vibration properties of the loudspeaker 100 and improving the output performance of the loudspeaker 100.

Figure 16G:
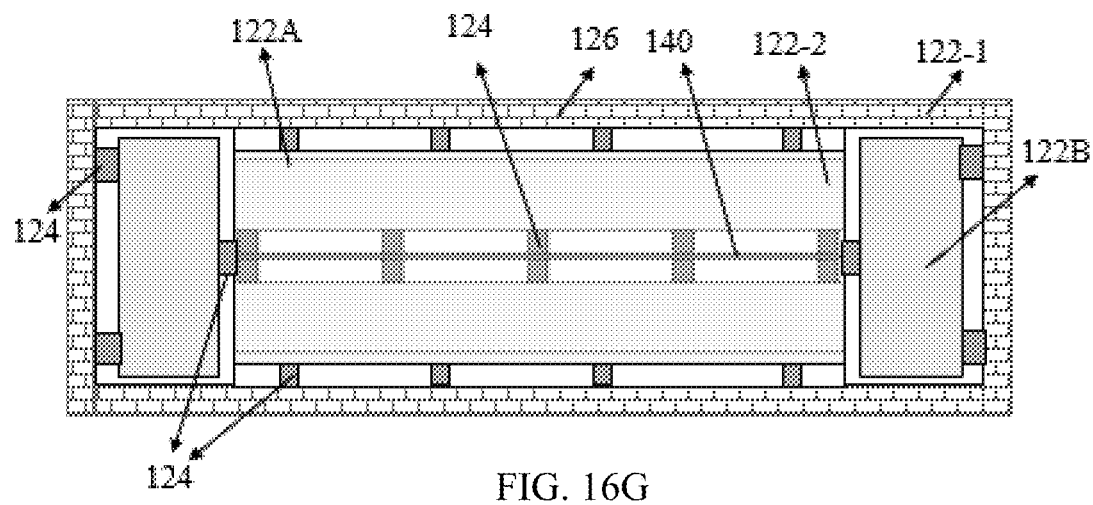

In some embodiments, compared to the structure of the driving unit 120 shown in FIG. 16E, in the driving unit 120 shown in FIG. 16G, the driving beam 122 is not directly connected with the substrate 126 but is indirectly connected with the substrate 126 through the coupled elastic structure 124. At this time, the overhanging region 122-2 of the driving beam 122 may be a portion of the driving beam 122 between the coupled elastic structure 124 connected with the substrate 126 and the coupled elastic structure connected with the vibration transmission unit 140. The substrate 126 may be regarded as the fixed region 122-1 of the driving beam 122. The driving beam 122 is indirectly connected with the substrate 126 through the coupled elastic structure 122, which may enable the driving beam 122 itself to act as a spring mass system, having its own resonance frequency, thereby affecting the overall vibration properties of the driving unit 120, and thus adjusting the vibration properties of the loudspeaker 100.

In some embodiments, the structures of the driving beam 122 and the vibration transmission unit 140 may also be designed to adjust the mass and/or impedance of the driving unit 120 to adjust the vibration properties of the driving unit 120, thereby adjusting the vibration properties of the loudspeaker 100 to enhance the output performance of the loudspeaker 100.

In some embodiments, the vibration transmission unit 140 includes an annular structure, with each set of driving beams 122 being connected with different regions of the vibration transmission unit 140.

FIG. 17A to FIG. 17K are schematic diagrams illustrating different structures of a driving unit according to some embodiments of the present disclosure.

Figure 17A:
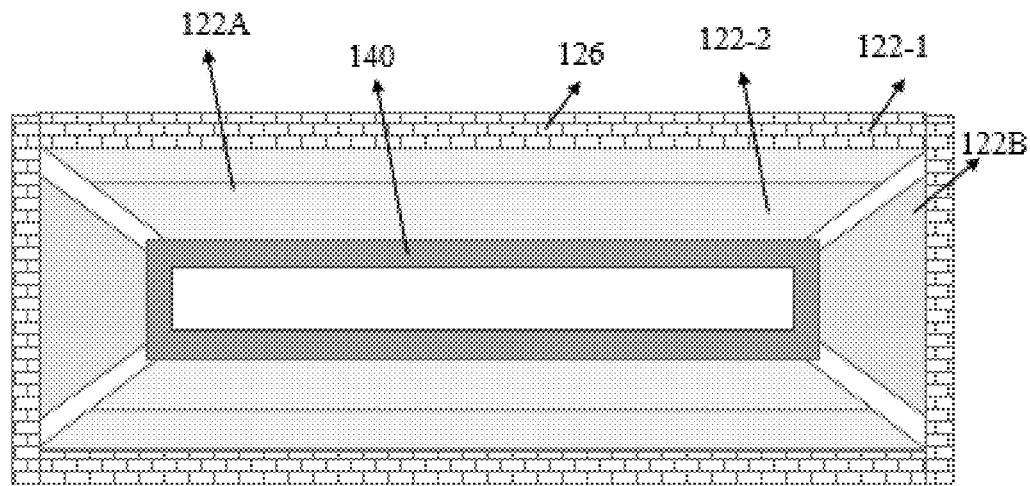
FIG. 17A to FIG. 17K are schematic diagrams illustrating different structures of a driving unit according to some embodiments of the present disclosure.

Referring to FIG. 17A, in some embodiments, compared to a structure of the driving unit 120 shown in FIG. 16D, the vibration transmission unit 140 of the driving unit 120 in FIG. 17A is an annular structure. The overhanging region 122-2 of the driving beam 122 is directly connected with an outer side of the vibration transmission unit 140 of the annular structure, and transmits a force and a displacement of the driving beam 122 to the vibration unit 130. By designing the vibration transmission unit 140, the force and displacement generated by the long-side driving beam 122A and the short-side driving beam 122B may be efficiently transmitted to the vibration unit 130, thereby enhancing the driving performance of the driving unit 120, and thereby enhancing the output performance of the loudspeaker 100. In some embodiments, one or more coupled elastic structures 124 may also be provided for connection between four driving beams 122 and the vibration transmission unit 140 of the annular structure, thereby realizing the impedance adjustment of the driving unit 120 to improve the output performance of the loudspeaker 100.

In some embodiments, a second driving beam is attached to the vibration transmission unit 140, and the second driving beam is indirectly connected with the casing 110.

Figure 17B:
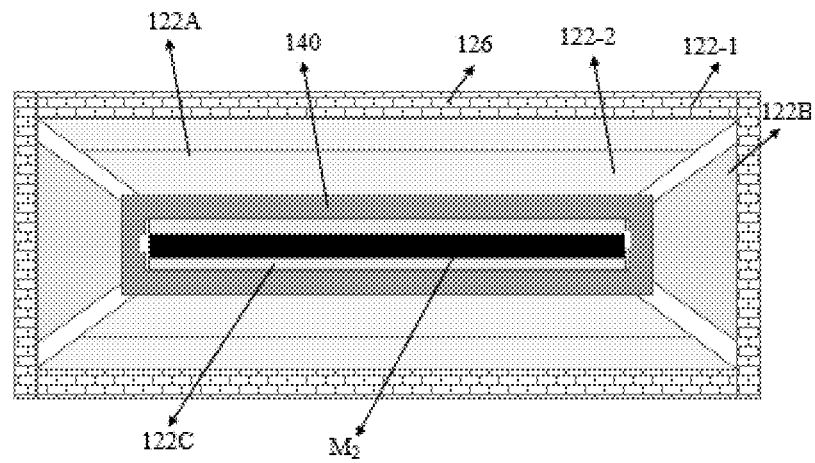

Referring to FIG. 17B, in some embodiments, compared to the structure of the driving unit 120 shown in FIG. 17A, the driving unit 120 shown in FIG. 17B may be provided with the second driving beam disposed in the vibration transmission unit 140 of the annular structure. The second driving beam is connected with an inner side of the vibration transmission unit 140 of the annular structure, and the second driving beam may also provide a driving force and a displacement for the vibration unit 130 to enhance the output performance of the loudspeaker 100. In some embodiments, the second driving beam may include two rectangular driving beams 122, the two rectangular driving beams 122 being connected with two long sides of the vibration transmission unit 140 of the annular structure, respectively. In some embodiments of the present disclosure, as shown in FIG. 17B, the two rectangular driving beams 122 described above, which are each connected with the two long sides of the inner side of the vibration transmission unit 140 of the annular structure, may be referred to as long-side second driving beams 122C.

In some embodiments, the vibration unit 130 further includes a mass element, and an end of the second driving beam away from the vibration transmission unit is directly connected with the mass element; alternatively, an end of the second driving beam away from the vibration transmission unit is connected with the mass element via a coupled elastic structure.

As shown in FIG. 17B, the long-side second driving beam 122C may be connected with a mass element $M_2$. For example, one end of each of the two long-side second driving beams 122C away from the vibration transmission unit 140 is connected with the mass element $M_2$. The mass element $M_2$ and the long-side second driving beams 122C may form a mass-spring-damping system that can affect the vibration properties of the driving unit 120, and further affect the vibration properties of the loudspeaker 100, thereby improving the output performance of the loudspeaker 100.

Figure 17C:
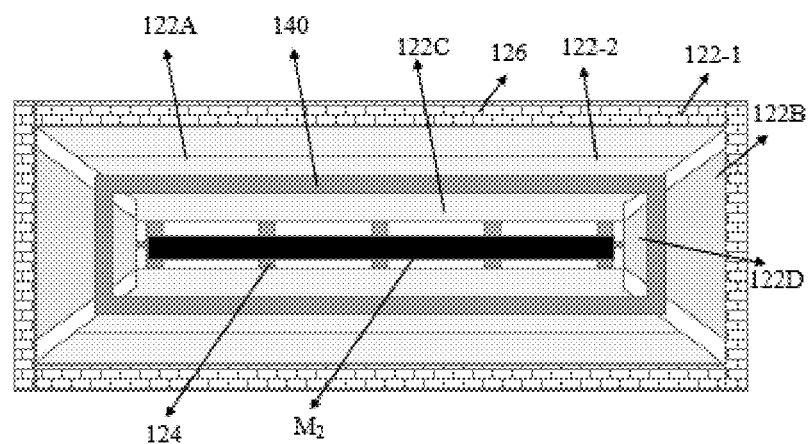

Referring to FIG. 17C, in some embodiments, compared to the driving unit 120 shown in FIG. 17B, the second driving beam in the driving unit 120 shown in FIG. 17 C may include, in addition to the two long-side second driving beams 122C, two trapezoidal driving beams 122 respectively connected with an inner side of short sides of the vibration transmission unit 140 of the annular structure. In some embodiments of the present disclosure, the two trapezoidal driving beams 122 connected with the two short sides of the vibration transmission unit 140 of the annular structure may be defined as the short-side second driving beams 122D, as shown in FIG. 17C. In some embodiments, the second driving beams (e.g., the long-side second driving beam 122C and the short-side second driving beams 122D) may provide a driving force and a displacement to the vibration unit 130, thereby enhancing the output performance of the loudspeaker 100.

In some embodiments, the second driving beams (e.g., the long-side second driving beams 122C and the short-side second driving beams 122D) may be connected with the mass element $M_2$ via the coupled elastic structure 124. For example, one end of each of the two long-side second driving beams 122C away from the vibration transmission unit 140 and one end of each of the two short-side second driving beams 122D away from the vibration transmission unit 140 are connected with the mass element $M_2$ via one or more coupled elastic structures 124, respectively. The mass element $M_2$, the coupled elastic structure 124, and the second driving beam may form the mass-spring-damping system that affects the vibration properties of the driving unit 120, thereby affecting the vibration properties of the loudspeaker 100 and improving the output performance of the loudspeaker 100.

In some embodiments, the vibration unit further includes a mass element, and the vibration transmission unit is connected with the mass element via a coupled elastic structure.

Figure 17D:
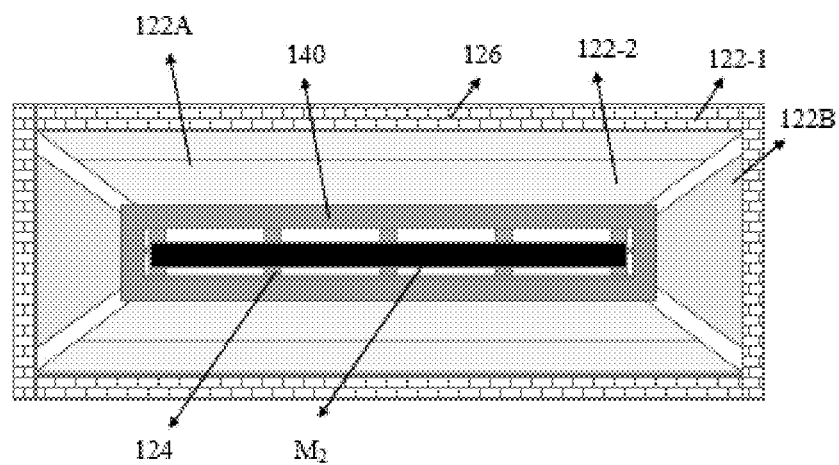

Referring to FIG. 17D, in some embodiments, compared to the driving unit 120 shown in FIG. 17A, in the driving unit 120 shown in FIG. 17D, the inner side of the vibration transmitting unit 140 of the annular structure may be connected with the mass element $M_2$ via the coupled elastic structure 124. The mass element $M_2$ and the coupled elastic structure 124 may constitute the mass-spring-damping system that affects the vibration properties of the driving unit 120, thereby affecting the vibration properties of the loudspeaker 100 and improving the output performance of the loudspeaker 100.

Figure 17E:
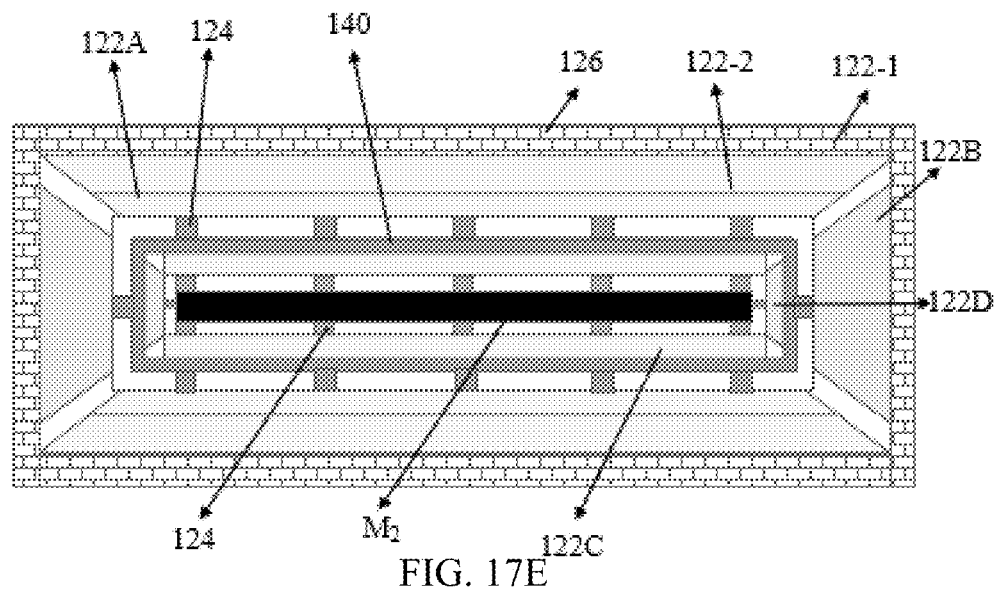

Referring to FIG. 17E, in some embodiments, compared to the driving unit 120 shown in FIG. 17C, in the driving unit 120 shown in FIG. 17E, the overhanging region 122-2 of the long-side driving beam 122A and the overhanging region of the short-side driving beam 122B are connected with the outer side of the vibration transmission unit 140 of the rectangular structure through one or more coupled elastic structures 124, respectively, so as to transmit a force and a displacement generated by the long-side driving beam 122A and the short-side driving beam 122B to the vibration unit 130. By providing the coupled elastic structure 124 between the long-side driving beam 122A and the vibration transmission unit 140, and between the short-side driving beam 122B and the vibration transmission unit 140, the impedance adjustment of the driving unit 120 is realized, and the output performance of the loudspeaker 100 is improved. At the same time, the mass element $M_2$, the coupled elastic structure 124, and the second driving beam structure (e.g., the long-side second driving beam 122C and the short-side second driving beam 122D) may form the mass-spring-damping system, which can affect the vibration properties of the vibration unit 130, and further affect the vibration properties of the loudspeaker 100, thereby improving the output performance of the loudspeaker 100.

Figure 17F:
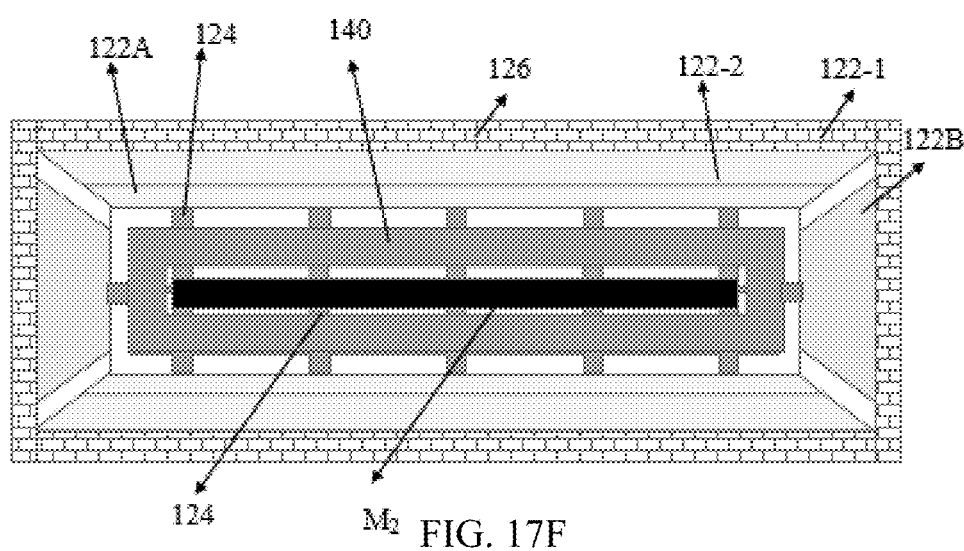

Referring to FIG. 17F, in some embodiments, compared to the driving unit 120 shown in FIG. 17D, in the driving unit 120 shown in FIG. 17F, the overhanging region 122-2 of the long-side driving beam 122A and the overhanging region of the short-side driving beam 122B are connected with the outer side of the vibration transmission unit 140 of the rectangular structure through one or more coupled elastic structures 124, respectively, so as to transmit the forces and displacement generated by the long-side driving beam 122A and the short-side driving beam 122B to the vibration unit 130. By providing the coupled elastic structure 124 between the long-side driving beam 122A and the vibration transmission unit 140, and between the short-side driving beam 122B and the vibration transmission unit 140, impedance adjustment of the driving unit 120 is realized, and the output performance of the loudspeaker 100 is improved. Meanwhile, the mass element $M_2$ and the coupled elastic structure 124 may constitute the mass-spring-damping system that affects the vibration properties of the driving unit 120, and further affects the vibration properties of the loudspeaker 100, thereby improving the output performance of the loudspeaker 100.

It is to be noted that for one or more driving units 120 including the mass element $M_2$ shown in FIG. 17A to FIG. 17F, shapes and structures of the driving beam 122 (e.g., the long-side driving beam 122A, the short-side driving beam 122B, the long-side second driving beam 122C, the short-side second driving beam 122D) included therein may include, but are not limited to, a rectangular structure, a trapezoidal structure, a structure with a rounded corner, or the like, and the present disclosure does not limit the same.

In some embodiments, two sets of driving beams 122 provided opposite each other may extend in a staggered type, and a corresponding vibration transmission unit 140 may include a folded structure, and each of the two sets of driving beams 122 is connected with a different region of the vibration transmission unit 140. In some embodiments, each driving beam 122 may be directly connected with the vibration transmission unit 140; alternatively, each driving beam 122 may be connected with the vibration transmission unit 140 via the coupled elastic structure 124.

In some embodiments, a design that extension in a staggered type between one or more driving beams included in each of the two sets of driving beams makes it possible to adjust the dimension of the driving beam 122 over a wide range, which in turn allows the adjustment of the resonance frequency of the loudspeaker 100 within a relatively large range, thereby enhancing the output performance of the loudspeaker 100. On the other hand, the plurality of driving beams 122 may be individually designed so that the plurality of driving beams 122 may have one or more resonance frequencies f to achieve the adjustment of vibration modes of the loudspeaker 100. In some embodiments, each of the plurality of driving beams 122 may be independent of each other, such that each of the plurality of driving beams 122 may individually deform to output a driving force and a displacement, thereby realizing the adjustment of the vibration modes of the loudspeaker 100.

Figure 17G:
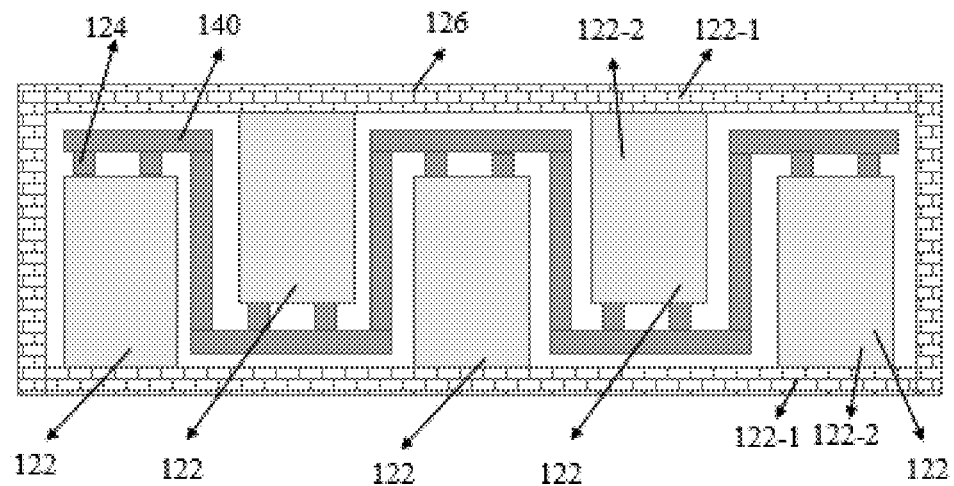

Referring to FIG. 17G, in some embodiments, the driving unit 120 may include two sets of driving beams disposed on opposite sides of the casing 110, with each set of the two sets of driving beams including one or more driving beams 122 (e.g., the count of the driving beams 122 may be three, five, six, etc.), and the plurality of driving beams 122 are disposed spaced apart in sequence. In some embodiments, the plurality of driving beams 122 may be independent of each other, or no less than one of the driving beams 122 may be connected by a structure, for example, by covering a flexible membrane, by designing an elastic connection structure, or the like. In some embodiments, any two adjacent driving beams 122 extend in a staggered type (i.e., the two adjacent driving beams 122 are disposed in a staggered position with respect to each other). For example, for any two adjacent driving beams 122, one of the driving beams 122 has a fixed region 122-1 disposed on one of long sides of the substrate 126, and the other driving beam 122 has a fixed region 122-1 disposed on the other long side of the substrate 126, and the overhanging regions 122-2 of the two driving beams 122 are respectively connected with the vibration transmission unit 140 via one or more coupled elastic structures 124 to realize an elastic connection between the driving beams 122 and the vibration transmission unit 140, so as to transmit the force and the displacement output from the driving beams 122 to the vibration unit 130. In some embodiments, since the plurality of driving beams 122 are disposed in a staggered position with respect to each other, ends at which overhanging regions 122-2 of the plurality of driving beams 122 are located are also disposed in a staggered position. In order to facilitate a connection between the vibration transmission unit 140 and the driving beam 122, in some embodiments, the vibration transmission unit 140 may be of a folded structure, as shown in FIG. 17G. With the above-described setting, an adjustment range of the dimension of the driving beam 122 may be enlarged as compared to the structures shown in FIG. 16A to FIG. 17F, so that the length/of the overhanging region 122-2 of the driving beam 122 may be close to a length or a width of the substrate 126 of the rectangular structure, thus the resonance frequency of the loudspeaker 100 may be adjusted in a correspondingly large range to enhance the output performance of the loudspeaker 100. In some embodiments, each of the driving beams 122 and a corresponding coupled elastic structure 124, and the vibration transmission unit 140 may be provided independently. Therefore, adjustment of vibration modes of the loudspeaker 100 can be achieved by individually designing structures of different driving beams 122 to achieve different resonance frequencies f. In addition, by individually exciting each of the driving beams 122, each of the driving beams 122 may individually deform to output the driving force and the displacement, thereby realizing the adjustment of the vibration modes of the loudspeaker 100.

Figure 17H:
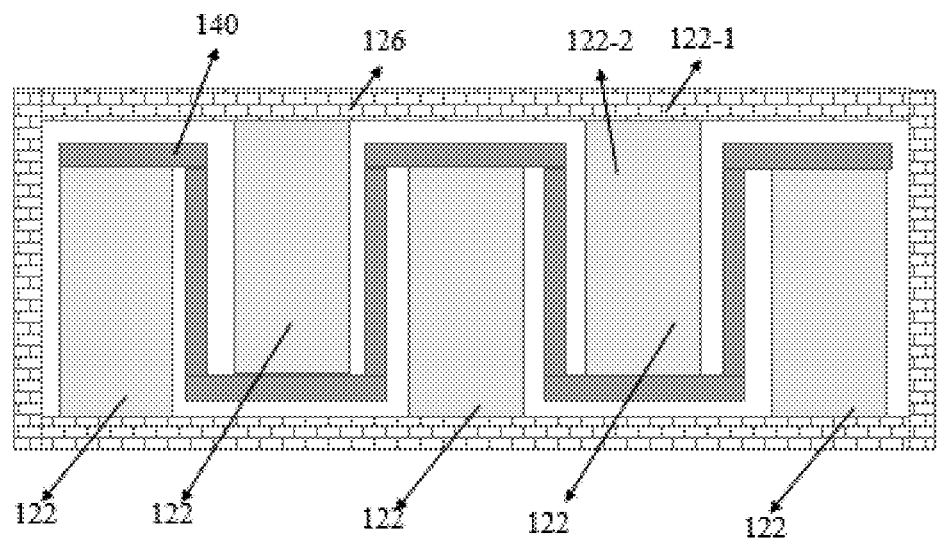

Referring to FIG. 17H, in some embodiments, compared to the driving unit 120 shown in FIG. 17G, in the driving unit 120 shown in FIG. 17H, the overhanging region 122-2 of the driving beam 122 may be directly connected with the vibration transmission unit 140, thereby enhancing the efficiency of the transmission of the force and displacement between the driving beam 122 and the vibration unit 130, enhancing the output of the vibration unit 130, and thereby enhancing the output performance of the loudspeaker 100.

In some embodiments, a deflection (a maximum deformation amount) of the driving beam 122 during deformation affects the driving force and displacement output by the driving beam 122, which in turn affects a maximum displacement of the diaphragm 131 of the vibration unit 130 when it vibrates, and affects an amount of air pushed by the diaphragm 131, thereby affecting the output performance of the loudspeaker 100. The deflection of the driving beam 122 is significantly affected by the length of the driving beam 122. In some embodiments, by increasing an equivalent length of the overhanging region 122-2 of the driving beam 122, the driving force and displacement outputted by the driving unit 120 and the vibration displacement of the diaphragm 131 of the vibration unit 130 may be increased, thereby enhancing the output performance of the loudspeaker 100.

In some embodiments, each set of the two sets of driving beams 122 disposed opposite each other includes a driving beam 122 with a bent structure, and each driving beam 122 with a bent structure has an end away from its fixed region 122-1, and two ends of the two driving beams 122 each with a bent structure are coupled to a same vibration transmission unit 140.

Figure 17I:
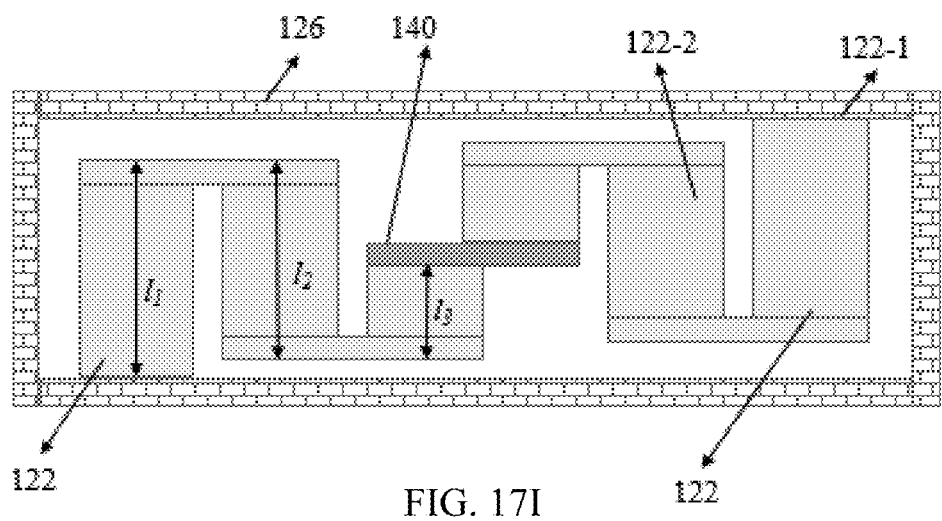

Referring to FIG. 17I, in some embodiments, the driving unit 120 may include two driving beams 122, with the fixed regions 122-1 of the two driving beams 122 being fixed to two opposite long sides of the substrate 126, respectively. In some embodiments, each of the driving beams 122 may be a folded structure, and each of the driving beams 122 may include one or more bent structures, respectively, and the plurality of bent structures of the driving beam 122 extend as a whole in an extension direction of the long side of the substrate 126. In some embodiments, for each of the driving beams 122, the greater the count of bent structures, the longer the equivalent length of the overhanging region 122-2 corresponding to the driving beam 122, the greater the deflection when the driving beam 122 is deformed, and the output performance of the loudspeaker 100 the better. Exemplarily, when the driving beam 122 includes three bent structures, since the fixed region 122-1 of the driving beam 122 is disposed on the long side of the substrate 126, the direction extending from the fixed region 122-1 to the overhanging region 122-2 of the driving beam 122 may be in a direction perpendicular to two long sides of the substrate 126 (i.e., an extension direction of a short side of the substrate 126). At this time, in a deformation process of the driving beam 122, the deformation of a portion of the driving beam 122 in the extension direction of the long side of the substrate 126 is small, and mainly a portion of the driving beam 122 in the extension direction of the short side of the substrate 126 is deformed. That is, the equivalent length/of the driving beam 122 may be a sum of the equivalent lengths (a length $l_1$, a length $l_2$, and a length $l_3$) of the three bent structures in FIG. 17I in the extension direction of the short side of the substrate 126, and each equivalent length of each of the bent structures is no greater than a dimension of the short side of the substrate 126. In some embodiments, the bent structure refers to a structure on the driving beam 122 that primarily generates deformation. For example, as shown in FIG. 17I, the portion of the overhanging region 122-2 of the driving beam 122 in the extension direction of the short side of the substrate 126, which is a main deformation portion of the driving beam 122, serves as a bent structure that produces bending and deformation in a vibration direction of the vibration unit 130 (i.e., a direction that is perpendicular to a paper surface). The portion of the overhanging region 122-2 of the driving beam 122 that extends in the long side of the substrate 126 primarily serves as a connection for joining the three bent structures. In some embodiments, the end of the overhanging region 122-2 of the driving beam 122 (i.e., the end of the driving beam 122 away from the fixed region 122-1) may be drivingly connected with the vibration transmission unit 140, and the driving force and displacement generated by the deformation of the driving beam 122 are transmitted to the vibration unit 130 via the vibration transmission unit 140.

Figure 17J:
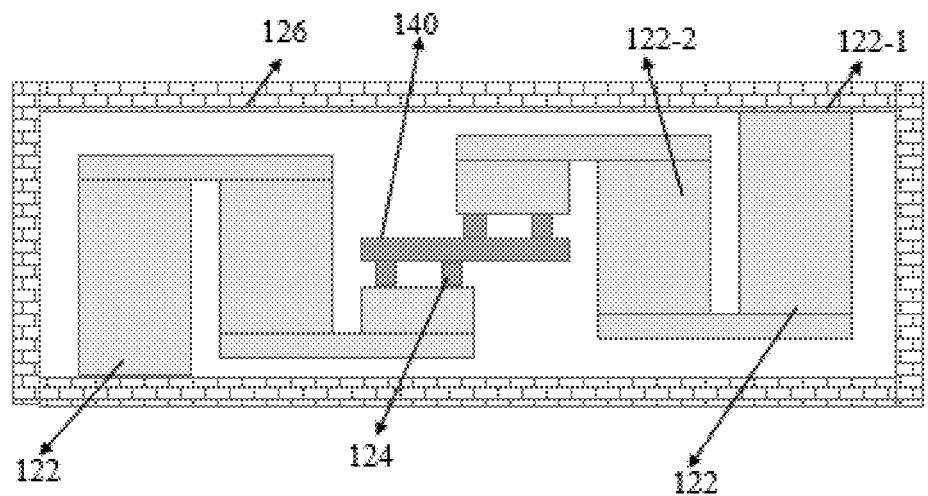

Referring to FIG. 17J, in some embodiments, compared to the driving unit 120 shown in FIG. 17I, in the driving unit 120 shown in FIG. 17J, the overhanging regions 122-2 of the two driving beams 122 may be connected with the vibration transmission unit 140 via one or more coupled elastic structures 124, respectively. The setting of the coupled elastic structures 124 enables impedance adjustment of the driving unit 120 and improves the output performance of the loudspeaker 100.

Figure 17K:
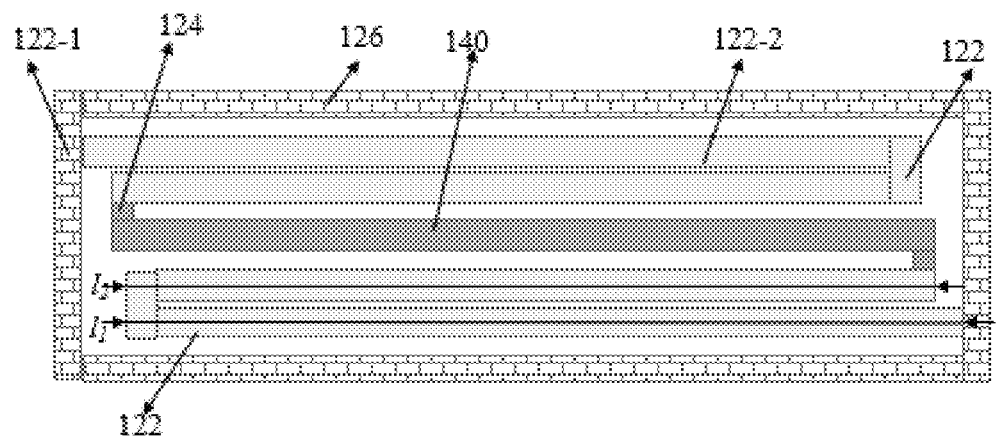

Referring to FIG. 17K, in some embodiments, compared to the driving unit 120 shown in FIG. 17J, in the driving unit 120 shown in FIG. 17K, the fixed regions 122-1 of the two driving beams 122 are fixed to two opposite short sides of the substrate 126, respectively. At this point, the direction extending from the fixed region 122-1 of the driving beam 122 to the overhanging region 122-2 may be a direction perpendicular to the two short sides of the substrate 126 (i.e., the extension direction of the long side of the substrate 126). In the deformation process of the driving beams 122, for the portion of the driving beam 122 in the extension direction of the short side of the substrate 126, the deformation is small, and mainly the portion of the driving beam 122 in the extension direction of the long side of the substrate 126 generates the deformation. Correspondingly, the equivalent length l of the driving beam 122 may be a sum of equivalent lengths of a plurality of bent structures in FIG. 17K in the extension direction of the long side of the substrate 126, and each equivalent length of the bent structures is no greater than a dimension of the long side of the substrate 126. Exemplarily, as shown in FIG. 17K, the driving beam 122 may include two bent structures, and the equivalent length l of the driving beam 122 may be a sum of equivalent lengths (the length $l_1$ and the length $l_2$) of the two bent structures in the extension direction of the long side of the substrate 126 in FIG. 17K. Compared to the driving unit 120 shown in FIG. 17J, in the driving unit 120 shown in FIG. 17K, equivalent lengths of the bent structures of the driving beam 122 are designed in a larger range, so that in a case that the equivalent lengths of the bent structures of the driving beam 122 are the same, the driving beam 122 of the driving unit 120 shown in FIG. 17K may have a smaller count of bent structures, which reduces the stress concentration of the driving beams 122 and increases the operation reliability of the driving beams 122.

It should be noted that in some embodiments of the present disclosure, since the driving beam 122 is mainly deformed by the overhanging region 122-2, the equivalent length described above is mainly the equivalent length l of the overhanging region 122-2.

Figure 17L:
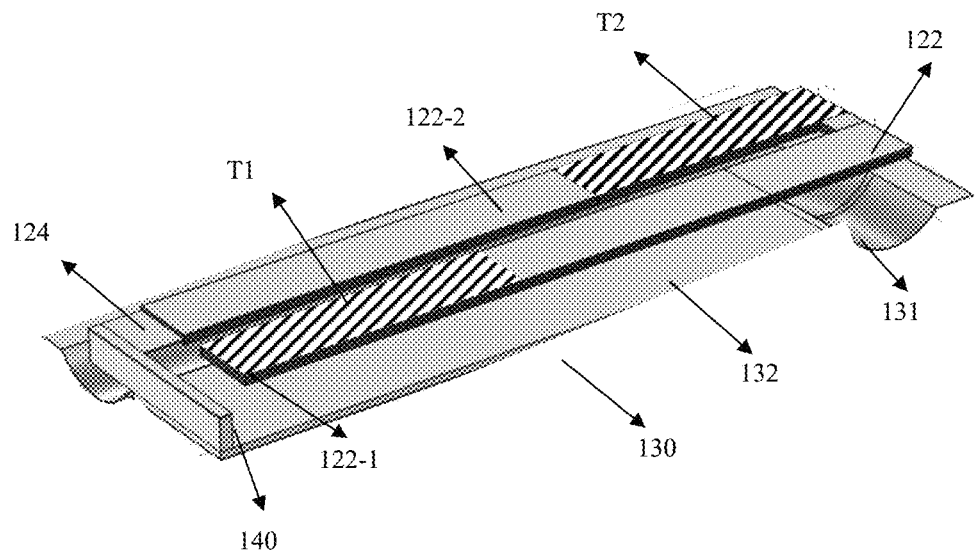
FIG. 17L is a schematic diagram illustrating an exemplary internal structure of the driving unit corresponding to FIG. 17K according to some embodiments of the present disclosure.
Figure 17M:
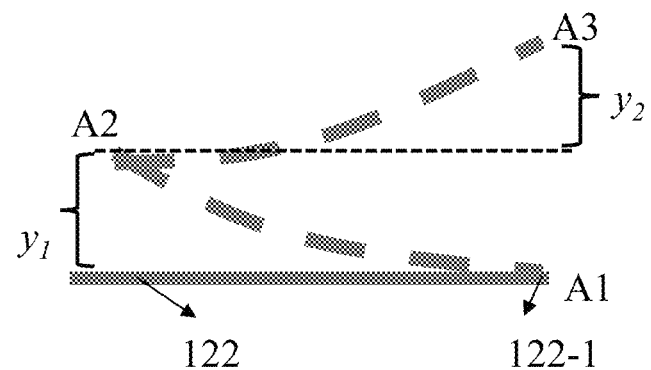
FIG. 17M is a schematic diagram illustrating the deformation of the driving beam shown in FIG. 17L according to some embodiments of the present disclosure.
Figure 17N:
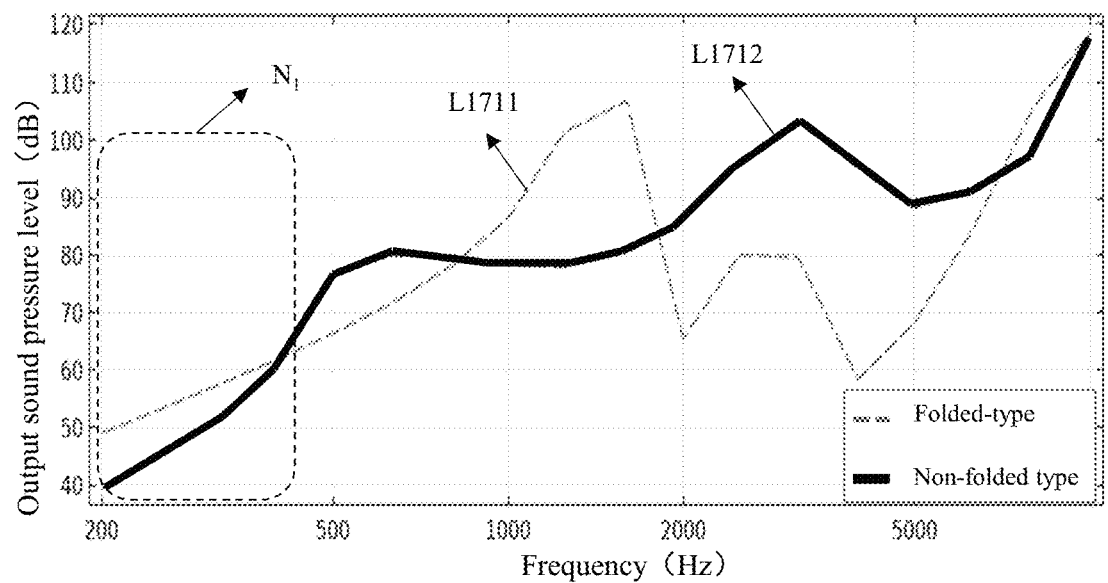
FIG. 17N is a schematic diagram illustrating the frequency response curves of a loudspeaker including a driving beam with a folded structure shown FIG. 17L and a loudspeaker including a driving beam with a non-folded structure according to some embodiments of the present disclosure.

FIG. 17L is a schematic diagram illustrating an exemplary internal structure of the driving unit corresponding to FIG. 17K. FIG. 17M is a schematic diagram illustrating deformation of the driving beam shown in FIG. 17L according to some embodiments of the present disclosure. FIG. 17N is a schematic diagram illustrating frequency response curves of a loudspeaker including a driving beam with a folded structure shown FIG. 17L and a loudspeaker including a driving beam with a non-folded structure according to some embodiments of the present disclosure. Referring to FIG. 17L, only a portion of an internal structure of the driving unit 120 including one driving beam 122 is described. In some embodiments, the driving beam 122 is provided with a first electrode-covered region T1 and a second electrode-covered region T2, the first electrode-covered region T1 may be located at an end of the overhanging region 122-2 proximate to the fixed region 122-1 on the driving beam 122, and the second electrode-covered region T2 may be located at an end of the overhanging region 122-2 proximate to the vibration transmission unit 140 on the driving beam 122. The first electrode layer 12211 within the first electrode-covered region T1 and the second electrode-covered region T2 may be electrically conductive. According to a polarization direction of a corresponding piezoelectric layer 12212, a voltage with the same polarity is applied to the first electrode-covered region T1 and the second electrode-covered region T2, so as to cause portions of the driving beam 122 corresponding to the first electrode-covered region T1 and the second electrode-covered region T2 to simultaneously produce bending and deformation in a same direction, enhance an output displacement of the driving beam 122, and enhance the output performance of the loudspeaker 100. Exemplarily, a portion of the overhanging region 122-2 on the driving beam 122 proximate to the fixed region 122-1 and a portion of the overhanging region 122-2 on the driving beam 122 proximate to the vibration transmission unit 140 simultaneously generate upward or downward bending and deformation. As shown in FIG. 17M, an A1A2 section of the deformed driving beam 122 is bent upward and an A2A3 section of the deformed driving beam 122 is bent upward.

Please refer to FIG. 17M, a solid line structure represents the driving beam 122 before deformation and a dashed line structure represents the driving beam 122 after the deformation. In some embodiments, by setting the driving beam 122 of a folded structure, the bending and deformation of the portion of the driving beam 122 (the section A1A2) proximate to the fixed region 122-1 forms a vertical-direction displacement (a deflection value) $y_1$, and the bending of the portion of the portion of the driving beam 122 (the section A2A3) proximate to the vibration transmission unit 140 forms a vertical-direction displacement (a deflection value) $y_2$, and ultimately, an overall vertical-direction displacement of the driving beam 122 is obtained as $y_1+y_2$, so that the output displacement of the driving beam 122 can be increased, effectively increasing the displacement amount of the loudspeaker 100, thereby enhancing the output performance of the loudspeaker 100.

Referring to FIG. 17N, a folded line L1711 indicates a frequency response curve of the loudspeaker 100 including a driving beam 122 with a folded structure as shown in FIG. 17L, and a folded line L1712 indicates a frequency response curve of the loudspeaker 100 including a structure driving beam 122 with a non-folded structure. As shown in FIG. 17N, in a low-frequency range (e.g., a range of 200 Hz to 450 Hz) corresponding to a dashed box N1, the folded line L1711 is clearly located above the folded line L1712, and the output of the loudspeaker 100 when the driving beam 122 is the folded structure is significantly improved in the low-frequency range (e.g., the range of 200 Hz to 450 Hz).

Figure 17O:
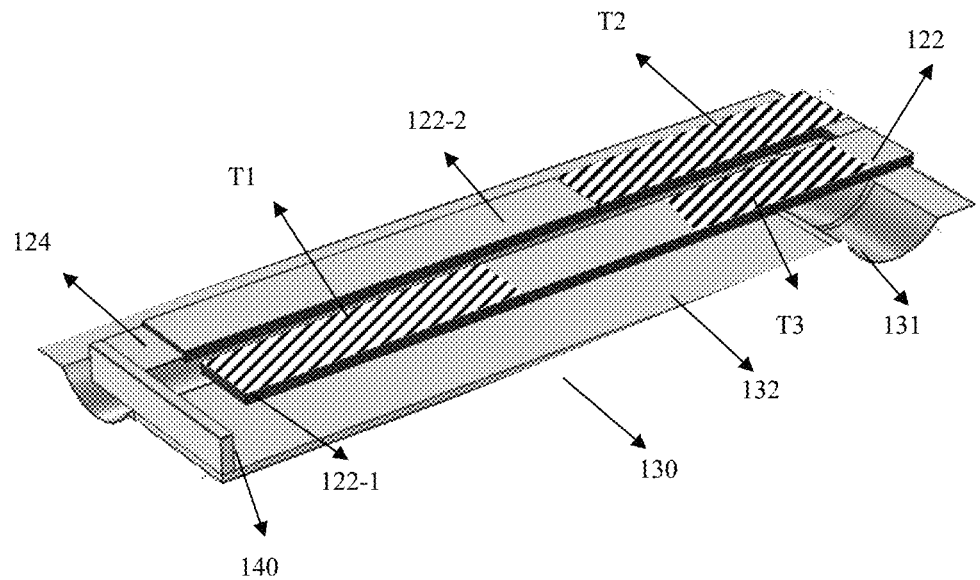
FIG. 17O is a schematic diagram illustrating another exemplary internal structure of the driving unit corresponding to FIG. 17 K according to some embodiments of the present disclosure.
Figure 17P:
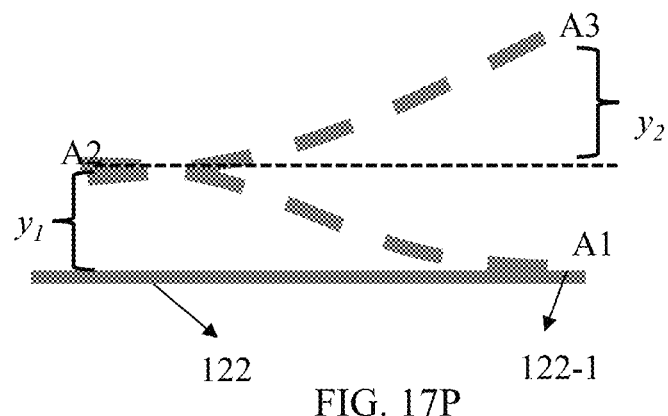
FIG. 17P is a schematic diagram illustrating the deformation of a driving beam shown in FIG. 17O according to some embodiments of the present disclosure.
Figure 17Q:
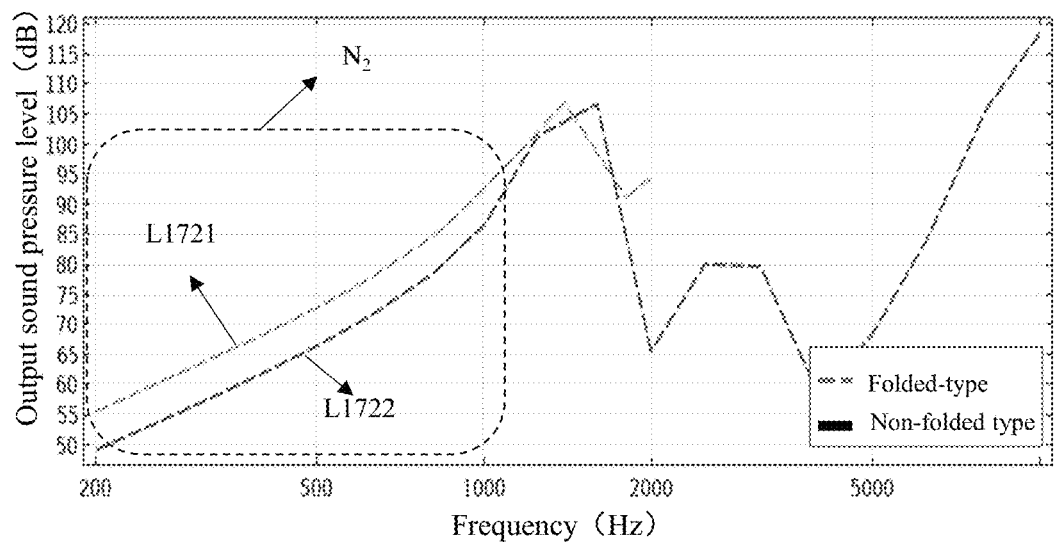
FIG. 17Q is a schematic diagram illustrating the frequency response curves of a loudspeaker including a driving beam with a folded structure and a loudspeaker including a driving beam with a non-folded structure of a loudspeaker shown in FIG. 17O according to some embodiments of the present disclosure.

FIG. 17O is a schematic diagram illustrating another exemplary internal structure of a driving unit corresponding to FIG. 17K. FIG. 17P is a schematic diagram illustrating deformation of a driving beam shown in FIG. 17O, and FIG. 17Q is a schematic diagram illustrating frequency response curves of a loudspeaker including a driving beam with a folded-structure shown in FIG. 17O and a loudspeaker including a driving beam with a non-folded structure shown in FIG. 17O. Referring to FIG. 17O, in some embodiments, compared to the driving unit 120 shown in FIG. 17L, in the driving unit 120 shown in FIG. 17O, by partitioning an interior of the first electrode-covered region T1, the second electrode-covered region T2, and a third electrode-covered region T3, a voltage with a same polarity is applied to the first electrode-covered region T1 and the second electrode-covered region T2 according to a polarization direction of a corresponding piezoelectric layer 12212, thereby causing portions of the driving beam 122 corresponding to each of the first electrode-covered region T1 and the second electrode-covered region T2 to simultaneously produce bending deformation in a same direction. A voltage with an opposite polarity is applied to the first electrode-covered region T1 and the third electrode-covered region T3, thereby causing portions of the driving beam 122 corresponding to each of the first electrode-covered region T1 and the third electrode-covered region T3 (i.e., a portion of the overhanging region 122-2 proximate to the fixed region 122-1, e.g., a section A1A2 in FIG. 17P) to be second-order bending, and the portion of the driving beam 122 corresponding to the second electrode-covered region T2 (i.e., the portion of the overhanging region 122-2 proximate to the vibration transmission unit 140, e.g., a section A2A3 in FIG. 17P) to be first-order bending. The first-order bending refers to bending in one direction overall, as shown in FIG. 17P, bending of the entire section A2A3 of the deformed driving beam 122 is in an upward direction. The second-order bending refers to that two ends in a length direction of the overhanging region 122-2 proximate to the fixed region 122-1 are bent in two directions, as shown in FIG. 17P, two ends (A1 and A2) in a length direction of the section A1A2 of the deformed driving beam 122 are bent in two directions, with A1 bent in an upward direction and A2 bent in a downward direction.

Please refer to FIG. 17P, a solid structure indicates the driving beam 122 before deformation and a dashed structure indicates the driving beam 122 after the deformation. In some embodiments, by setting the driving beam 122 with the folded structure, bending and deformation of the portion of the driving beam 122 proximate to the fixed region 122-1 (the section A1A2) forms a vertical-direction displacement (deflection value) $y_1$, and bending and deformation of the portion of the driving beam 122 proximate to the vibration transmission unit 140 (the section A2A3) forms a vertical-direction displacement (deflection value) $y_2$, and ultimately an overall vertical-direction displacement of the driving beam 122 is obtained as $y_1+y_2$, so that the output displacement of the driving beam 122 can be increased, effectively increasing the displacement amount of the loudspeaker 100, thereby enhancing the output performance of the loudspeaker 100.

Referring to FIG. 17Q, a folded line L1721 represents a frequency response curve of the loudspeaker 100 including the driving beam 122 with the folded structure shown in FIG. 17O, and a folded line L1722 represents a frequency response curve of the loudspeaker 100 including the driving beam 122 with the non-folded structure shown in FIG. 17O. As shown in FIG. 17Q, in a low-frequency range (e.g., a range of 200 Hz to 1000 Hz) corresponding to a dashed box N2, the folded line L1721 is clearly located above the folded line L1722, and the output of the loudspeaker 100 including the driving beam 122 with the folded structure is significantly improved in the low-frequency range (e.g., the range of 200 Hz to 1000 Hz).

Figure 17R:
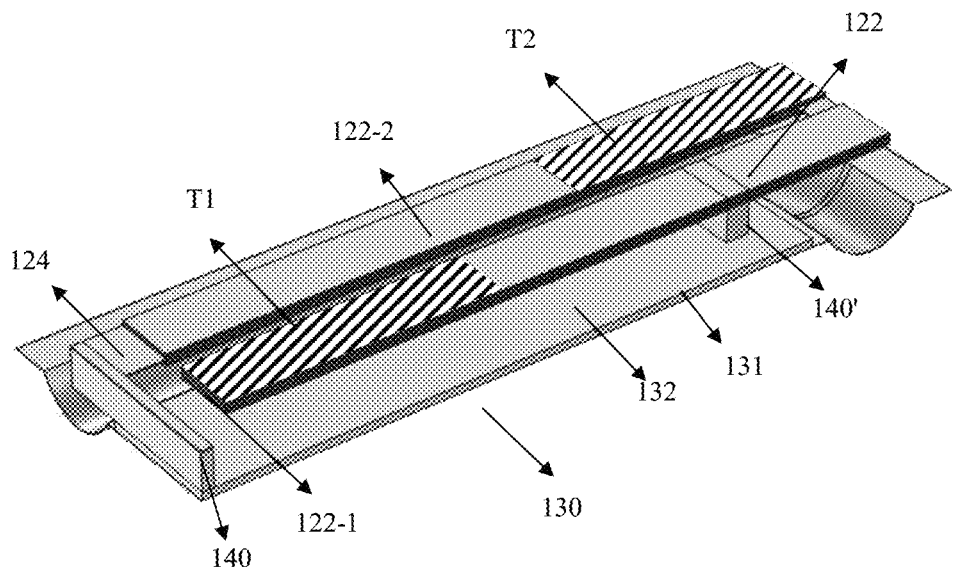
FIG. 17R is a schematic diagram illustrating another exemplary internal structure of the driving unit corresponding to FIG. 17K according to some embodiments of the present disclosure.

FIG. 17R is a schematic diagram illustrating another exemplary internal structure of the driving unit corresponding to FIG. 17K. Referring to FIG. 17R, in some embodiments, compared to the driving unit 120 shown in FIG. 17L or FIG. 17O, the driving unit 120 shown in FIG. 17R is provided with a second vibration transmission unit 140', the vibration transmission unit 140 and the second vibration transmission unit 140' are disposed at two ends of an extension direction of a folded structure of the overhanging region 122-2 of the driving beam 122, respectively, as shown in FIG. 17R. By setting the second vibration transmission unit 140', a driving force and displacement generated by vibration of the driving beam 122 may be further effectively transmitted to the vibration unit 130, an output sound pressure level of the loudspeaker 100 can be enhanced, and vibration modes of the driving beam 122 can also be effectively adjusted, thereby adjusting the vibration modes of the loudspeaker 100 and enhancing the output performance of the loudspeaker 100.

Figure 17S:
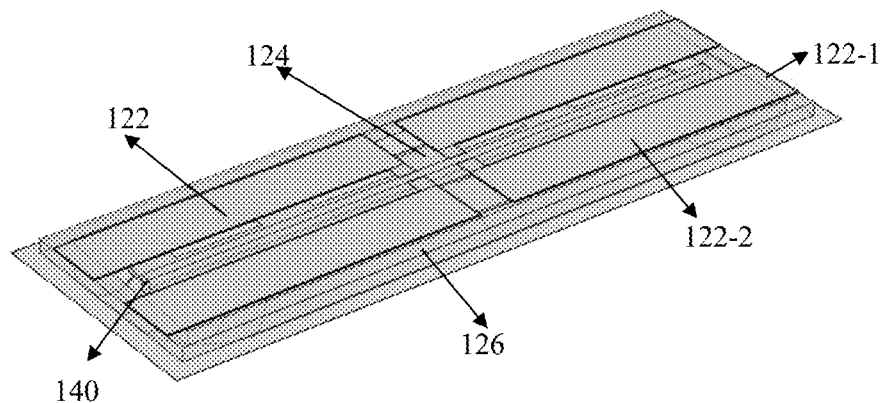
FIG. 17S is a schematic diagram illustrating another structure of a driving unit according to some embodiments of the present disclosure.

FIG. 17S is a schematic diagram illustrating another structure of a driving unit according to some embodiments of the present disclosure. As shown in FIG. 17S, in some embodiments, the driving unit 120 may include four driving beams 122, and the four driving beams 122 may all be of rectangular structure. Two of the four driving beams 122 may be spaced apart on one of the short sides of the substrate 126, and the other two of the four driving beams 122 may be spaced apart on the other short side of the substrate 126. Each of the four driving beams 122 may be connected with the vibration transmission unit 140 via one or more coupled elastic structures 124, thereby transmitting forces and displacements output from the driving beams 122 to the vibration unit 130. In some embodiments, an extension direction of each of the four driving beams 122 (i.e., a direction from the fixed region 122-1 to the overhanging region 122-2) is parallel to a direction of long sides of the substrate 126. Through the above-described setup, a dimension of the driving beam 122 may be adjusted in a larger range, so that the resonance frequency of the loudspeaker 100 may be adjusted within a larger range accordingly, and the output performance of the loudspeaker 100 may be improved. At the same time, compared to the folded structure, the rectangular structure of the driving beam 122 can effectively reduce the possibility of stress concentration of the driving beam 122, and improve the working reliability of the driving beam 122.

Figure 17T:
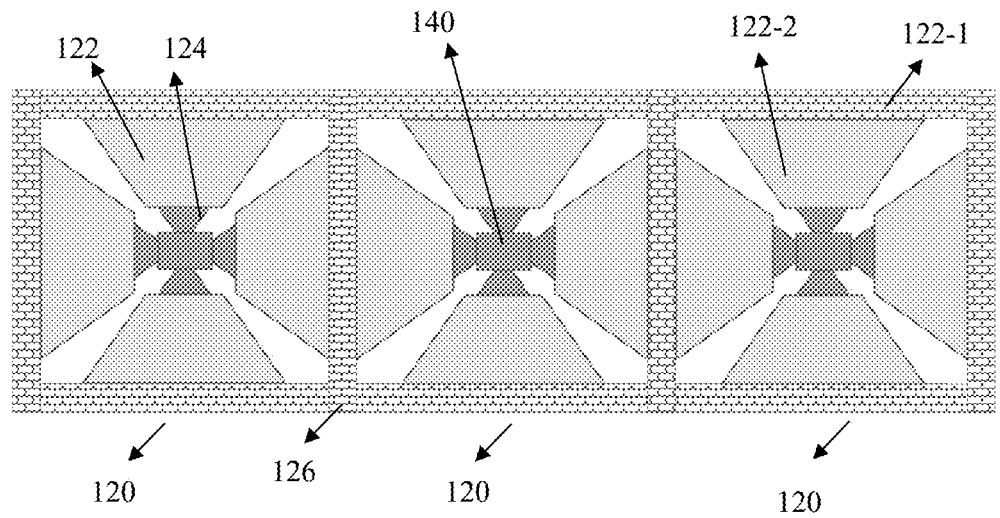
FIG. 17T is a schematic diagram illustrating another structure of a driving unit according to some embodiments of the present disclosure.

FIG. 17T is a schematic diagram illustrating another exemplary structure of a driving unit according to some embodiments of the present disclosure. Referring to FIG. 17T, in some embodiments, the loudspeaker 100 may include a plurality of (e.g., 2, 3, 4, or more) driving units 120, each of which may include a corresponding driving beam 122, a corresponding coupled elastic structure 124, and a corresponding vibration transmission unit 140, respectively. In some embodiments, the plurality of driving units 120 may be connected with each other, for example, the plurality of driving units 120 may be connected through a corresponding substrate 126 of each of the plurality of driving units 120. In some embodiments, at least one of the plurality of driving units 120 may also be set up individually and not connected with the other driving units 120. In some embodiments, the plurality of driving units 120 may be distributed in an arbitrary shape, such as a linear shape, a rectangular shape, a T-shaped shape, etc., which is not limited by the present disclosure. In some embodiments, the plurality of driving units 120 operate independently and do not affect each other. With the above setup, different driving units 120 may be individually designed so that the plurality of driving units 120 may have different resonance frequencies, and each of the plurality of driving units 120 may be individually excited, thereby realizing the adjustment of vibration modes of the loudspeaker 100 and improving the output performance of the loudspeaker 100.

In some embodiments, each of the plurality of driving beams 122 may be connected with the vibration transmission unit 140 through the coupled elastic structure 124, respectively.

In some embodiments, the driving beam 122 includes the piezoelectric structure 1221 and one or more reinforcement layers 1223 stacked in a vibration direction (i.e., a z-direction) of the vibration unit 130, with a reinforcement layer 1223 furthest away from the piezoelectric structure 1221 being connected with the coupled elastic structure 124.

Figure 18A:
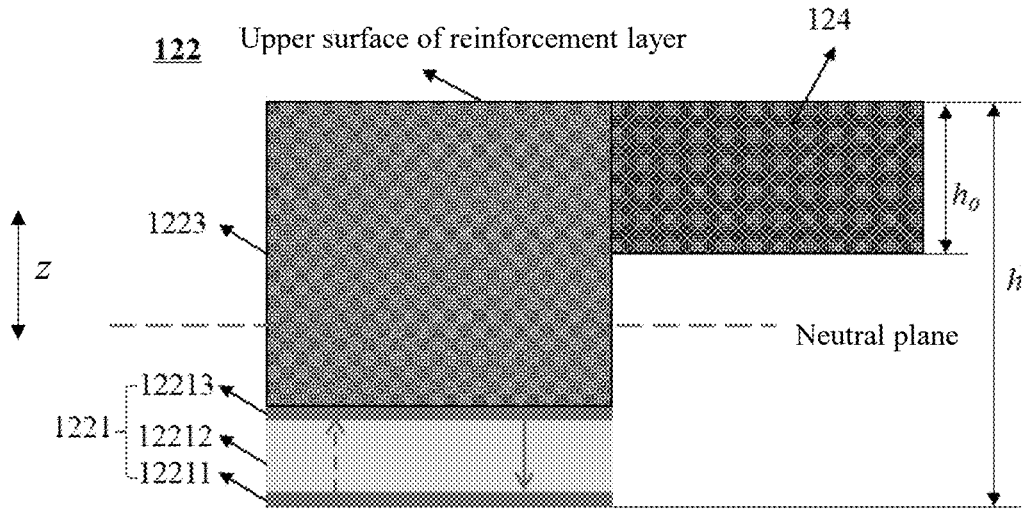
FIG. 18A and FIG. 18B are schematic diagrams illustrating internal structures of different driving units according to some embodiments of the present disclosure.
Figure 18B:
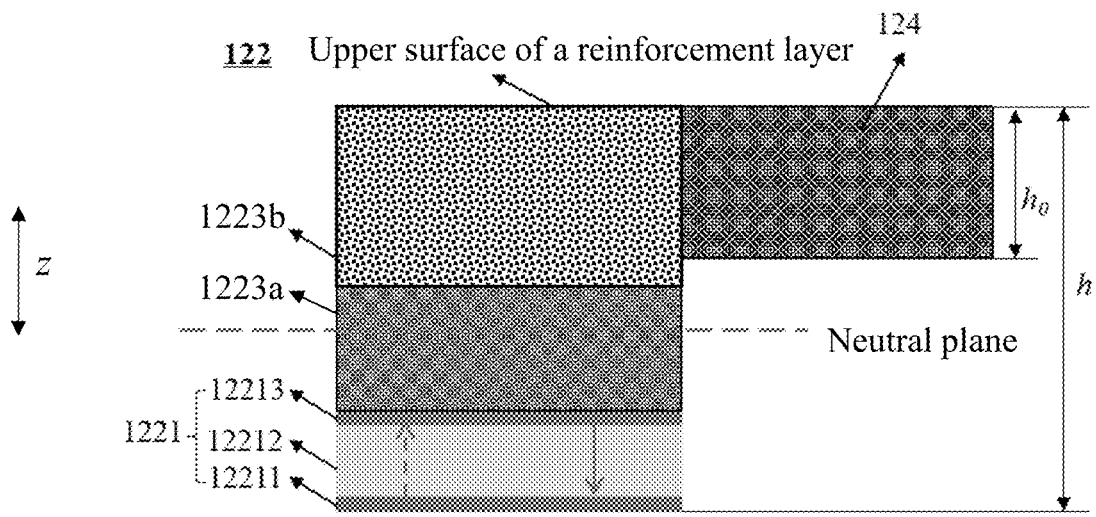

FIG. 18A and FIG. 18B are schematic diagrams illustrating exemplary internal structures of driving units with different structures according to some embodiments of the present disclosure.

Referring to FIG. 18A, in some embodiments, in a vibration direction of the vibration unit 130, the driving beam 122 includes the piezoelectric structure 1221 and the reinforcement layer 1223 which are interconnected with each other, the reinforcement layer 1223 being connected with the coupled elastic structure 124. The piezoelectric structure 1221 may cause the driving unit 120 to output vibration from the overhanging region 122-2 in response to an electrical signal. In a direction extending from the fixed region 122-1 to the overhanging region 122-2, the piezoelectric structure 1221 may partially or completely cover the overhanging region 122-2.

The piezoelectric structure 1221 may deform in response to a drive voltage, thereby generating vibration. In some embodiments, the piezoelectric structure 1221 may include two electrode layers (e.g., the first electrode layer 12211 and the second electrode layer 12213) and the piezoelectric layer 12212, with the two electrode layers disposed on opposite sides of the piezoelectric layer 12212 as shown in FIG. 18A. For more information about the structure of the driving beam 122, please refer to FIG. 11, FIG. 14A to FIG. 14E and related descriptions thereof, which will not be repeated here.

The driving beam 122 shown in FIG. 18B differs from the driving beam 122 shown in FIG. 18A in that the driving beam 122 shown in FIG. 18B includes two reinforcement layers (i.e., the first reinforcement layer 1223a and the second reinforcing layer 1223b), with the reinforcement layer 1223b furthest away from the piezoelectric structure 1221 being connected with the coupled elastic structure 124.

In some embodiments, a force and displacement generated by the piezoelectric layer 12212 are determined by a dimension of the driving beam 122 and a material of the piezoelectric layer 12212, and when the dimension of the driving beam 122 and the material of the piezoelectric layer 12212 are determined, the greater the distance of the piezoelectric layer 12212 from the neutral plane of the driving unit 120, the greater the deformation amount of the driving beam 122 (or the driving unit 120).

In some embodiments, a ratio of the thickness dimension of the coupled elastic structure 124 to the thickness dimension of the driving beam 122 in the vibration direction of the vibration unit 130 is in a range of 0.65 to 1.

In some embodiments, a parameter κ may be defined as a ratio of a thickness $h_0$ of the coupled elastic structure 124 and a thickness h of the driving beam 122 in the vibration direction (i.e., a z-direction) of the vibration unit 130, which is represented as follows:

$$\kappa = \frac{h_0}{h}. \quad (9)$$

If κ is small, the impedance of the coupled elastic structure 124 is small; and if κ is large, the impedance of the coupled elastic structure 124 is too large.

Figure 18C:
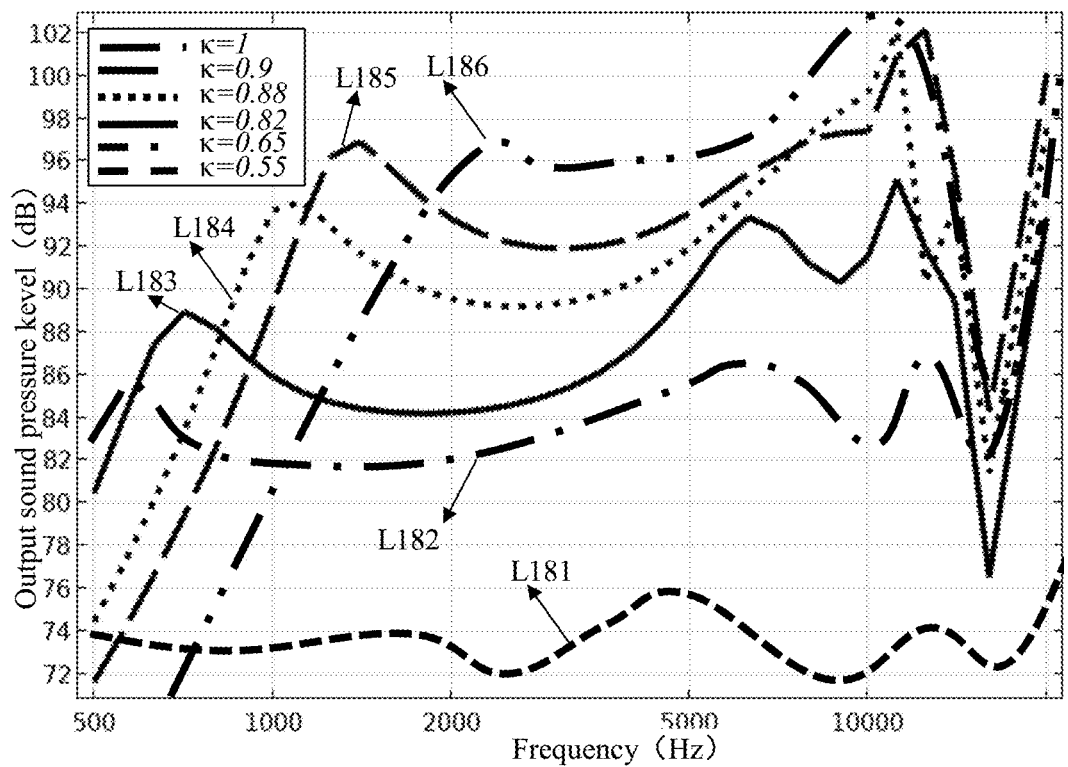
FIG. 18C is a schematic diagram illustrating frequency response curves of a loudspeaker corresponding to different values of κ according to some embodiments of the present disclosure.

FIG. 18C is a schematic diagram illustrating frequency response curves of a loudspeaker corresponding to different values of κ according to some embodiments of the present disclosure. As shown in FIG. 18C, a curve L181 represents a frequency response curve corresponding to the loudspeaker 100 when κ=0.55; a curve L182 represents the frequency response curve corresponding to the loudspeaker 100 when κ=0.65; a curve L183 represents a frequency response curve of the loudspeaker 100 when κ=0.82; a curve L184 represents a frequency response curve of the loudspeaker 100 when κ=0.88; a curve L185 represents a frequency response curve of the loudspeaker 100 when κ=0.9; and a curve L186 represents a frequency response curve of the loudspeaker 100 when κ=1.

As shown in FIG. 18C, as the value of κ is gradually increased from 0.55 to 1, a corresponding curve as a whole gradually shifts upward, and an output sound pressure level of the loudspeaker 100 in a frequency range between two resonance peaks gradually increases. When the parameter κ is too small, for example, when κ=0.55, compared to when κ=0.65, the output sound pressure level of the loudspeaker 100 is significantly lower in most of the frequency ranges, which is unfavorable for the application of the loudspeaker 100. When κ=1, although an increase in the frequency of a first resonance peak results in a decrease in an output sound pressure in a frequency range prior the first resonance peak, an increase in a sound pressure level (SPL) at the mid-to-high frequencies is advantageous for improving the sound effect in the mid-to-high frequency range. In some embodiments, the value of κ may be in a range of 0.65 to 1 so that the loudspeaker 100 may have a large output sound pressure level in a range of 500 Hz to 20 kHz. In some embodiments, the value of κ may be in a range of 0.82 to 1 so that the loudspeaker 100 may have a large output sound pressure level in a range of 800 Hz to 20 kHz with a flatter sound pressure curve. In some embodiments, the value of κ may be in a range of 0.88 to 1 so that the loudspeaker 100 may have a large output sound pressure level in a range of 1 kHz to 20 kHz with a flatter sound pressure curve. In some embodiments, the value of κ may be in a range of 0.9 to 1 so that the loudspeaker 100 may have a large output sound pressure level in a range of 1.5 kHz to 20 kHz with a flatter sound pressure curve.

In some embodiments, a stiffness of the coupled elastic structure 124 may be adjusted by changing a structure of the coupled elastic structure 124. For example, as shown in FIG. 10, in some embodiments, the coupled elastic structure 124 may include a strip structure, and the substrate 126, the driving beam 122, the coupled elastic structure 124, and the vibration transmission unit 140 may form a continuous piece-like structure, thereby efficiently transmitting the force and displacement of the driving beam 122 to the vibration unit 130.

In some embodiments, the coupled elastic structure 124 may be provided with a hollow structure to adjust the stiffness of the coupled elastic structure 124.

Figure 19A:
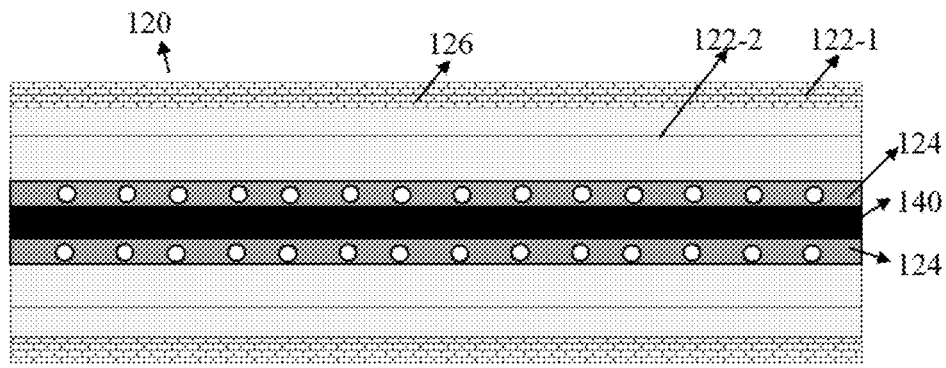
FIG. 19A and FIG. 19B are schematic diagrams illustrating different structures of a driving unit according to some embodiments of the present disclosure.

FIG. 19A and FIG. 19 B are schematic diagrams illustrating different structures of a driving unit according to some embodiments of the present disclosure. Referring to FIG. 19A, in some embodiments, compared to the driving unit 120 shown in FIG. 10, in the driving unit 120 shown in FIG. 19A, the coupled elastic structure 124 of a strip structure may be provided with a hollow structure. According to the design of the hollow structure, the stiffness of the coupled elastic structure 124 may be effectively adjusted, so as to realize the matching of an impedance of the coupled elastic structure 124 with an impedance of the driving beam 122 and an impedance of the vibration unit 130. In some embodiments, the hollow structure may include a circle (as shown in FIG. 19A), a triangle, a quadrilateral or other polygon, and other arbitrary shapes, which are not overly limited by the present disclosure.

In some embodiments, the coupled elastic structure 124 includes a bent structure to adjust the stiffness of the coupled elastic structure 124.

Figure 19B:
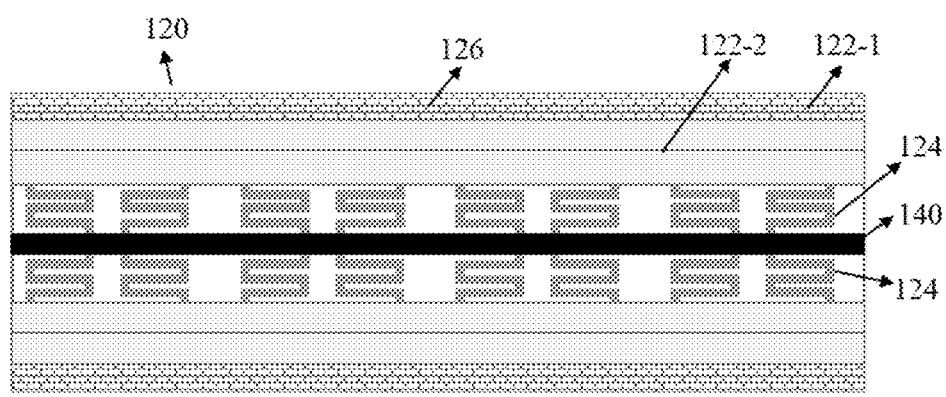

Referring to FIG. 19B, in some embodiments, the coupled elastic structure 124 may include a folded structure. In some embodiments, the coupled elastic structure 124 with the folded structure may include at least one bent structure. According to the design of the folded structure, the coupled elastic structure 124 may be made to have a larger flexibility in a smaller space, so that the impedance of the coupled elastic structure 124 may match with the impedance of the driving beam 122 and the impedance of the vibration unit 130 in a relatively large range.

In some embodiments, the loudspeaker 100 may not include the vibration transmission unit 140, at which point the driving unit 120 may be directly connected with the vibration unit 130. In some embodiments, each of the driving beams 122 is stacked in a different region of the vibration unit 130, respectively. For example, as shown in FIG. 1B, the driving unit 120 may include the driving beams 122, and the vibration unit 130 may include the diaphragm 131, and the diaphragm 131 may not include the center reinforcement member 132 shown in FIG. 1A. One end (an end proximate to the fixed region 122-1) of the driving beam 122 is fixedly connected with the casing 110, and the other end (an end proximate to the overhanging region 122-2) is disposed in an overhanging position. The diaphragm 131 may be directly covered on the driving beam 122, and the diaphragm 131 may vibrate in response to the vibration of the driving beam 122, thereby pushing the air inside the front cavity 111 and generating sound. In some embodiments, the diaphragm 131 may partially or completely cover the driving beam 122. For example, as shown in FIG. 1B, the diaphragm 131 may completely cover the driving beam 122 and form a vibration overhanging region 1314 at a gap position formed by the driving beam 122. As another example, to further reduce a load on the driving beam 122, the diaphragm 131 may cover only a region up to half of a length of the driving beam 122 proximate to a free end of the driving beam 122 (i.e., an end proximate to the overhanging region 122-2) and simultaneously cover the gap formed by the driving beam 122 to form the vibration overhanging region 1314 at the gap position.

Relative to the loudspeaker 100 shown in FIG. 1A, in the loudspeaker 100 shown in FIG. 1B, since there are no loads such as the vibration transmission unit 140, the center reinforcement member 132, etc., a greater proportion of the driving force may be used to push an air load to generate a sound signal under the same driving unit structure, thereby enhancing the output sound pressure level of the loudspeaker 100. Furthermore, by omitting structures such as the vibration transmission unit 140 and the center reinforcement member 132, etc., an overall thickness of the loudspeaker 100 can be significantly reduced, which is of great significance for a miniature loudspeaker.

Figure 20A:
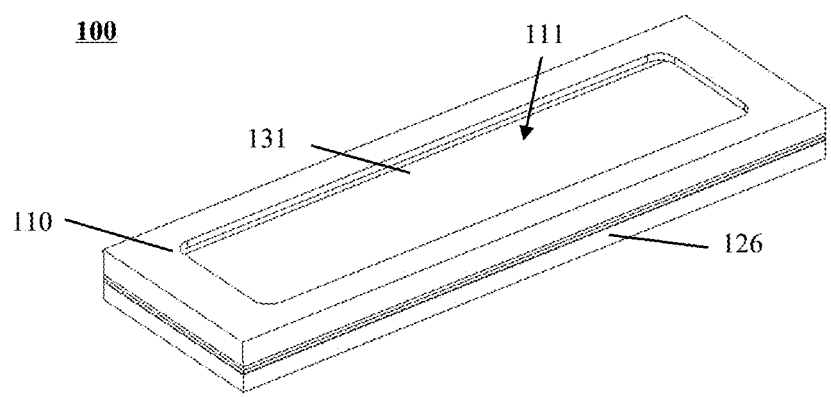
FIG. 20A is a schematic diagram illustrating a first view of the loudspeaker shown in FIG. 1B according to the present disclosure.
Figure 20B:
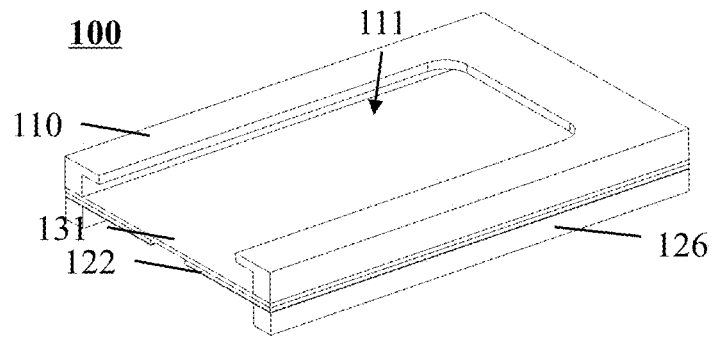
FIG. 20B is a diagram illustrating a cross-section of the loudspeaker shown in FIG. 20A according to the present disclosure.
Figure 20C:
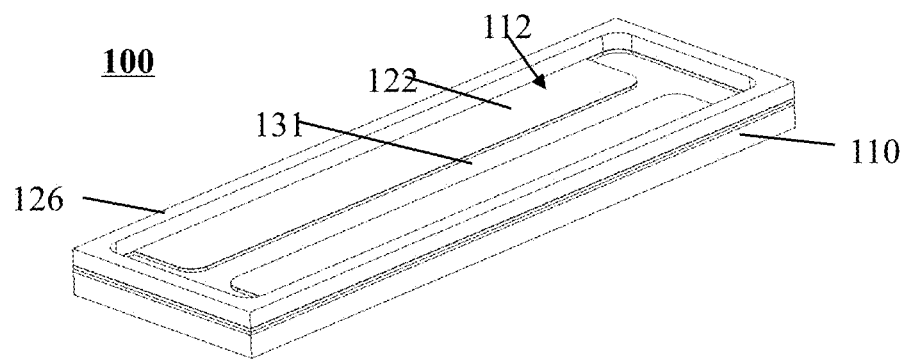
FIG. 20C is a schematic diagram illustrating a second view of the loudspeaker shown in FIG. 1B according to the present disclosure.
Figure 20D:
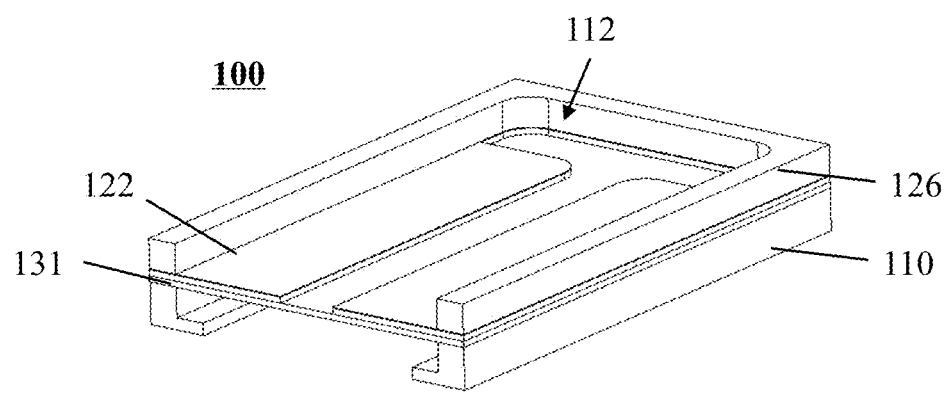
FIG. 20D is a schematic diagram illustrating a cross-section of the loudspeaker shown in FIG. 20C according to some embodiments of the present disclosure.

FIG. 20A is a schematic diagram illustrating a first view of the loudspeaker shown in FIG. 1B according to the present disclosure. FIG. 20B is a diagram illustrating a cross-section of the loudspeaker shown in FIG. 20A according to the present disclosure. FIG. 20C is a schematic diagram illustrating a second view of the loudspeaker shown in FIG. 1B according to the present disclosure. FIG. 20D is a schematic diagram illustrating a cross-section of the loudspeaker shown in FIG. 20C according to some embodiments of the present disclosure.

Referring to FIG. 1B and FIG. 20 A to FIG. 20D, the vibration unit 130 may be connected with the driving beam 122 and cover a gap formed by the driving beam 122 to separate an acoustic cavity into the front cavity 111 and the rear cavity 112 disposed at opposite sides of the vibration unit 130. The vibration unit 130 may be configured to receive deformation or a displacement of the driving beam 122 and to generate vibration transmitted outwardly. Due to the non-redundant structural design between the vibration unit 130 and the driving beam 122, the vibration unit 130 generates the vibration directly in response to the deformation or displacement of the driving beam 122, and thus on the basis of the same driving unit 120, compared to providing an additional vibration transmission unit between the driving beam 122 and the vibration unit 130, the loudspeaker 100 in this embodiment can use a larger proportion of a vibration driving force for generating a sound signal, so that an output sound pressure level can be improved, and at the same time, an overall thickness of the loudspeaker 100 can be significantly reduced, which is of great inspirational significance for the design and research and development of a micro loudspeaker.

In some embodiments, the vibration unit 130 may include the diaphragm 131, the diaphragm 131 being connected with the driving beam 122 and covering a vacant region between the driving beam 122 and the substrate 126 or the casing 110. The diaphragm 131 vibrates directly in response to the deformation or displacement of the driving beam 122, and may drive air within the acoustic cavity with a greater proportion of the vibrational driving force to produce fluctuation, i.e., an acoustic wave (the sound signal). The acoustic wave may be transmitted outwardly via a hole of the acoustic cavity that is in connection with an exterior (e.g., a sound outlet hole provided in the casing 110, or an open opening in the substrate 126, etc.). In some embodiments, the diaphragm 131 may be a thin film structure that is flexible. In some embodiments, a material of the diaphragm 131 may include, but is not limited to, one or more of polyimide (PI), polyethylene terephthalate (PET), polyethyleneimine (PEI), polyether ether ketone (PEEK), silicone, polycarbonate (PC), vinyl polymer (PVC), acrylonitrile-butadiene-styrene copolymer (ABS), polyethylene (PE), polyethylene-p-xylene (PPX), etc., or may be a multilayer composite material compounded from the above materials.

In some embodiments, as shown in FIG. 1B and FIG. 20A to FIG. 20D, a side of the diaphragm 131 proximate to the rear cavity 112 is connected with a side of the driving beam 122 proximate to the front cavity 111, at which time the diaphragm 131 pushes air inside the front cavity 111 to generate the acoustic wave, and the acoustic wave may be transmitted outwardly through a hole connecting the front cavity 111 with an exterior. In other embodiments, a side of the diaphragm 131 proximate to the front cavity 111 is connected with a side of the driving beam 122 proximate to the rear cavity 112, at which time the diaphragm 131 pushes air inside the rear cavity 112 to generate the acoustic wave, and the acoustic wave may be transmitted outwardly through a hole connecting the rear cavity 112 with the exterior. In some embodiments, as shown in FIG. 20A to FIG. 20D, the driving beam 122 is provided on a side of the diaphragm 131 disposed within the rear cavity 112, or the driving beam 122 is provided on a side of the diaphragm 131 disposed within the front cavity 111, the diaphragm 131 pushes the air inside the rear cavity 112 to generate the acoustic wave, and the acoustic wave may be transmitted outwardly through the hole connecting the rear cavity 112 with the exterior. In yet further embodiments, as shown in FIG. 1B and FIG. 20A to FIG. 20D, while the diaphragm 131 is connected with the driving beam 122, a periphery of the diaphragm 131 may be connected with an inner wall of the casing 110 or the substrate 126. In some embodiments, the diaphragm 131 may also be connected with the driving beam 122 by connecting its periphery with a side surface of the driving beam 122 proximate to a free end. In some embodiments, the diaphragms 131 are disposed on two sides of the driving beam 122 that are proximate to the front cavity 111 and the rear cavity 112, respectively, where the diaphragms 131 on the two sides may push the air in the front cavity 111 and the rear cavity 112, respectively, to generate the acoustic wave, and the acoustic wave may be transmitted outwardly through the holes of the front cavity 111 and the rear cavity 112 that are connected with the exterior, respectively.

Figure 20E:
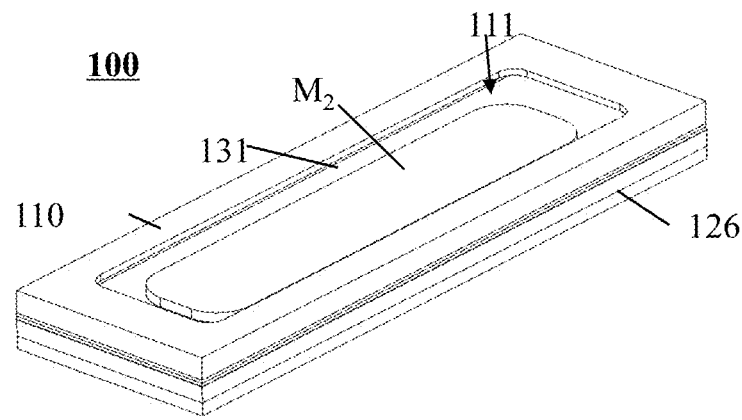
FIG. 20E is a schematic diagram illustrating an exemplary structure of a loudspeaker according to some embodiments of the present disclosure.
Figure 20F:
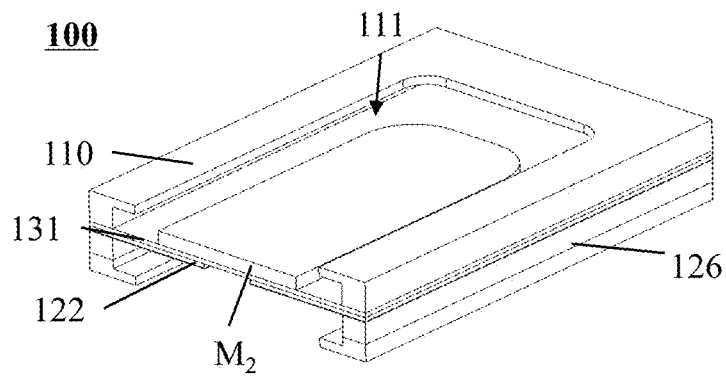
FIG. 20F is a schematic diagram illustrating a cross-section of the loudspeaker shown in FIG. 20E of the present disclosure.

FIG. 20E is a schematic diagram illustrating an exemplary structure of a loudspeaker according to some embodiments of the present disclosure. FIG. 20F is a schematic diagram illustrating a cross-section of the loudspeaker shown in FIG. 20E of the present disclosure.

The loudspeaker 100 shown in FIG. 20E to FIG. 20F is similar to the loudspeaker 100 shown in FIG. 1B and FIG. 20A to FIG. 20D, with a difference that the loudspeaker 100 shown in FIG. 20E to FIG. 20F includes the mass element $M_2$. As shown in FIG. 20E to FIG. 20F, the mass element $M_2$ is a rectangular-like structure, connected with a side of the diaphragm 131 proximate to the front cavity 111, and disposed in a center region of the diaphragm 131 so that when the diaphragm 131 carries the mass element $M_2$, a stress and a vibration state of the diaphragm 131 are balanced. In some embodiments, the mass element $M_2$ may also be disposed offset from the center region of the diaphragm 131. In some embodiments, the mass element $M_2$ is not connected with other components (e.g., the casing 110) to ensure flexibility and a vibrational displacement of the diaphragm 131.

Figure 20G:
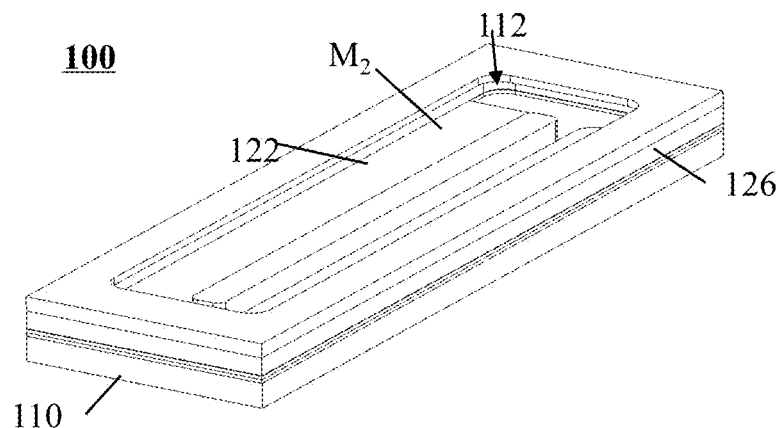
FIG. 20G is a schematic diagram illustrating an exemplary structure of a loudspeaker according to some embodiments of the present disclosure.
Figure 20H:
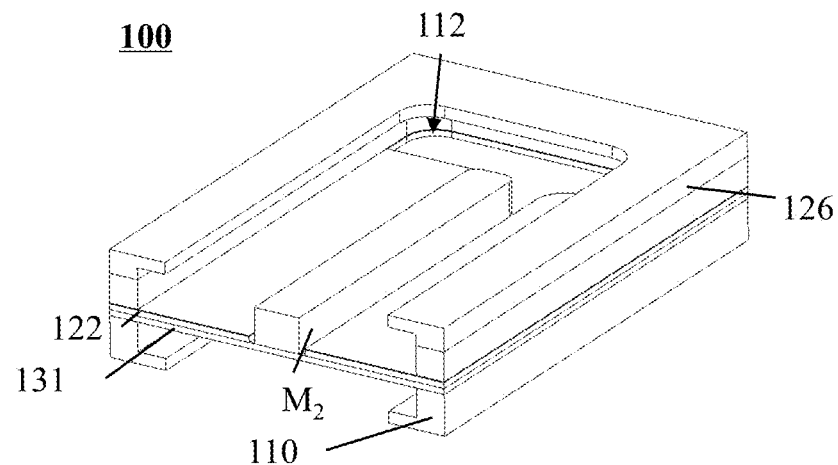
FIG. 20H is a schematic diagram illustrating a cross-section of the loudspeaker shown in FIG. 20G of the present disclosure.

FIG. 20G is a schematic diagram illustrating an exemplary structure of a loudspeaker according to some embodiments of the present disclosure. FIG. 20H is a schematic diagram illustrating a cross-section of the loudspeaker shown in FIG. 20G of the present disclosure.

The loudspeaker 100 shown in FIG. 20G to FIG. 20H is similar to the loudspeaker 100 shown in FIG. 20E to FIG. 20F, with a difference that the mass element $M_2$ in FIG. 20G to FIG. 20H is connected with a side of the diaphragm 131 proximate to the rear cavity 112. In some embodiments, the mass element $M_2$ is not connected with other components (e.g., the driving beam 122) to ensure the flexibility and the vibrational displacement of the diaphragm 131. In some embodiments, the side of the driving beam 122 proximate to the rear cavity 112 may also be provided with a second diaphragm 131, and the second diaphragm 131 is disposed in a manner similar to that of the diaphragm 131. For example, a side of the second diaphragm 131 proximate to the front cavity 111 is connected with the side of the driving beam 122 proximate to the rear cavity 112. Then a side of the mass element $M_2$ proximate to the front cavity 111 is connected with the diaphragm 131, and the side of the mass element $M_2$ proximate to the rear cavity 112 is connected with the second diaphragm 131, so that acoustic waves of the loudspeaker 100 may be output via the front cavity 111 and the rear cavity 112. In some embodiments, the second diaphragm 131 may also be provided within the rear cavity 112. For example, the second diaphragm 131 is connected with the casing 110 (or the substrate 126) by its periphery or edge region, at this time, the mass element $M_2$ is disposed projecting from the driving beam 122, the side of the mass element $M_2$ proximate to the front cavity 111 is connected with the diaphragm 131, and the side of the mass element $M_2$ proximate to the rear cavity 112 is connected with the second diaphragm 131.

Figure 20I:
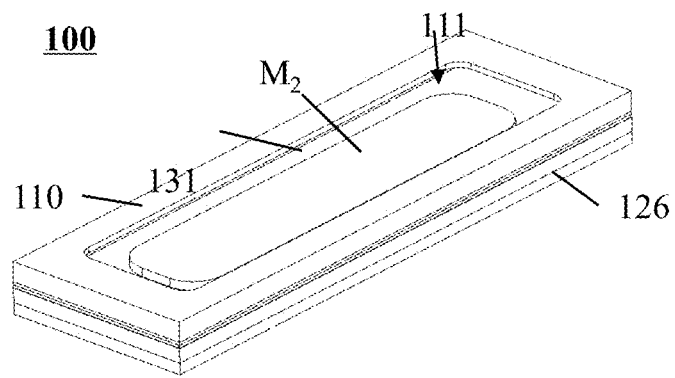
FIG. 20I is a schematic diagram illustrating an exemplary structure of a loudspeaker according to some more embodiments of the present disclosure.
Figure 20J:
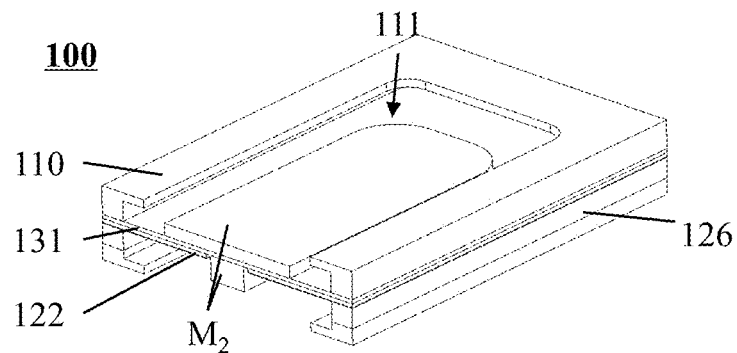
FIG. 20J is a schematic diagram illustrating a cross-section of the loudspeaker shown in FIG. 20I of the present disclosure.

FIG. 20I is a schematic diagram illustrating an exemplary structure of a loudspeaker according to some more embodiments of the present disclosure. FIG. 20J is a schematic diagram illustrating a cross-section of the loudspeaker shown in FIG. 20I of the present disclosure.

The loudspeaker 100 shown in FIG. 20 I to FIG. 20J is similar to the loudspeaker 100 shown in FIG. 20G to FIG. 20H, with a difference that the mass element $M_2$ in FIG. 20 I to FIG. 20J is connected with a side of the diaphragm 131 proximate to the front cavity 111 and a side of the diaphragm 131 proximate to the rear cavity 112, respectively. In some embodiments, when the diaphragm 131 is disposed on the side of the driving beam 122 proximate to the front cavity 111, the second diaphragm 131 may be set by connecting with the mass element $M_2$ disposed in the rear cavity 112; and when the diaphragm 131 is disposed on the side of the driving beam 122 proximate to the rear cavity 112, the second diaphragm 131 may be set by connecting with the mass element $M_2$ disposed in the front cavity 111. Further description of the driving beam 122, the mass element $M_2$, the diaphragm 131, or the like, can be found elsewhere in the present disclosure (e.g., the description in connection with FIG. 1A to FIG. 17K).

In some embodiments, the driving unit 120 includes two sets of driving beams 122 disposed on opposite sides of the casing 110, each set of the two sets of driving beams 122 includes one or more driving beams 122, and a shape of each of the driving beams 122 includes a rectangle, a trapezoid, or a rounded chamfered corner.

Figure 21A:
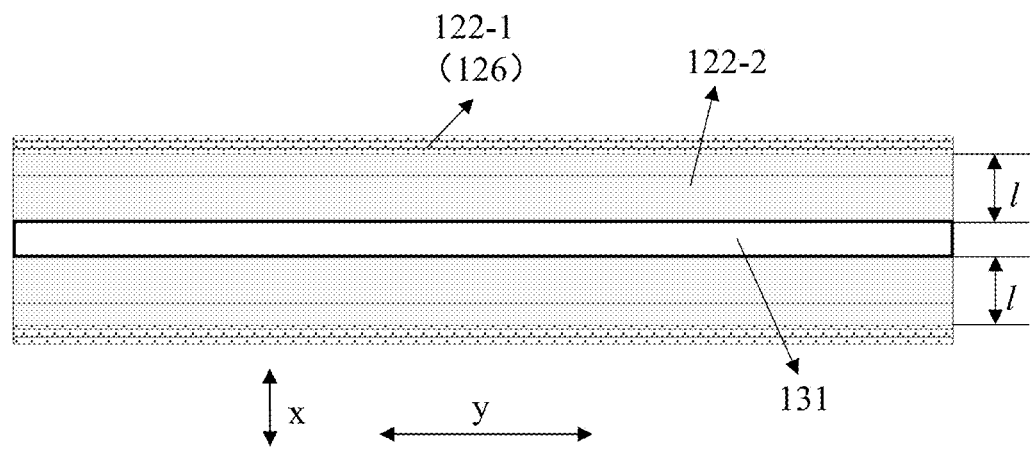
FIG. 21A is a schematic diagram illustrating a projection of a driving beam in a vibration direction of a vibration unit according to some embodiments of the present disclosure.

FIG. 21A is a schematic diagram illustrating a projection of a driving beam in a vibration direction of a vibration unit according to some embodiments of the present disclosure. The vibration direction of the vibration unit 130 refers to the z-direction in FIG. 10, FIG. 11, or the like.

In some embodiments, the driving beam 122 includes the fixed region 122-1 and the overhanging region 122-2, as shown in FIG. 21A.

In some embodiments, each set of the two sets of driving beams 122 includes one or more driving beams 122.

FIG. 21B to FIG. 21M schematic diagrams illustrating projections of a driving beam and a diaphragm in a vibration direction of a vibration unit according to some embodiments of the present disclosure.

Figure 21B:
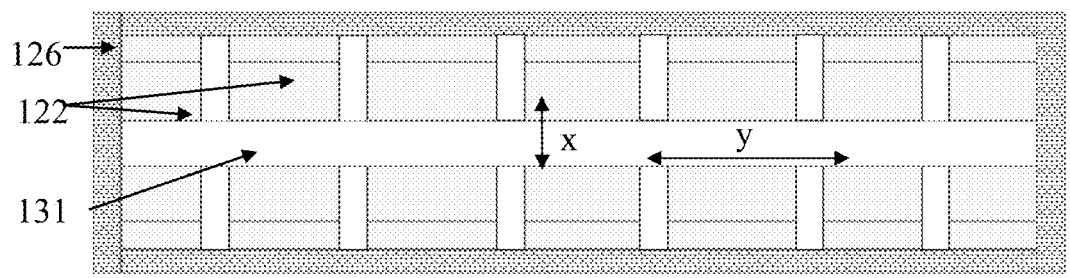
FIG. 21B to FIG. 21M schematic diagrams illustrating projections of a driving beam and a diaphragm in a vibration direction of a vibration unit according to some embodiments of the present disclosure.

As shown in FIG. 21B, a plurality of driving beams 122 are spaced apart on two sides of the substrate 126 extending in a y-direction, the plurality of driving beams 122 on two sides are provided in correspondence, a fixed end (an end proximate to the fixed region 122-1) of each of the plurality of driving beams 122 is connected with the substrate 126, and the diaphragm 131 covers each of the plurality of driving beams. In some embodiments, the plurality of driving beams are distributed in the y-direction with a width as the same as that of an acoustic cavity in the y-direction. In some embodiments, the plurality of driving beams 122 may be connected with each other by the coupled elastic structures 124 described above, or the plurality of driving beams 122 may be disposed independently. In some embodiments, resonance frequencies of the plurality of driving beams 122 are all the same, or at least one of the plurality of driving beams 122 has a different resonance frequency. In some embodiments, different resonance frequencies of the plurality of driving beams 122 may be realized by adjusting dimensions of the plurality of driving beams 122. For example, free ends (ends proximate to the overhanging region 122-2) of the plurality of driving beams 122 are not in a same straight line in the y-direction.

In some embodiments, the driving unit 120 further includes two sets of driving beams 122 located on another pair of opposite sides of the casing 110.

Figure 21C:
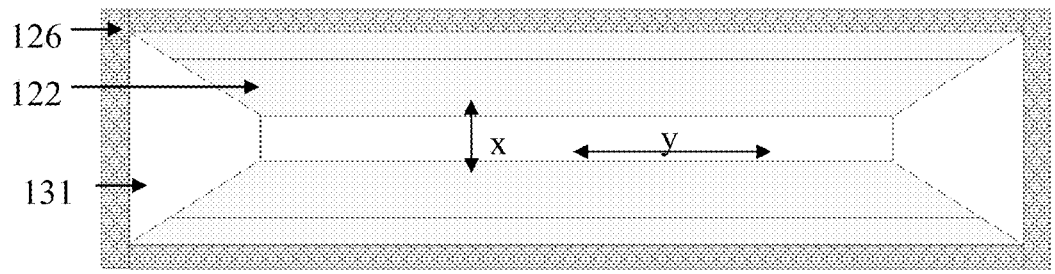

As shown in FIG. 21C, the two driving beams 122 disposed opposite each other in a x-direction are the same, the overhanging regions 122-2 of the driving beams 122 are both of a trapezoidal shape, long sides of the overhanging regions 122-2 in the y-direction are disposed close to the fixed region 122-1 of the driving beams 122, the diaphragm 131 covers the trapezoidal driving beams 122, and peripheral sides of the diaphragm 131 are connected and fixed to the substrate 126 (or the casing 110) of the loudspeaker 100. In some embodiments, in order to minimize the stress concentration on the driving beams 122, folded corners on each of the trapezoidal driving beams 122 located at its free end (the end proximate to the overhanging region 122-2) may be set as rounded corners (not shown in FIG. 21C).

Figure 21D:
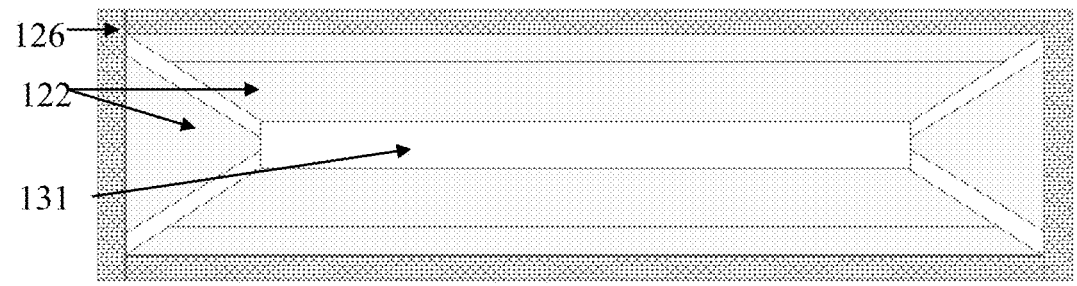

The driving beam 122 shown in FIG. 21D is similar to the driving beam 122 shown in FIG. 21C, with a difference that the driving beams are further disposed on two sides of the substrate 126 in the y-direction, and the driving beams 122 on two sides of the y-direction are defined as short-side driving beams 122, the short-side driving beams 122 may be triangular beams, and the driving beams 122 are disposed on all four sides of the substrate 126, and a balanced structure can reduce tilting and flipping modes of the loudspeaker 100. In some embodiments, the short-side driving beams 122 may be trapezoidal beams or other shaped beams. In some embodiments, the driving beams 122 on two sides of the x-direction are defined as long-side driving beams 122, and a driving force of the driving beams 122 may be adjusted by adjusting dimensions of the long-side driving beams 122 and the short-side driving beams 122 to increase an output sound pressure level of the loudspeaker 100. In some embodiments, it is also possible to adjust the dimensions of the long-side driving beam 122 and the short-side driving beam 122 so that their resonance frequencies are located in different frequency bands, i.e., the resonance frequencies of the long-side driving beam 122 and the short-side driving beam 122 are different, thereby realizing that the loudspeaker 100 has a plurality of resonance frequencies. In some embodiments, the long-side driving beams 122 or the short-side driving beams 122 may also be designed in dimension so that their resonance frequencies lie in different frequency bands, i.e., the resonance frequencies of the two long-side driving beams 122 or the two short-side driving beams 122 are different, enabling the loudspeaker 100 to generate more resonance peaks and enhance the sound pressure level output of the loudspeaker 100, which is also applicable to the driving beams 122 of other shapes and structures.

In some embodiments, the vibration unit 130 further includes the mass element $M_2$, with each set of driving beams 122 being connected with different regions of the mass element $M_2$.

Figure 21E:
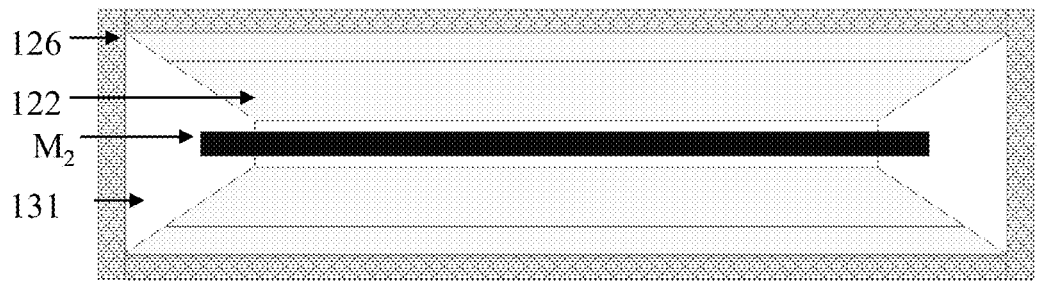

As shown in FIG. 21E, the driving beam 122 shown in FIG. 21E is similar to the driving beam 122 shown in FIG. 21D, with a difference that the loudspeaker 100 further includes the mass element $M_2$. The mass element $M_2$ is connected with a center region of the diaphragm 131 and is correspondingly disposed between two driving beams 122 that are disposed opposite each other in the x-direction.

Figure 21F:
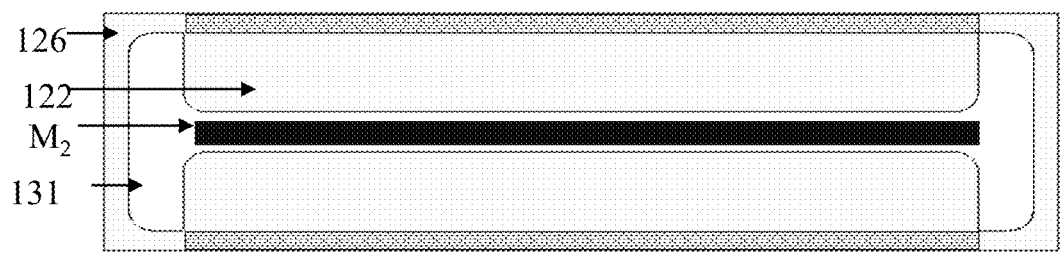

The driving beam 122 shown in FIG. 21F is similar to the driving beam 122 shown in FIG. 21E, with a difference that a folded corner on the driving beam 122 located at a free end thereof is a rounded corner, and compared to the driving beam 122 shown in FIG. 21D, the rounded corner of the free end can reduce a stress in a localized region of the driving beam 122 and improve the reliability. In some embodiments, a radius of the rounded corner does not exceed the length dimension/of the overhanging region 122-2 of the driving beam 122.

In some embodiments, the mass element $M_2$ includes a ring structure.

Figure 21G:
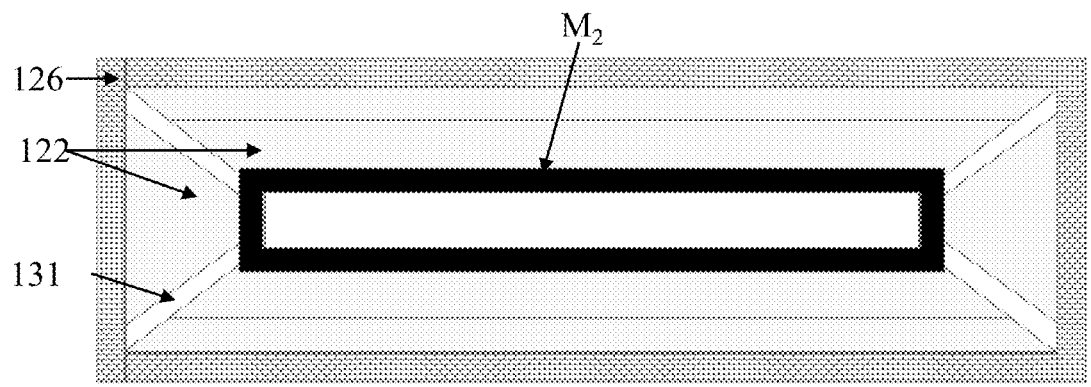

The driving beam 122 shown in FIG. 21G is similar to the driving beam 122 shown in FIG. 21D, with a difference that the loudspeaker 100 further includes the mass element $M_2$, and the mass element $M_2$ is a ring structure. The mass element $M_2$ of the ring structure is connected with the center region of the diaphragm 131 and is correspondingly disposed between the long-side driving beams 122 and the short-side driving beams 122. The mass element $M_2$ of the ring structure allows for a certain corresponding mass distribution of the driving beams 122 on all four sides of the substrate 126.

In some embodiments, the vibration unit 130 further includes a second driving beam 122E, which is indirectly connected with the casing 110.

In some embodiments, the vibration unit 130 further includes the mass element $M_2$, and the second driving beam 122E is connected with the mass element $M_2$.

Figure 21H:
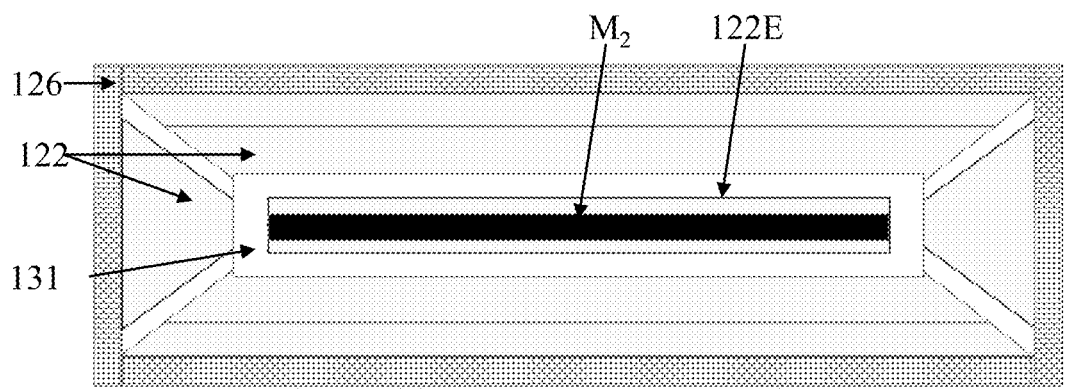

The driving beam 122 shown in FIG. 21H is similar to the driving beam 122 shown in FIG. 21D, with a difference that the loudspeaker 100 further includes the second driving beam 122E and the mass element $M_2$, with the mass element $M_2$ being connected with the center region of the diaphragm 131. In some embodiments, the second driving beam 122E is disposed within an acoustic cavity and may be connected with the substrate 126 of the loudspeaker 100, enabling the loudspeaker 100 to generate more resonance peaks and enhance a sound pressure level output. In some embodiments, the second driving beam 122E may be connected with the diaphragm 131. In some embodiments, the second driving beam 122E is connected with the center region of the diaphragm 131. In some embodiments, the mass element $M_2$ may be connected with the second driving beam 122E. In some embodiments, the second driving beam 122E and the mass element $M_2$ are connected with two opposite side surfaces of the diaphragm 131, respectively, and two side surfaces of the diaphragm 131 are disposed within the front cavity 111 and within the rear cavity 112, respectively.

Figure 21I:
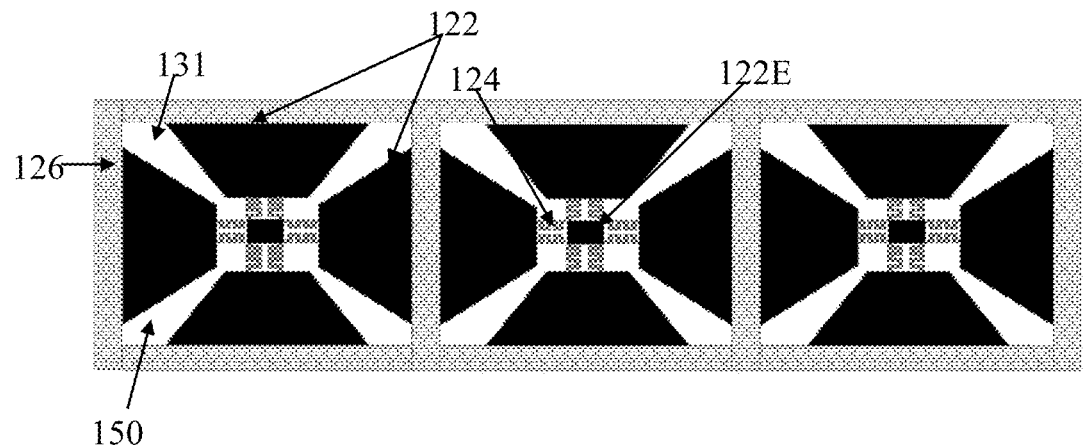

In some embodiments, the loudspeaker 100 may include a plurality of driving units 120. The plurality of driving units 120 may be disposed in parallel as shown in FIG. 21I, and each of the driving units 120 includes the substrate 126 and the driving beam 122, and a periphery of the substrate 126 is connected with the driving beam 122. The plurality of driving units 120 is not limited to the parallel arrangement shown in FIG. 21I, but may also be arranged in a regular or irregular manner such as an array, a diagonal line, a ring, a sector, or the like.

In some embodiments, as shown in FIG. 21I, the driving unit 120 further includes the second driving beam 122E, the second driving beam 122E is connected with the driving beams 122 around the substrate 126 via the coupled elastic structure 124, and the plurality of driving beams 122 and the second driving beam 122E may be provided to enable the loudspeaker 100 to generate more resonance peaks and enhance the sound pressure level output. More description of the coupled elastic structure 124 can be found in FIG. 7 to FIG. 10 and related descriptions thereof.

In some embodiments, two sets of driving beams 122 disposed opposite each other may extend in a staggered type.

Figure 21J:
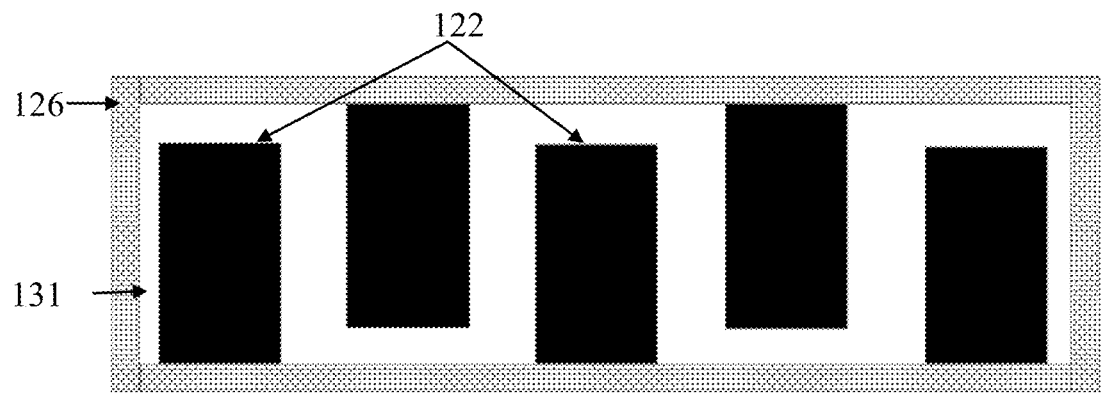

The driving beam 122 shown in FIG. 21J is similar to the driving beam 122 shown in FIG. 21B, with a difference that a plurality of driving beams 122 distributed on two sides of the substrate 126 in a y-direction are staggered, i.e., a free end (one end proximate to the overhanging region 122-2) of each of the driving beams 122 extend toward an opposite side of the substrate 126. According to such a setting, a length of the loudspeaker 100 may be adjusted in a larger range to adjust a length dimension of the driving beam 122, so as to adjust a resonance frequency of the loudspeaker 100 over a wider range. Additionally, a structure of each of the plurality of driving beams 122 may be individually designed to achieve a different resonance frequency, and adjustment of the modal state of the diaphragm 131 of the loudspeaker 100 may be achieved by individually exciting each of the plurality of driving beams 122. The mechanism of individually exciting each of the plurality of driving beams 122 may also be applicable to other embodiments that include a plurality of independent driving beams 122, for example, embodiments shown in FIG. 21B, FIG. 21D, or the like.

In some embodiments, each set of driving beams 122 may include a driving beam 122 with a bent structure.

Figure 21K:
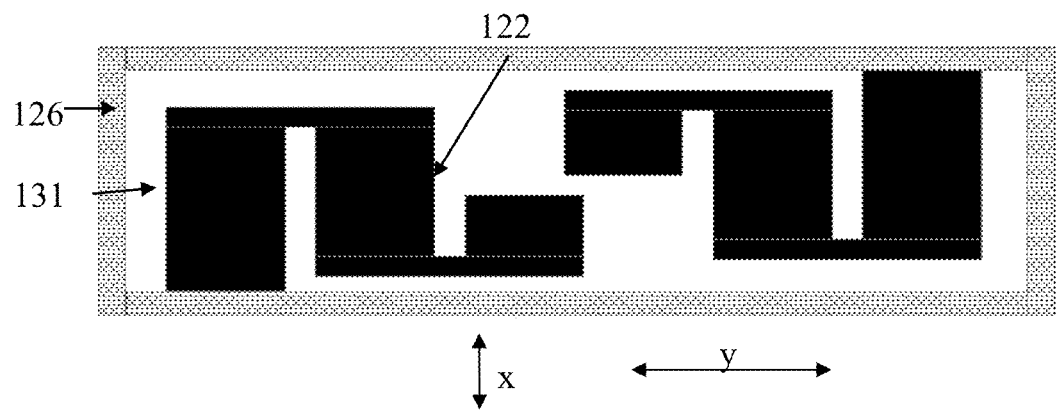

As shown in FIG. 21K, two driving beams 122 are provided on two sides of the substrate 126 in the y-direction, the driving beams 122 include a plurality of bending structures, the fixed end of each of the driving beams 122 (one end proximate to the fixed region 122-1) is connected with the long side of the substrate 126 and is disposed proximate to the short side (which extends in the x-direction) of the substrate 126, and the free end of each of the driving beams 122 (one end proximate to the overhanging region 122-2) extends in the y-direction. The free ends of the two driving beams 122 are close to each other, a length of each of the driving beams 122 in the x-direction is slightly smaller than a length of an acoustic cavity in the x-direction, and the diaphragm 131 covers the two driving beams 122. Such a design can increase the length of the driving beam 122 within the acoustic cavity with a limited dimension. In some embodiments, separate voltage excitations may be applied to different zones on the driving beam 122 to adjust modes of different regions on the diaphragm 131.

Figure 21L:
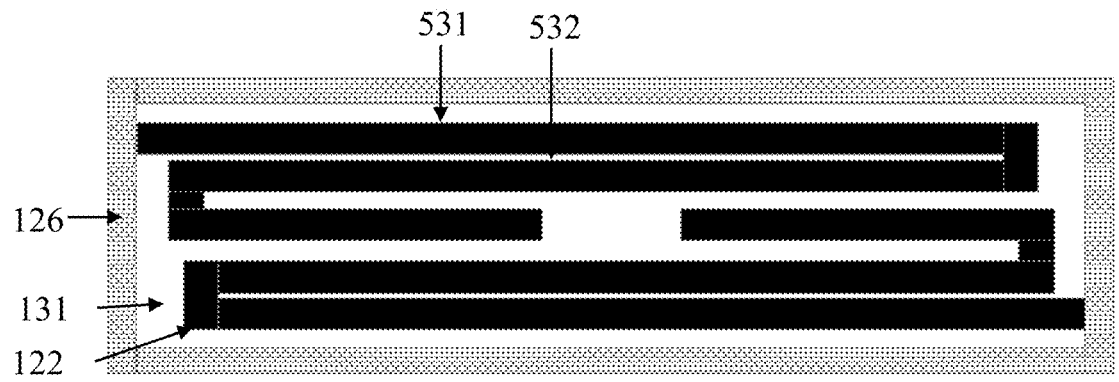

As shown in FIG. 21L, two driving beams 122 are disposed on two sides of the substrate 126 in the x-direction, the driving beams 122 include a plurality of bending structures, fixed ends of the driving beams 122 are connected with short sides of the substrate 126 and are disposed close to long sides of the substrate 126, free ends of the driving beams 122 extend in the x-direction, and the free ends of the two driving beams 122 are close to each other. A width of each of the driving beams 122 in the y-direction is slightly smaller than a width of an acoustic cavity in the y-direction, and the diaphragm 131 covers the two driving beams 122. Such a design enables the effective increase of a vibrational displacement of the driving beam 122, thereby effectively increasing a vibrational amplitude of the vibration diagram 131 and improving an output sound pressure level. Specifically, taking a first beam 531 and a second beam 532 of one of the driving beams 122 as an example, the first beam 531 is connected with the substrate 126, the first beam 531 and the second beam 532 are both disposed in the y-direction and connected by another beam.

In some embodiments, different driving beams 122 may be connected with each other by the coupled elastic structures 124.

Figure 21M:
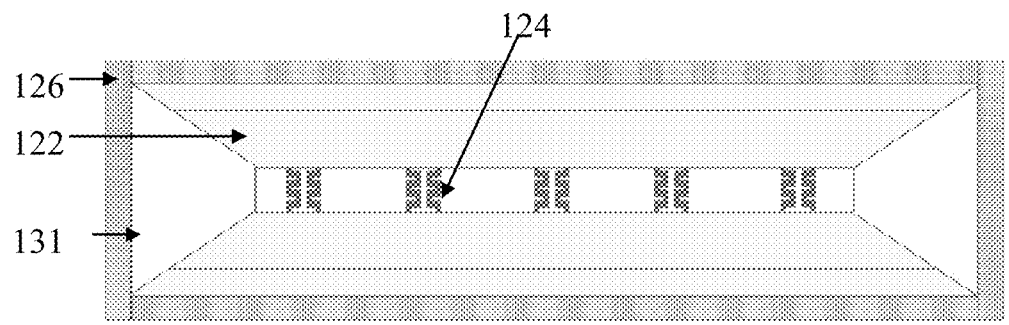

The driving beams 122 shown in FIG. 21M are similar to the driving beams 122 shown in FIG. 21C, with a difference that two driving beams 122 disposed opposite each other in the x-direction are elastically connected with each other by the coupled elastic structures 124. In some embodiments, the two driving beams 122 may be elastically connected with each other by one or more coupled elastic structures 124. In some embodiments, a plurality of coupled elastic structures 124 between the two driving beams 122 may be evenly spaced apart. In some embodiments, the coupled elastic structure 124 may be in a regular shape such as a folded shape, a rectangular shape, a trapezoidal shape, other polygons, etc., and an irregular shape. In some embodiments, a thickness of the coupled elastic structure 124 in the z-direction (i.e., a vibration direction of the vibration unit 130) may be equal to a total thickness of layers of the driving beam 122. In some embodiments, a material and a material distribution of the coupled elastic structure 124 are consistent with that of the layers of the driving beam 122. In some embodiments, the thickness of the coupled elastic structure 124 may also be a thickness of at least one layer of the driving beam 122. In some embodiments, the material and material distribution of the coupled elastic structure 124 may also be consistent with that of the at least one layer of the driving beam 122. In some embodiments, the thickness of the coupled elastic structure 124 may be inconsistent with the total thickness of the driving beam 122. In some embodiments, the material of the coupled elastic structure 124 may be a material with a certain elasticity other than the material of the layers of the driving beam 122.

In some embodiments, the vibration unit 130 includes a suspension region that is not covered by the driving beam 122. In a direction extending from the fixed region 122-1 to the overhanging region 122-2, the overhanging region 122-2 has a length dimension, a sum of a length of the driving beam 122 and half of a length of the suspension region is defined as a first parameter, and a ratio of the length dimension of the overhanging region 122-2 to the first parameter is in a range of 0.7 to 1.

Figure 22:
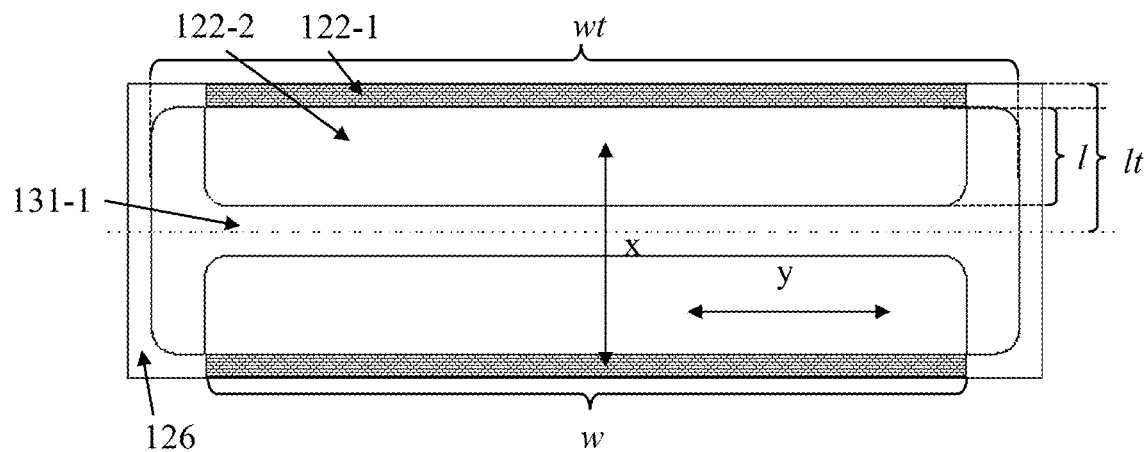
FIG. 22 is a diagram illustrating a projection of a driving beam and a diaphragm in a z-direction according to some other embodiments of the present disclosure.

FIG. 22 is a diagram illustrating a projection of a driving beam and a diaphragm in a z-direction according to some other embodiments of the present disclosure.

As shown in FIG. 22, an edge region of the driving beam 122 in a length-direction (i.e., the x-direction) near its periphery is the fixed region 122-1 connected with the casing 110 (or the substrate 126), a region of the driving beam 122 that overhangs within the acoustic cavity is the overhanging region 122-2, and a region between the overhanging region 122-2 and the casing 110 (or the substrate 126) is a vacant region. Movement of the overhanging region 122-2 of the driving beam 122 provides a driving force for the loudspeaker 100. In some embodiments, a long side of the driving beam 122 is a fixed side, and a short side is an overhanging side, and the long side of the driving beam 122 extends in a width-direction (i.e., the y-direction referring to FIG. 22) of the driving beam 122 and the short side extends in the length-direction (referring to FIG. 22) of the driving beam 122.

In some embodiments, continuing to FIG. 22, a portion of a vibration region of the diaphragm 131 is covered by the driving beam 122 and the other portion is not covered by the driving beam 122, the portion of the vibration region of the diaphragm 131 that is not covered by the driving beam 122 is defined as a suspension region 131-1, and a size of the suspension region 131-1 is capable of affecting a vibration mode of the diaphragm 131. In the x-direction, a sum of a length of the driving beam 122 and half of a length of the suspension region 131-1 is defined as a first parameter lt. Since two driving beams 122 spaced apart in the x-direction of the loudspeaker 100 are symmetrically disposed, in FIG. 22, the parameter lt is labeled as a distance between a long side of the driving beam 122 proximate to the fixed region 122-1 and a symmetrical line of the loudspeaker 100 parallel to the y-direction, and a relationship between the length l of the overhanging region 122-2 of the driving beam 122 and lt determines a proportion of a length dimension of the diaphragm 131. A width of the suspension region 131-1 of the diaphragm 131 in the y-direction is defined as wt, and a relationship between a width w of the driving beam 122 and wt determines a proportion of a width dimension of the suspension region 131-1 of the diaphragm 131. When the proportion of the length dimension and/or the width dimension of the suspension region 131-1 of the diaphragm 131 is larger, e.g., a ratio of l to lt and/or a ratio of w to wt is smaller, the suspension region 131-1 of the diaphragm 131 1 is larger, which in turn causes the suspension region 131-1 to generate a localized mode at lower frequencies, which are inconsistent with a mode of the driving beam 122, or even results in a mode in an opposite direction, causing the sound frequency response to having more peaks and valleys with a lower output sound pressure level. When the proportion of the length dimension and/or the width dimension of the suspension region 131-1 of the diaphragm 131 is larger, e.g., the ratio of l to lt and/or the ratio of w to wt is larger, the diaphragm 131 covers a larger region of the driving beam 122, causing the stiffness of the driving beam 122 and the resonance frequency to be decreased, which in turn causes the output of the loudspeaker 100 at the mid-to-high frequencies to be poorer. Therefore, the relationship between l and lt and the relationship between w and wt should be reasonably designed.

In some embodiments, a physical quantity μ may be defined as:

$$\mu = \frac{l}{l_t}. \quad (10)$$

Figure 23:
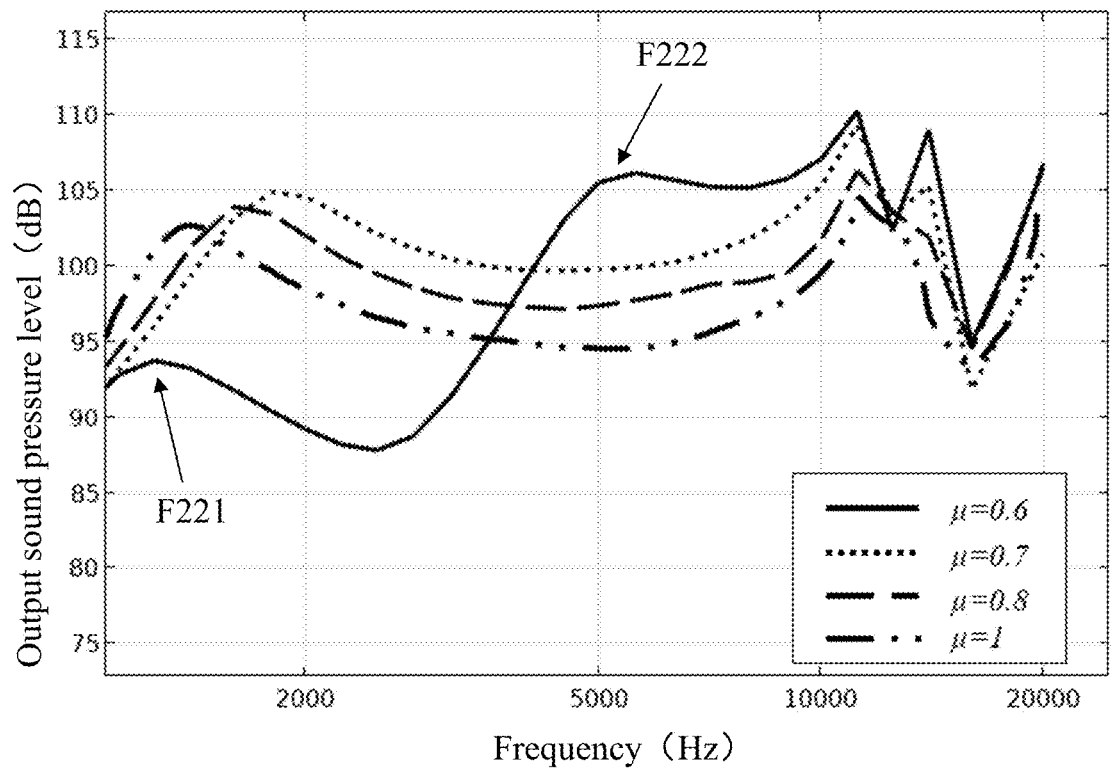
FIG. 23 is a diagram illustrating frequency response curves of a loudspeaker corresponding to different values of μ according to some embodiments of the present disclosure.

FIG. 23 is a diagram illustrating frequency response curves of a loudspeaker corresponding to different values of μ according to some embodiments of the present disclosure.

As shown in FIG. 23, when μ=0.6, a length dimension of the suspension region 131-1 accounts for a larger proportion, a localized resonance of the suspension region 131-1 is formed at lower frequencies (e.g., a frequency less than 1 kHz) to generate a first resonance peak F221 of the frequency response curve, at which time the length dimension l of the overhanging region 122-2 is smaller, and thus the stiffness of the driving beam 122 is larger, a second resonance peak F222 of the frequency response curve is generated at higher frequencies, so there are two resonance peaks at low-to-mid frequencies (e.g., a frequency range of less than 6 kHz), affecting a flatness of the frequency response curve of the loudspeaker 100. At the same time, due to the formation of the localized resonance of the suspension region 131-1 at the lower frequencies, issues such as the reversal of the vibration direction and the inconsistency of higher-order modes with the modes of the driving beam 122 occur after its resonance frequency. There may even occur modes in the opposite direction to the modes of the driving beam 122, resulting in a significant reduction in the sound pressure level output.

Figure 24:
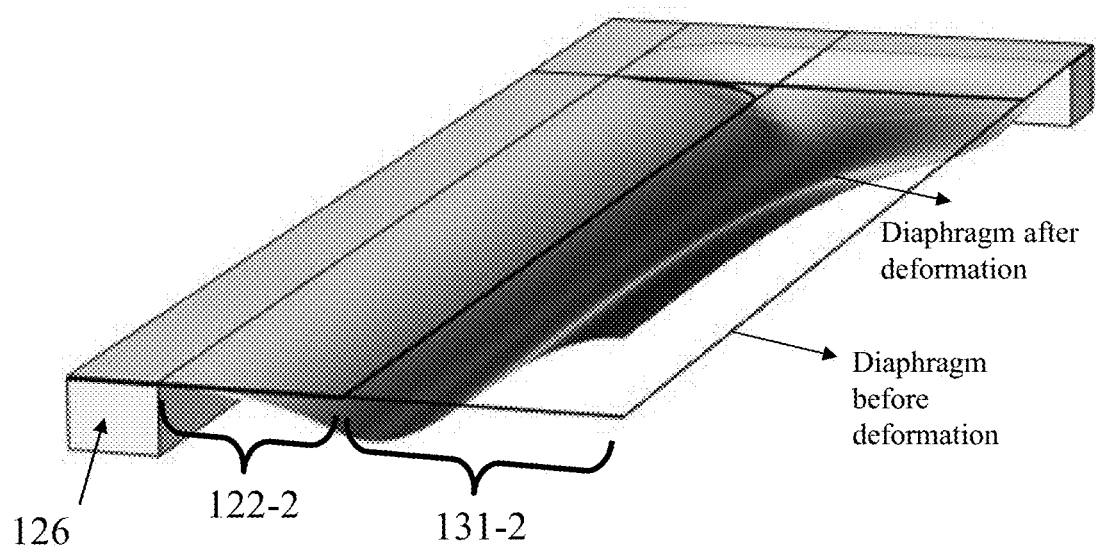
FIG. 24 is a vibration deformation contour diagram of a quarter portion of a driving beam and a diaphragm divided by symmetrical lines in an x-direction and a y-direction when $\mu=0.6$ according to some embodiments of the present disclosure.

FIG. 24 is a vibration deformation contour diagram of a quarter portion of a driving beam and a diaphragm divided by symmetrical lines in an x-direction and a y-direction when $\mu=0.6$ according to some embodiments of the present disclosure. As shown in FIG. 24, when a length dimension of the suspension region 131-1 accounts for a larger portion, the suspension region 131-1 generates a localized mode at lower frequencies, which is manifested as a mode inconsistent with a mode of the driving beam 122, and also manifested as a mode opposite with the mode of the driving beam 122. A region 131-2 refers to a vibration region of the diaphragm 131.

With the increase of $\mu$, for example, when $\mu=0.8$, the length dimension l of the overhanging region 122-2 is increased, and the length dimension of the suspension region 131-1 is reduced, so that it is not easy to have a localized resonance of the suspension region 131-1 at the lower frequencies, the localized mode of the suspension region 131-1 may follow a mode of the overhanging region 122-2 over a wider frequency band of low-to-mid frequencies, thus presenting a consistent movement direction, which in turn makes the loudspeaker 100 obtain a relatively flat frequency response curve over the wider frequency band of low-to-mid frequencies. Further increasing $\mu$, for example, when $\mu=1$, at which time the length direction of the overhanging region 122-2 is completely covered, i.e., the length dimension of the suspension region 131-1 is 0. Due to a larger dimension of the driving beam 122, a stiffness of the driving beam 122 is reduced and a resonance frequency is lower, which in turn makes the performance of the loudspeaker 100 at mid-to-high frequencies poorer, compared to when $\mu$ is in a range of 0.7 to 0.8, the performance of the loudspeaker 100 at middle frequencies is significantly lower.

Therefore, a frequency response flatness and the output sound pressure level of the loudspeaker 100 may be adjusted by adjusting a ratio relationship between the length dimension l of the overhanging region 122-2 and the first parameter lt. In some embodiments, the value of $\mu$ may be in a range of 0.7 to 1. In some embodiments, the value of $\mu$ may be in a range of 0.75 to 1. In some embodiments, the value of $\mu$ may be in a range of 0.7 to 0.95, allowing the loudspeaker 100 to have a certain sound pressure level output with a relatively flat frequency response curve over a wider frequency band, so as to enhance the sound quality performance of the loudspeaker 100.

In some embodiments, the sound quality performance of the loudspeaker 100 may also be adjusted by reasonably designing a ratio relationship between the width w of the driving beam 122 and the width wt of the suspension region 131-1. For example, when $\mu=0.6$, the ratio relationship between w and wt is designed. In some embodiments, in a direction perpendicular to a direction extending from the fixed region 122-1 to the overhanging region 122-2 (i.e., the y-direction in FIG. 22), a ratio of the width dimension w of the overhanging region 122-2 to a width dimension wt of the suspension region 131-1 is in a range of 0.5 to 0.95.

In some embodiments, a physical quantity $\delta$ is defined as:

$$\delta = \frac{w}{w_t}. \tag{11}$$

Figure 25:
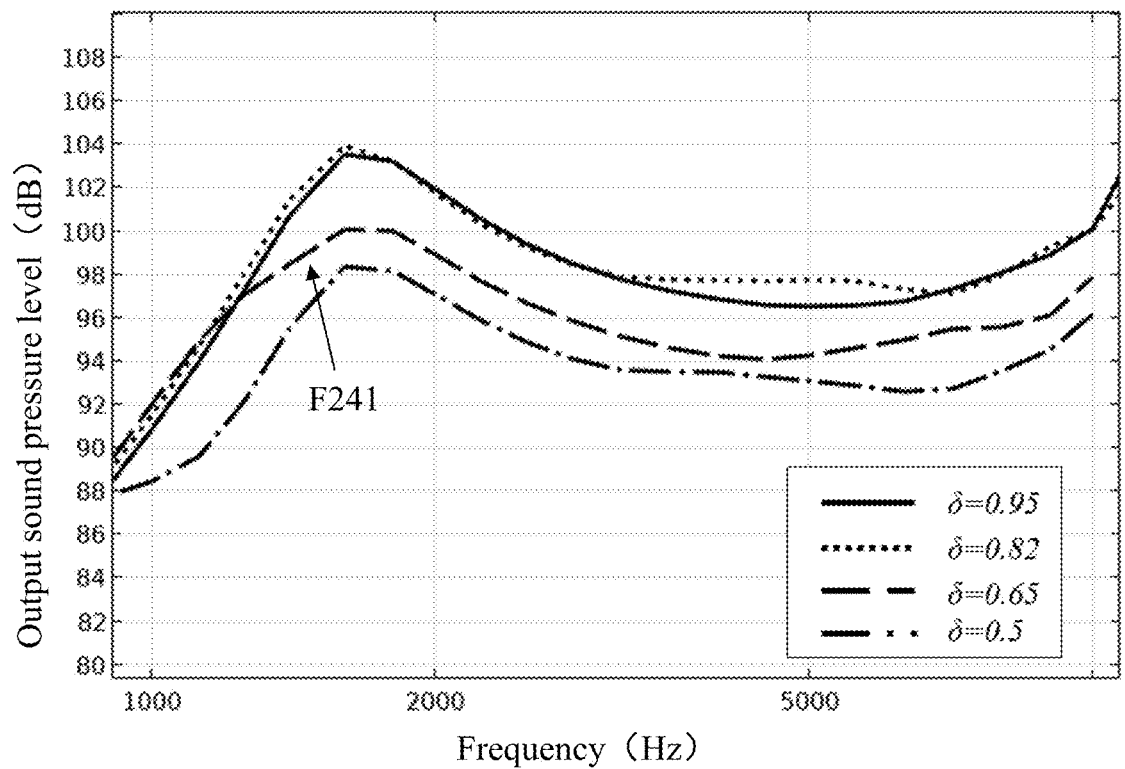
FIG. 25 is a diagram illustrating the frequency response curves of a loudspeaker corresponding to different values of δ according to some embodiments of the present disclosure.

FIG. 25 is a diagram illustrating frequency response curves of a loudspeaker corresponding to different values of $\delta$ according to some embodiments of the present disclosure.

Figure 26:
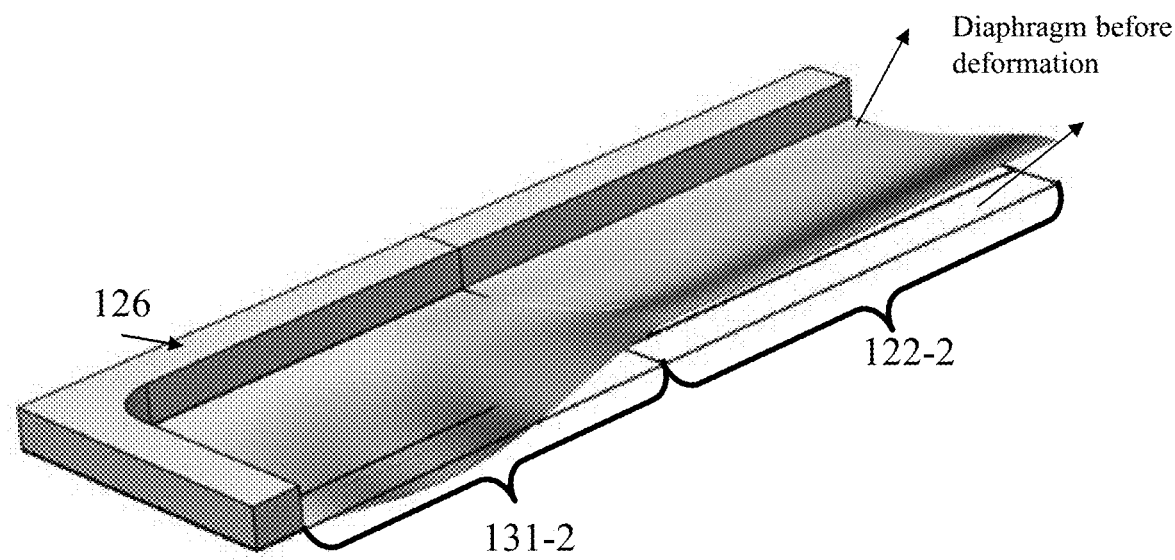
FIG. 26 is a vibration deformation contour diagram of a quarter portion of a driving beam and a diaphragm divided by symmetrical lines in an x-direction and y-direction when $\delta=0.5$ according to some embodiments of the present disclosure.

As shown in FIG. 25, when $\delta=0.5$, a width dimension of the suspension region 131-1 accounts for a relatively large proportion of the suspension region 131-1, a localized resonance of the suspension region 131-1 at lower frequencies (e.g., a frequency less than 1 kHz) is formed, and a first resonance peak F241 of a frequency response curve is generated. Since a resonance frequency of the driving beam 122 mainly depends on the thickness, material, and length of the driving beam 122, the position of a second resonance peak is basically unchanged as compared to that of the frequency response curve shown in FIG. 23 when $\mu=0.6$. But due to the presence of the first resonance peak F241, there are two resonance peaks at the low-to-mid frequencies, which affects the flatness of the frequency response curve of the loudspeaker 100. At the same time, due to the formation of localized resonance in the suspension region 131-1 at lower frequencies, issues such as the reversal of the vibration direction and the inconsistency of higher-order modes with the modes of the driving beam 122 occur after its resonance frequency. There may even occur modes in the opposite direction to the modes of the driving beam 122, resulting in a significant reduction in the sound pressure level output. FIG. 26 is a vibration deformation contour diagram of a quarter portion of a driving beam and a diaphragm divided by symmetrical lines in an x-direction and y-direction when $\delta=0.5$ according to some embodiments of the present disclosure. As shown in FIG. 26, when a width dimension of the suspension region 131-1 accounts for a larger proportion of a width dimension of the suspension region 131-1, the suspension region 131-1 generates a localized mode at lower frequencies, which is manifested as a mode inconsistent with a mode of the driving beam 122, and also manifested as a mode opposite to the mode of the driving beam 122.

With the increase of $\delta$, for example, when $\delta=0.65$, the width dimension of the overhanging region 122-2 increases, and the proportion of the width dimension of the suspension region 131-1 decreases, so that the localized resonance of the suspension region 131-1 is not easy to occur at the lower frequencies, and a localized mode of the suspension region 131-1 may follow a mode of the overhanging region 122-2 over a wider frequency band of low-to-mid frequencies, thus making the loudspeaker 100 present a consistent movement direction over the wider frequency band of low-to-mid frequencies, which in turn makes the loudspeaker 100 obtain a relatively flat frequency response curve in the low-to-mid frequencies. With an increase in the width w of the driving beam 122, movement of the driving beam 122 provides a driving force, which causes the loudspeaker 100 to increase the output sound pressure level over the wider frequency band, and thus the width w of the driving beam 122 may preferably be a larger value. By further increasing $\delta$, for example, when δ=0.95, the width w of the driving beam 122 may result in a width-direction area of the suspension region 131-1 too small, which results in a larger localized stiffness and a larger resonance frequency of the loudspeaker 100, reducing the resonance frequency of the loudspeaker 100, so the width w of the driving beam 122 may not be too large.

Therefore, the ratio relationship between the width w of the driving beam 122 and the width wt of the suspension region 131-1 may be adjusted to adjust a frequency response flatness and the output sound pressure level of the loudspeaker 100. In some embodiments, the value of δ may be in a range of 0.5 to 0.95. In some embodiments, the value of δ may be in a range of 0.65 to 0.95, so that the loudspeaker 100 has a certain sound pressure level output over a wider frequency band, and the frequency response curve is relatively flat over the wider frequency band, so that the sound quality performance of the loudspeaker 100 is enhanced.

In some embodiments, the overhanging region 122-2 of each of the driving beams 122 of the loudspeaker 100 includes an electrode-covered region.

In some embodiments, the overhanging region 122-2 of each of the driving beams 122 of the loudspeaker 100 includes a non-electrode-covered region, with at least a portion of the non-electrode-covered region being disposed at an end on the driving beams 122 away from the fixed region 122-1.

An electrode in the driving beam 122 is configured to transmit an electrical signal (e.g., apply a voltage) to the driving beam 122. In some embodiments, when the driving unit 120 is in drive-connection with the vibration unit 130 via the vibration transmission unit 140, the electrode may be disposed on a side of the driving beam 122 away from the vibration transmission unit 140. In some embodiments, when the driving unit 120 is directly driving connected with the vibration unit 130, for example, when the diaphragm 131 directly covers a surface of the driving beam 122, the electrode may be connected with a side surface of the driving beam 122 away from the diaphragm 131. In some embodiments, the electrode may be regular shapes such as rectangular, circular, polygonal, or any irregular shape. In some embodiments, one electrode layer of the driving beam 122 may include one electrode or a plurality of electrodes, and the plurality of electrodes may be distributed arbitrarily, for example, the plurality of electrodes may be distributed in an array. In some embodiments, the electrode may cover an entire side surface of the driving beam 122 or may cover a localized region on the side surface of the driving beam 122. In some embodiments, the electrode may be evenly distributed on the side surface of the driving beam 122, or may be unevenly distributed.

Figure 27:
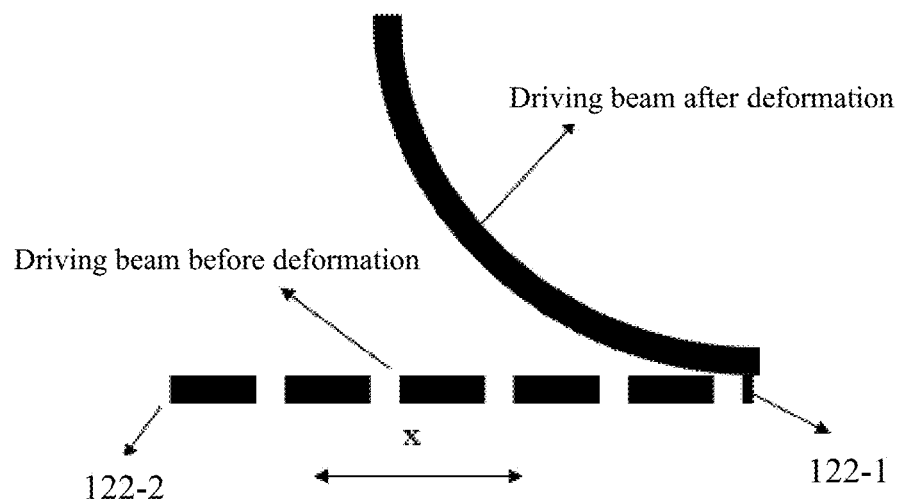
FIG. 27 is a diagram illustrating a side view of a driving beam with an electrode in a y-direction according to some embodiments of the present disclosure.

FIG. 27 is a diagram illustrating a side view of a driving beam with an electrode in a y-direction according to some embodiments of the present disclosure. As shown in FIG. 27, one side of the driving beam 122 is the fixed region 122-1, the fixed region 122-1 is connected with the casing 110 or the substrate 126, and a side opposite to the fixed region 122-1 in x-direction is the overhanging region 122-2, an electrode covers a region in an entire length-direction (i.e., the x-direction) of the driving beam 122, and when the driving beam 122 deforms in response to an electrical signal, positions of the driving beams 122 in the entire length-direction are deformed.

Figure 28:
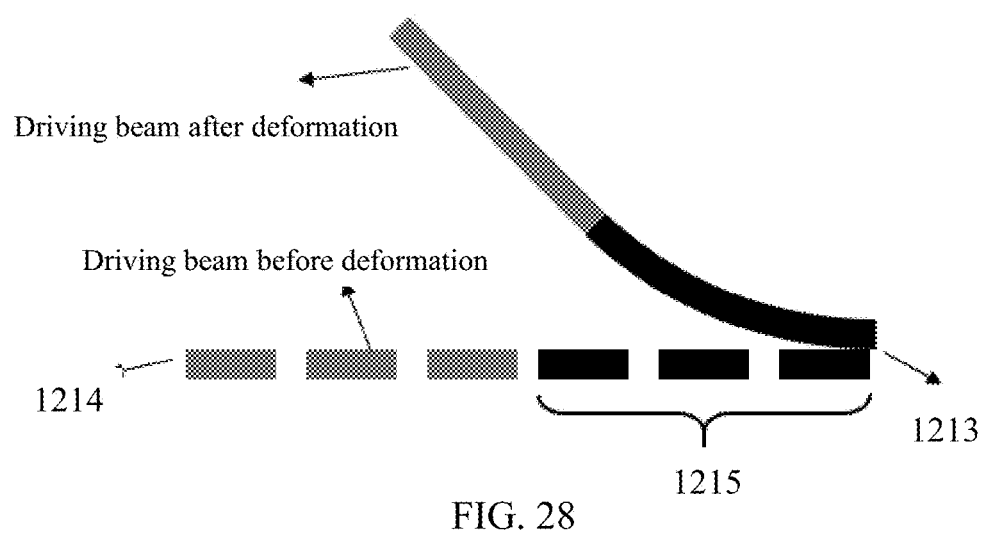
FIG. 28 is a diagram illustrating a side view of a driving beam with an electrode in a y-direction according to some embodiments of the present disclosure.

FIG. 28 is a diagram illustrating a side view of a driving beam with an electrode in a y-direction according to some embodiments of the present disclosure. As shown in FIG. 28, one side of the driving beam 122 is the fixed region 122-1, the fixed region 122-1 is connected with the casing 110 or the substrate 126, a side opposite to the fixed region 122-1 in x-direction is the overhanging region 122-2, and an electrode covers a portion of a region at a distance from the fixed region 122-1 in the length-direction (i.e., the x-direction). A region on a surface of the driving beam 122 that is covered by the electrode is defined as an electrode-covered region 1215. When the driving beam 122 deforms in response to an electrical signal, the driving beam 122 deforms only in the electrode-covered region 1215, and thus a vibration pattern of the driving beam 122 may be effectively regulated by regulating a distribution of electrodes, thereby regulating an output sound pressure level of the loudspeaker 100.

In conjunction with FIG. 27 and FIG. 28, compared to that the electrode covers the entire region in the length-direction of the driving beam 122, the overhanging region 122-2 of the driving beam 122 covered by the electrode includes a non-electrode-covered region, at least a portion of the non-electrode-covered region is located at an end of the driving beam 122 away from the fixed region 122-1, facilitating control of the vibration pattern of the driving beam 122. In some embodiments, the vibration pattern of the driving beam 122 may be effectively regulated by regulating the region covered by the electrode in the length direction of the driving beam 122, so as to regulate a vibrational displacement of the driving beam 122 to regulate the output sound pressure level of the loudspeaker 100.

Figure 29:
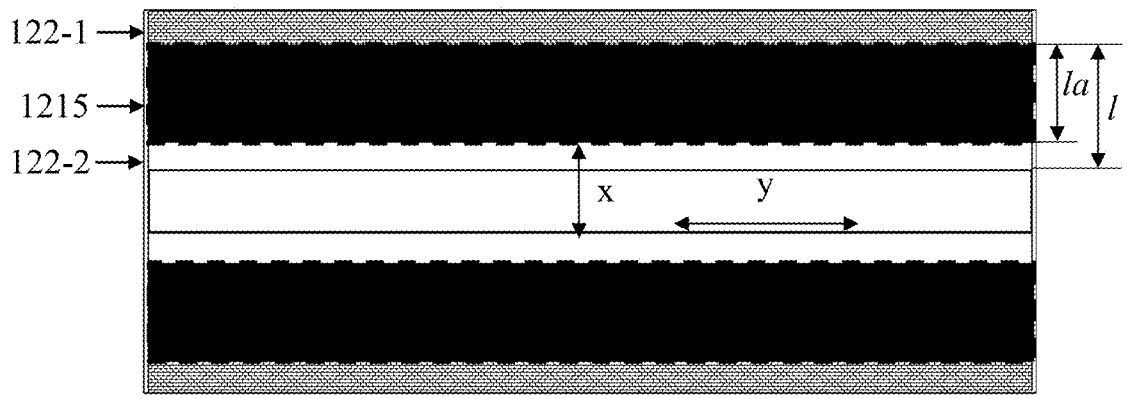
FIG. 29 is a diagram illustrating a projection of a driving beam in a z-direction according to some embodiments of the present disclosure.

FIG. 29 is a diagram illustrating a projection of a driving beam in a z-direction according to some embodiments of the present disclosure.

In some embodiments, as shown in FIG. 29, the electrode-covered region 1215 may be rectangular. The electrode-covered region 1215 is provided within the overhanging region 122-2 of the driving beam 122, and a width of the electrode-covered region 1215 is consistent with a width of the overhanging region 122-2 of the driving beam 122. In some embodiments, the electrode-covered region 1215 may be disposed proximate to the fixed region 122-1 of the driving beam 122 to facilitate control of a vibration pattern of the driving beam 122. In some embodiments, the electrode-covered region 1215 may also be disposed proximate to the overhanging region 122-2 of the driving beam 122, and the electrode-covered region 1215 may also be disposed in the middle between the fixed region 122-1 and the overhanging region 122-2 of the driving beam 122. In some embodiments, an electrode may be disposed only within the overhanging region 122-2 since the fixed region 122-1 is fixed to the substrate 126 or the casing 110 and is not involved in the vibration of the driving beam 122. In some embodiments, the electrode may also be disposed within the fixed region 122-1 on demand. In some embodiments, a relationship between the length dimension of the electrode-covered region 1215 in the length direction and the length dimension of the driving beam 122 may be rationally designed to adjust a vibration mode of the driving beam 122. The rectangular electrode-covered region 1215 is illustrated here as an example, and it is important to know that the electrode-covered region 1215 may also be other shapes (e.g., trapezoidal, rounded rectangle, etc.).

In some embodiments, a ratio of the length dimension of the electrode-covered region 1215 to the length dimension of the overhanging region 122-2 in a direction extending from the fixed region 122-1 to the overhanging region 122-2 is in a range of 0.3 to 1.

In some embodiments, a physical quantity γ is defined as:

$$\gamma = \frac{la}{l}, \quad (12)$$

where la denotes a length of the electrode-covered region 1215 on the driving beam 122 in the length direction, l denotes a length of the overhanging region 122-2 in the length direction x, and γ denotes a ratio of la to l.

Figure 30:
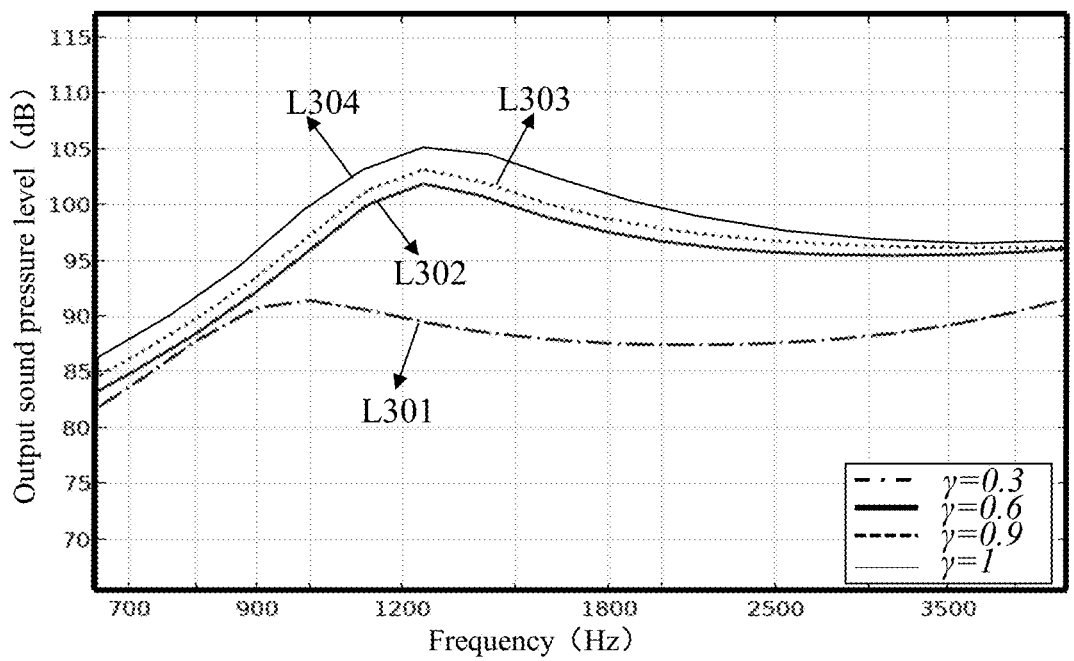
FIG. 30 is a diagram illustrating the frequency response curves of a loudspeaker corresponding to different values of γ according to some embodiments of the present disclosure.

FIG. 30 is a diagram illustrating frequency response curves of a loudspeaker corresponding to different values of γ according to some embodiments of the present disclosure. As shown in FIG. 30, a curve L301 represents a frequency response curve corresponding to the loudspeaker 100 when γ=0.3; a curve L302 represents a frequency response curve corresponding to the loudspeaker 100 when γ=0.6; a curve L303 represents a frequency response curve corresponding to the loudspeaker 100 when γ=0.9; and a curve L304 represents a frequency response curve corresponding to the loudspeaker 100 when γ=1. As shown in FIG. 30, it is known that when γ=1, the corresponding curve L304 has the highest position, and the corresponding loudspeaker 100 has the largest output sound pressure level. When γ gradually decreases from 1 to 0.6, the corresponding curve gradually shifts downward, and the output sound pressure level of the loudspeaker 100 gradually decreases. When γ decreases from 0.6 to 0.3, the corresponding curve downwardly shifts significantly, and the output sound pressure level of the loudspeaker 100 decreases significantly. This is because when the value of γ is taken too small, the length of the electrode-covered region 1215 on the driving beam 122 occupies too small a proportion of the length of the overhanging region 122-2, and the length of a region in which deformation occurs and a driving force is generated in the overhanging region 122-2 of the driving beam 122 is too small, resulting in the driving beam 122 generating a too small driving beam, which results in a lower output sound pressure level of the loudspeaker 100.

Figure 31:
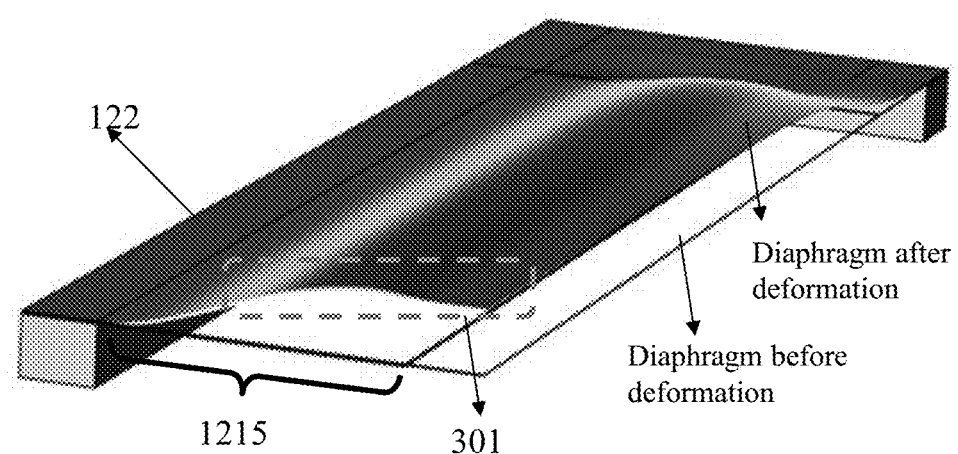
FIG. 31 is a vibration deformation contour diagram of a quarter portion of a driving beam and a diaphragm divided by symmetrical lines in an x-direction and y-direction when $\gamma=1$ according to some embodiments of the present disclosure.
Figure 32:
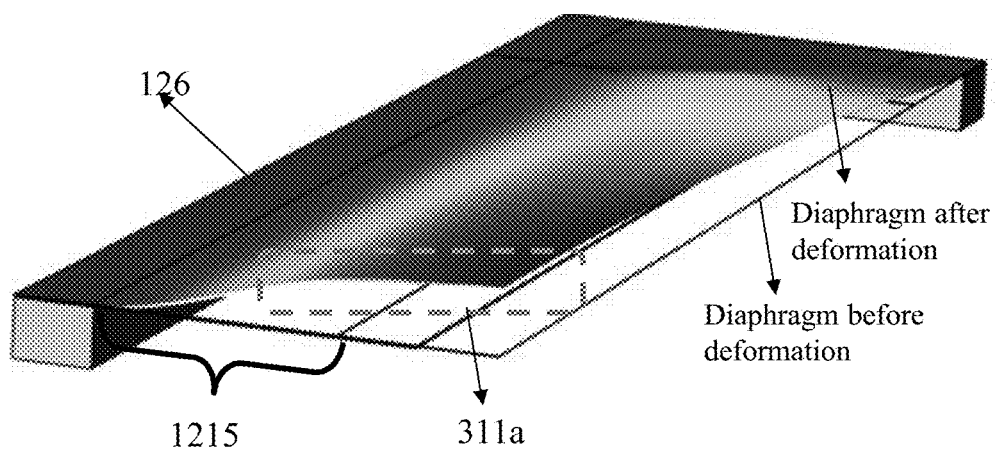
FIG. 32 is a vibration deformation contour diagram of a quarter portion of a driving beam and a diaphragm divided by symmetrical lines in an x-direction and y-direction when $\gamma=0.75$ according to some embodiments of the present disclosure.

FIG. 31 is a vibration deformation contour diagram of a quarter portion of a driving beam and a diaphragm divided by symmetrical lines in an x-direction and y-direction when γ=1 according to some embodiments of the present disclosure. FIG. 32 is a vibration deformation contour diagram of a quarter portion of a driving beam and a diaphragm divided by symmetrical lines in an x-direction and y-direction when γ=0.75 according to some embodiments of the present disclosure. As shown in FIG. 31, an excessively large length of the electrode-covered region 1215 may cause the driving beam 122 to deform when it vibrates, and a region of the driving beam 122 proximate to the fixed region 122-1 and the overhanging region 122-2 (e.g., a reversal deformation region 301 illustrated in FIG. 31) may have a mode with an opposite deformation direction at certain frequencies. As shown in FIG. 32, when the length of the electrode-covered region 1215 is appropriately reduced, a portion of the overhanging region 122-2 that is not covered by an electrode transmits vibration only as a mechanical structure and does not deform, so that the deformation amount of modes with opposite deformation directions in a region (e.g., a reversal deformation region 311*a* shown in FIG. 32) proximate to the fixed region 122-1 and the overhanging region 122-2 of the loudspeaker 100 at certain frequencies is reduced, which can push more air and output a larger sound pressure level.

In some embodiments, for the driving beam 122 to generate a larger driving force, the loudspeaker 100 may have a larger output sound pressure level, and a ratio γ of the length la of the electrode-covered region 1215 to the length l of the overhanging region 122-2 may be in a range of 0.3 to 1. In some embodiments, to further increase the output sound pressure level of the loudspeaker 100, the ratio γ of the length la of the electrode-covered region 1215 to the length l of the overhanging region 122-2 may be in a range of 0.5 to 0.1. In some embodiments, to further increase the output sound pressure level of the loudspeaker 100, the ratio γ of the length la of the electrode-covered region 1215 to the length l of the overhanging region 122-2 may be in a range of 0.5 to 0.75. In some embodiments, the ratio γ of the length la of the electrode-covered region 1215 to the length l of the overhanging region 122-2 may be in a range of 0.5 to 0.8 to increase a vibrational displacement of the driving beam 122, thereby enhancing the output sound pressure level of the loudspeaker 100.

In some embodiments, only the overhanging region 122-2 of the electrode-covered region 1215 on the driving beam 122 may deform to provide a driving force, the overhanging region 122-2 not covered with the electrode only serves as a mechano-mechanical structure for the transmission of force and displacement. Thus, in some embodiments, the driving force of the driving beam 122 may be enhanced by designing a coverage area of the electrode on the driving beam 122 (i.e., a relationship between an area of the electrode-covered region 1215 and an area of the overhanging region 122-2), thereby enhancing the output sound pressure level of the loudspeaker 100.

In some embodiments, a total area of the overhanging region 122-2 is defined as Sk, an area of the electrode-covered region 1215 is defined as Sd, and a parameter τ is defined as a ratio of the area Sd of the electrode-covered region 1215 to the total area Sk of the overhanging region 122-2 as follows:

$$\tau = \frac{Sd}{Sk}. \quad (13)$$

The parameter τ may represent a proportion of an area of a portion of the driving beam 122 that deforms (i.e., an area corresponding to the electrode-covered region 122-21) to the total area of the overhanging region 122-2.

Figure 33:
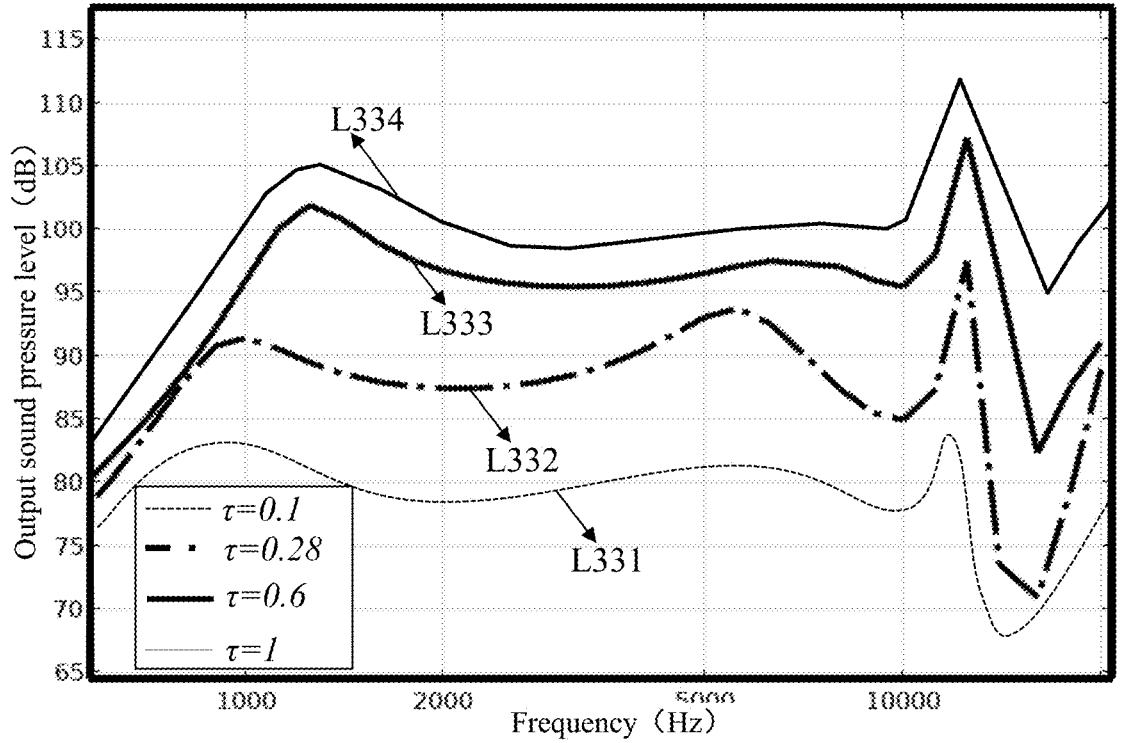
FIG. 33 is a schematic diagram illustrating the frequency response curves of a loudspeaker corresponding to different values of τ according to some embodiments of the present disclosure.

FIG. 33 is a schematic diagram illustrating frequency response curves of a loudspeaker corresponding to different values of t according to some embodiments of the present disclosure. As shown in FIG. 33, a curve L331 indicates a frequency response curve corresponding to the loudspeaker 100 when τ=0.1, a curve L332 indicates a frequency response curve corresponding to the loudspeaker 100 when τ=0.28; a curve L333 indicates a frequency response curve corresponding to the loudspeaker 100 when τ=0.6; and a curve L334 indicates a frequency response curve corresponding to the loudspeaker 100 when τ=1. As shown in FIG. 33, when the value of t gradually increases from 0.1 to 1, the corresponding curve gradually shifts upward, and an output sound pressure level of the loudspeaker 100 is gradually increased. In some embodiments, the value of t may be in a range of 0.28 to 1 to make the loudspeaker 100 have a larger output sound pressure level. It should be noted that the larger the value of τ, the more regions on the driving beam 122 undergo deformation, and the larger the driving force of the driving beam 122 is. However, due to the needs of the actual sample processing process, electrode alignment, and vibration modulation, there are various cases where it is not possible to ensure that the area Sd of the electrode-covered region 1215 may be the same as the total area Sk of the overhanging region 122-2, so the value of t sometimes may not be taken to a maximum value of 1. In some embodiments, to make the loudspeaker 100 have a larger output sound pressure level, the ratio τ of the area of the electrode-covered region 1215 to an area of the overhanging region 122-2 may be in a range of 0.3 to 1. In some embodiments, to make the loudspeaker 100 have a larger output sound pressure level, the ratio τ of the area of the electrode-covered region 1215 to the area of the overhanging region 122-2 may be in a range of 0.5 to 1.

In some embodiments, a shape of the electrode-covered region 1215 may also be designed to affect the driving force of the driving beam 122, which in turn affects the output sound pressure level of the loudspeaker 100 and adjusts vibration modes of the driving beam 122. The following lists several embodiments in which the electrode-covered region 1215 is of different shapes and is not intended to be limiting. It is to be noted that the above manner of regulating the output sound pressure level of the loudspeaker 100 by adjusting the ratio γ is also applicable to a case where the electrode-covered region 1215 is of different shapes (e.g., a rectangle, a trapezoid, or a rounded chamfered corner).

FIG. 34A to FIG. 34F are diagrams illustrating projections of a driving beam in a z-direction according to some embodiments of the present disclosure.

Figure 34A:
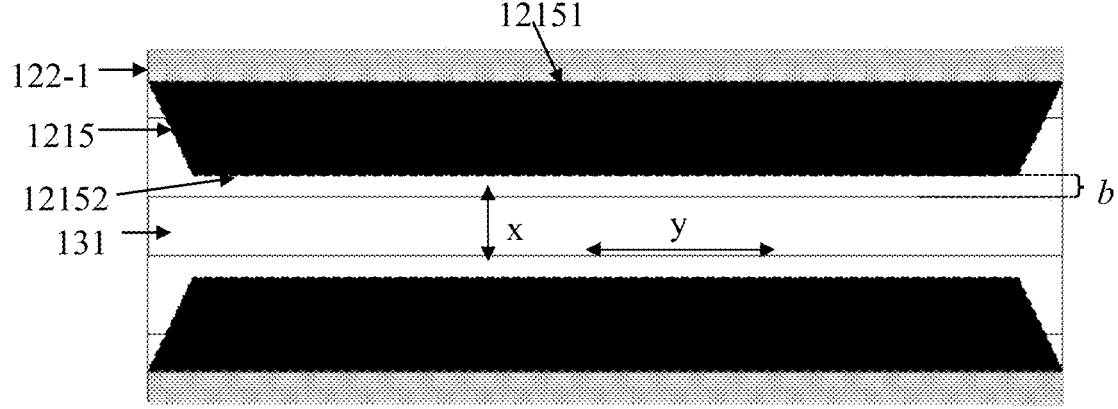
FIG. 34A to FIG. 34F are diagrams illustrating projections of a driving beam in a z-direction according to some embodiments of the present disclosure.

In some embodiments, as shown in FIG. 34A, the electrode-covered region 1215 is disposed within the overhanging region 122-2, the electrode-covered region 1215 may be a trapezoidal shape, a width of a first side 12151 of the electrode-covered region 1215 (i.e., a side disposed proximate to the fixed region 122-1) in the y-direction is consistent with a width of the overhanging region 122-2 in the y-direction, and there is a certain distance b between a second width 12152 of the electrode-covered region 1215 that is opposite to the first side 12151 and a side of the overhanging region 122-2 away from the fixed region 122-1 (referring to FIG. 34A).

Figure 34B:
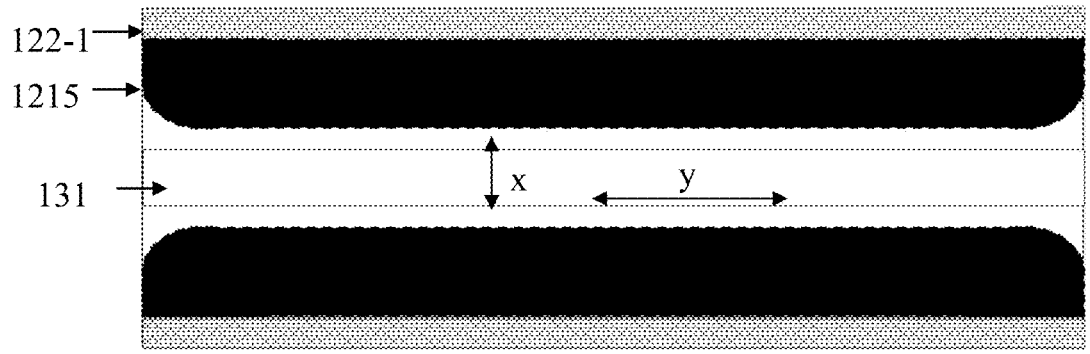

The electrode-covered region 1215 shown in FIG. 34B is similar to the electrode-covered region 1215 shown in FIG. 34A, with a difference that there are rounded chamfered corners between a long side of the electrode-covered region 1215 that is proximate to the overhanging region 122-2 and away from the fixed region 122-1 and a short side in an X-direction, i.e., it may be considered that on the electrode-covered region 1215, a width dimension of the long side of the electrode-covered region 1215 that is located away from the fixed region 122-1 in the y-direction is smaller than a width dimension of the long side of the electrode-covered region 1215 that is located close to the fixed region 122-1 in the y-direction.

The electrode-covered region 1215 shown in FIG. 34 C is similar to the electrode-covered region 1215 shown in FIG. 29, with a difference that an original rectangular electrode-covered region 1215 extends another small rectangular region in the x-direction, and a width dimension of the small rectangular region in the y-direction is smaller than a width dimension of the original rectangular electrode-covered region 1215. In some embodiments, the small rectangular region may be located in the middle of the electrode-covered region 1215 in the y-direction.

Figure 34C:
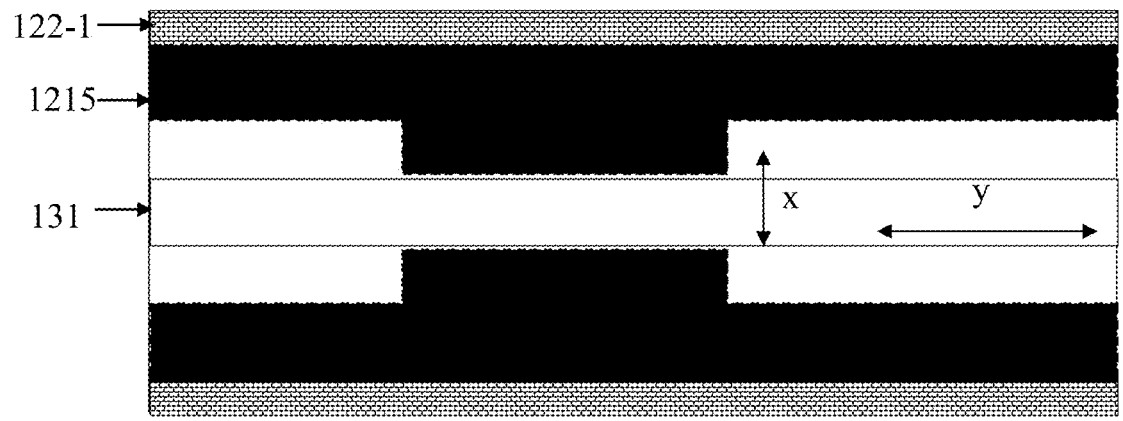
Figure 34D:
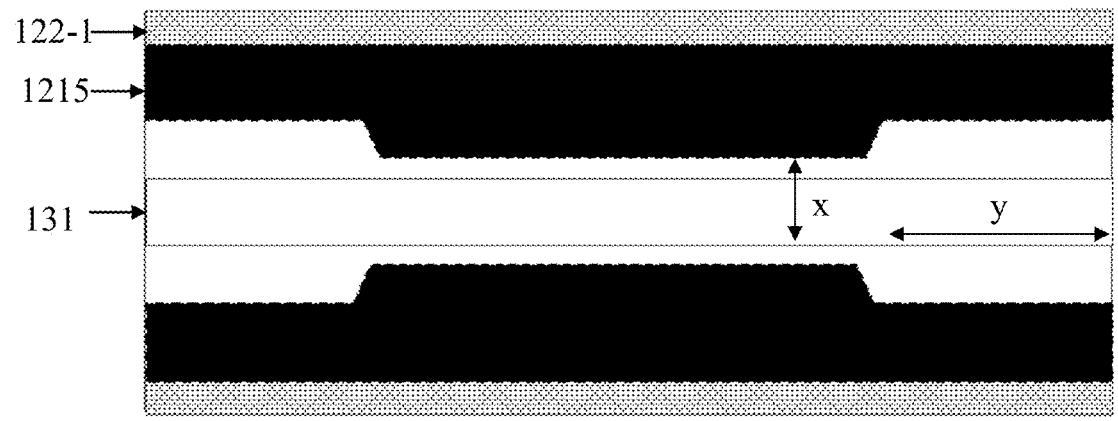
Figure 34E:
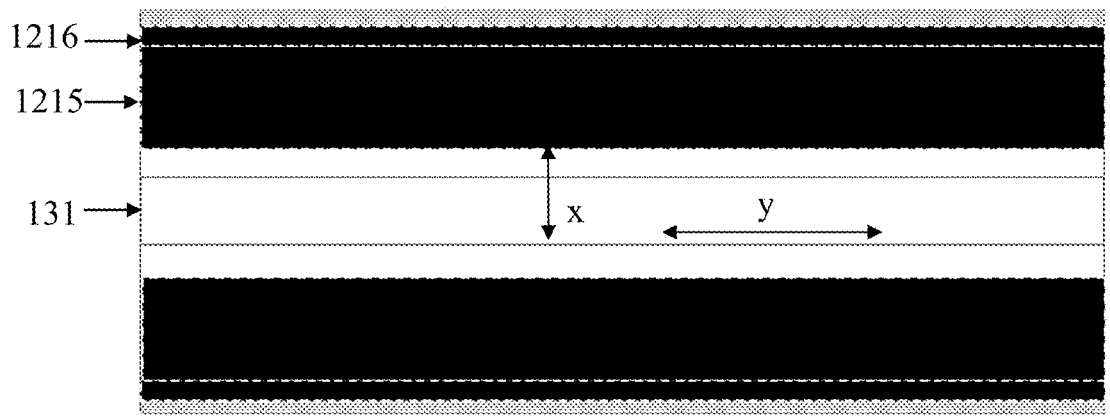
Figure 34F:
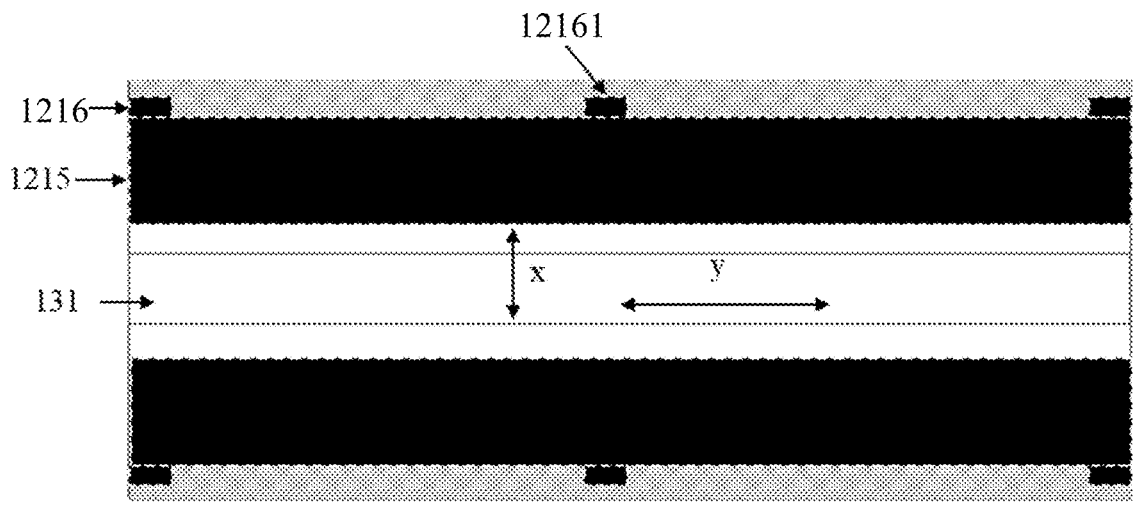

The electrode-covered region 1215 shown in FIG. 34D is similar to the electrode-covered region 1215 shown in FIG. 34C, with a difference that a small extension region is a trapezoidal region, and a long side of the trapezoidal region in the y-direction is disposed proximate to the original rectangular region.

In some embodiments, the substrate 126 of the loudspeaker 100 may also be covered with an electrode for electrical signal leads. In some embodiments, the electrode on the substrate 126 may cover an end surface connected with the driving beam 122. In some embodiments, the substrate 126 may be provided with one or more electrodes, and the plurality of electrodes may be distributed arbitrarily. For example, the plurality of electrodes may be distributed in an array. In some embodiments, the electrode may cover an entire end surface of the substrate 126 connected with the driving beam 122, or may cover a localized region on the end surface. In some embodiments, the electrode may be uniformly distributed over the end surface of the substrate 126 connected with the driving beam 122, or may be unevenly distributed. The following lists several ways in which the electrode may be distributed on the end surface of the substrate 126 and is not intended to be limiting.

Based on the electrode-covered region 1215 shown in FIG. 29, the electrode-covered region 1215 shown in FIG. 34 E further includes a second covered region 1216 on the end surface of the substrate 126, the second covered region 1216 is rectangular, and a width of the second covered region 1216 in the y-direction is consistent with a width of the driving beam 122 in the y-direction. In some embodiments, the second covered region 1216 may be disposed proximate to the overhanging region 122-2 of the driving beam 122.

Based on the electrode-covered region 1215 shown in FIG. 29, the electrode-covered region 1215 shown in FIG. 34 F further includes the second covered region 1216 on the end surface of the substrate 126, the second covered region 1216 includes a plurality of second electrode regions 12161 spaced apart in the y-direction, a width of the plurality of second electrode regions 12161 in the y-direction is consistent with to a width of the driving beam 122 in the y-direction. In some embodiments, the second covered region 1216 may be disposed proximate to the overhanging region 122-2 of the driving beam 122.

In some embodiments, the vibration unit 130 includes a movable region, the movable region is provided with a reinforcement structure, at least a portion of the reinforcement structure covers the movable region, and a projection of a center of the reinforcement structure overlaps with a projection of a center of the movable region in a vibration direction of the vibration unit 130. The reinforcement structure adjusts a stiffness of the vibration unit 130, thereby adjusting a vibration mode of the vibration unit 130, improving a vibration mode of the loudspeaker 100, and enhancing the output performance of the loudspeaker 100.

Figure 35:
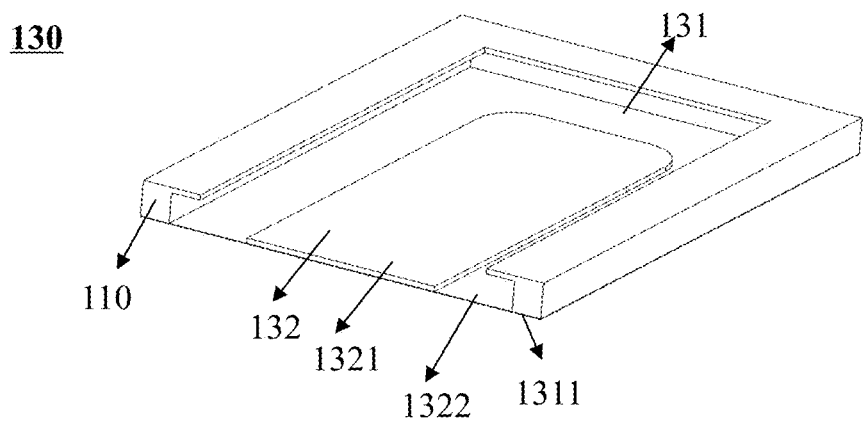
FIG. 35 is a schematic diagram illustrating a portion of a vibration unit according to some embodiments of the present disclosure.
Figure 36:
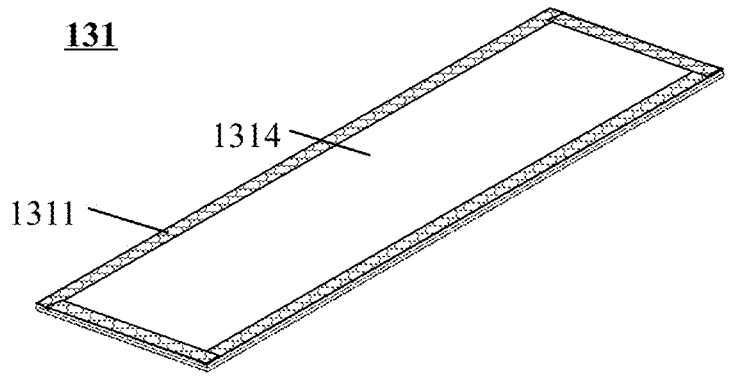
FIG. 36 is a schematic diagram illustrating an exemplary structure of a diaphragm according to some embodiments of the present disclosure.
Figure 37:
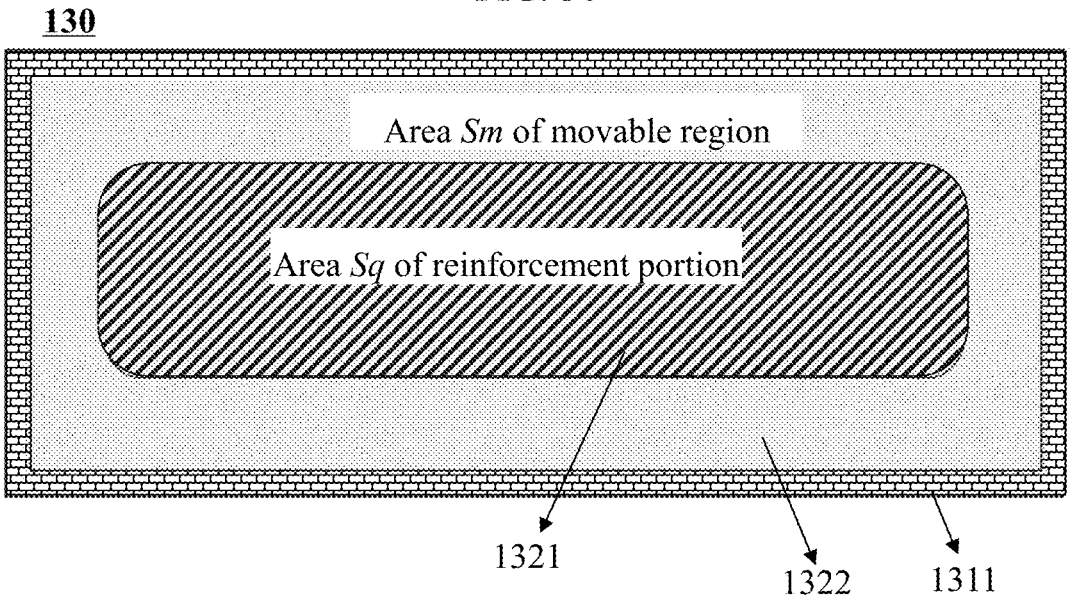
FIG. 37 is a schematic diagram illustrating a vibration unit according to some embodiments of the present disclosure.

FIG. 35 is a schematic diagram illustrating a portion of a vibration unit according to some embodiments of the present disclosure. FIG. 36 is a schematic diagram illustrating an exemplary structure of a diaphragm according to some embodiments of the present disclosure. FIG. 37 is a schematic diagram illustrating a vibration unit according to some embodiments of the present disclosure.

As shown in FIG. 35, in some embodiments, the vibration unit 130, which is a load end of the loudspeaker 100, may include the diaphragm 131 and the center reinforcement member 132. In some embodiments, in conjunction with FIG. 1A and FIG. 35, the diaphragm 131 may include the edge fixed portion 1311, the folded ring portion 1312, and the center portion 1313, and the edge fixed portion 1311 may be fixedly connected with the casing 110 of the loudspeaker 100, and the center portion 1313 may be provided with the center reinforcement member 132. The driving unit 120 may be connected with the center reinforcement member 132. Alternatively, the driving unit 120 may be directly connected with the center portion 1313 of the diaphragm 131 to realize the transmission of mechanical energy from a driving end (the driving unit 120) to a load end (the vibration unit 130).

Referring to FIG. 36, in some embodiments, the movable region 1314 is a region of the diaphragm 131 excluding a portion of the diaphragm 131 connected with the casing 110. That is, the movable region 1314 is a region in the diaphragm 131 removing the edge fixed portion 1311. In some embodiments, the movable region 1314 may be made of the folded ring portion 1312 and the center portion 1313.

In some embodiments, the movable region 1314 is provided with the reinforcement structure 1321. In some embodiments, the reinforcement structure 1321 may include the center reinforcement member 132 and the center portion 1313 corresponding to the center reinforcement member 132. In some embodiments, at least a portion of the reinforcement structure 1321 covers the movable region 1314, and the projection of the center of the reinforcement structure 1321 overlaps with the projection of the center of the movable region 1314 in the vibration direction of the vibration unit 130.

In some embodiments, a portion of the movable region 1314 that is not covered by the reinforcement structure 1321 is the vibration overhanging region 1322 of the diaphragm 131. That is, the vibration overhanging region 1322 of the diaphragm 131 is a region in the movable region 1314 other than the reinforcement structure 1321.

In some embodiments, the vibration unit 130 includes the diaphragm 131 as shown in FIG. 37, an area of a region in the diaphragm 131 that is covered by the reinforcement structure 1321 is defined as an area Sq of the reinforcement structure, and an area of the vibration overhanging region 1322 of the diaphragm 131 is defined as Sm. In some embodiments, a ratio of the area Sq of the reinforcement structure to the area Sm of the vibration overhanging region is in a range of 0.5 to 0.85.

In some embodiments, a parameter $\zeta$ may be defined as the ratio between the area Sq of the reinforcement structure 1321 and the area Sm of the vibration overhanging region 1322 of the diaphragm 131 as follows:

$$\zeta = \frac{S_q}{S_m}. \tag{14}$$

By designing the ratio $\zeta$, it is possible to determine a proportion of an area of the vibration overhanging region 1322 in the movable region 1314, thereby determining a higher-order resonance frequency at mid-to-high frequencies of the loudspeaker 100 and adjusting a localized mode of the diaphragm 131.

In some embodiments, at the mid-to-high frequencies, the driving beam 122 may produce a second-order mode, resulting in a small movement displacement between the driving unit 120 of the loudspeaker 100 and the vibration transmission unit 140, which results in a small displacement of a diaphragm assembly (i.e., the vibration unit 130, including the diaphragm 131 and/or the center reinforcement member 132), and furthermore, results in a frequency response of the loudspeaker 100 producing a valley at the mid-to-high frequencies. In some embodiments, by designing a size of the vibration overhanging region 1322 to cause the vibration overhanging region 1322 to produce a localized mode in a frequency band in which the driving beam 122 produces the second-order mode, it is possible to counteract the problem of the frequency response of the loudspeaker 100 having a valley at the mid-to-high frequencies due to a small displacement of the diaphragm 131 due to the second-order mode produced by the driving beam 122.

Figure 38A:
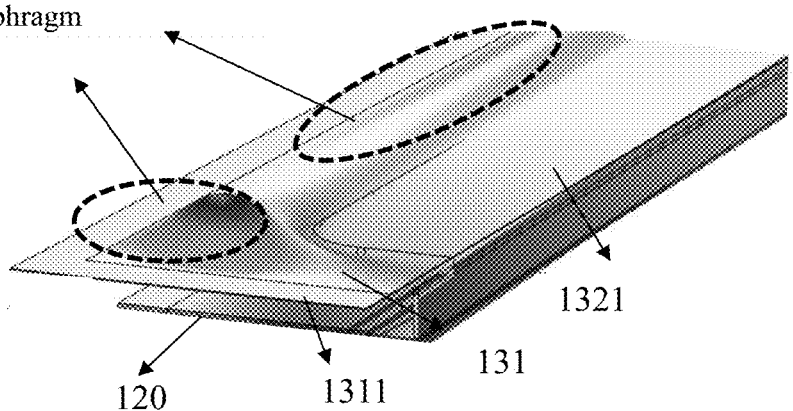
FIG. 38A is a deformation contour diagram illustrating a loudspeaker when a parameter ξ=0.5 according to some embodiments of the present disclosure.
Figure 38B:
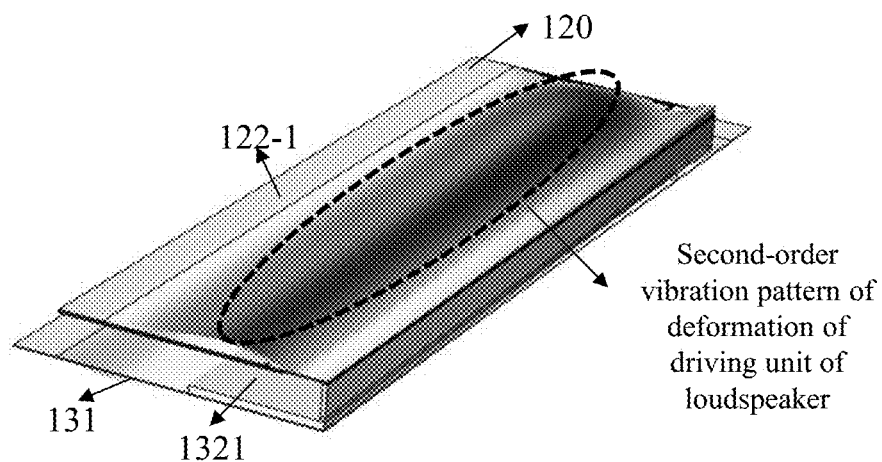
FIG. 38B is a deformation contour diagram illustrating another view of the loudspeaker shown in FIG. 38A of the present disclosure.
Figure 39A:
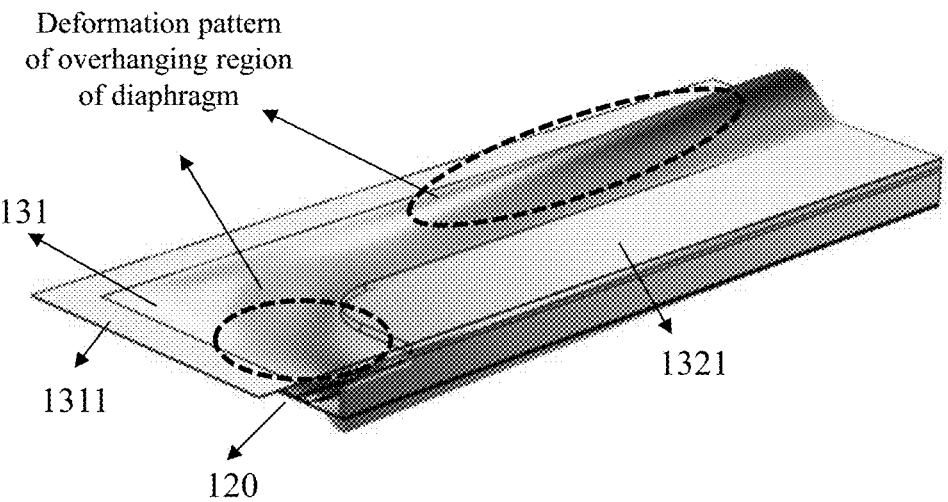
FIG. 39A is a deformation contour diagram illustrating a loudspeaker when a parameter ζ=0.4 according to some embodiments of the present disclosure.
Figure 39B:
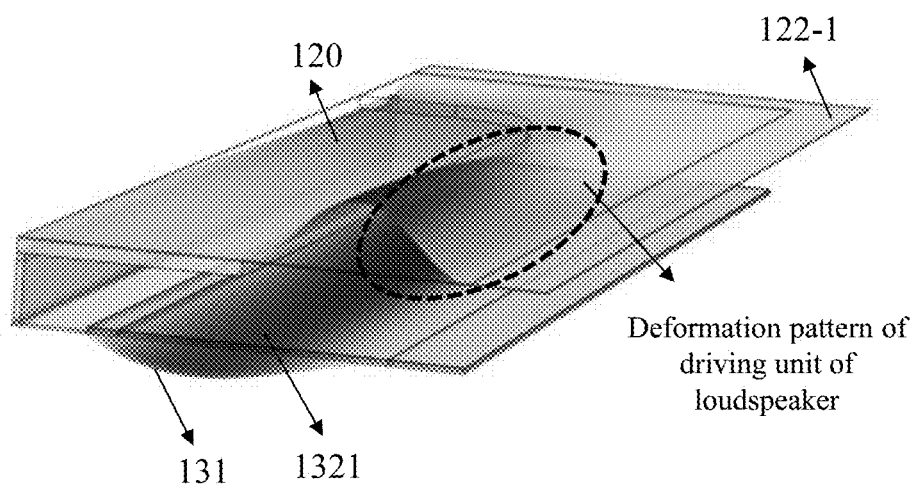
FIG. 39B is a deformation contour diagram illustrating another view of the loudspeaker in FIG. 39A of the present disclosure.
Figure 40:
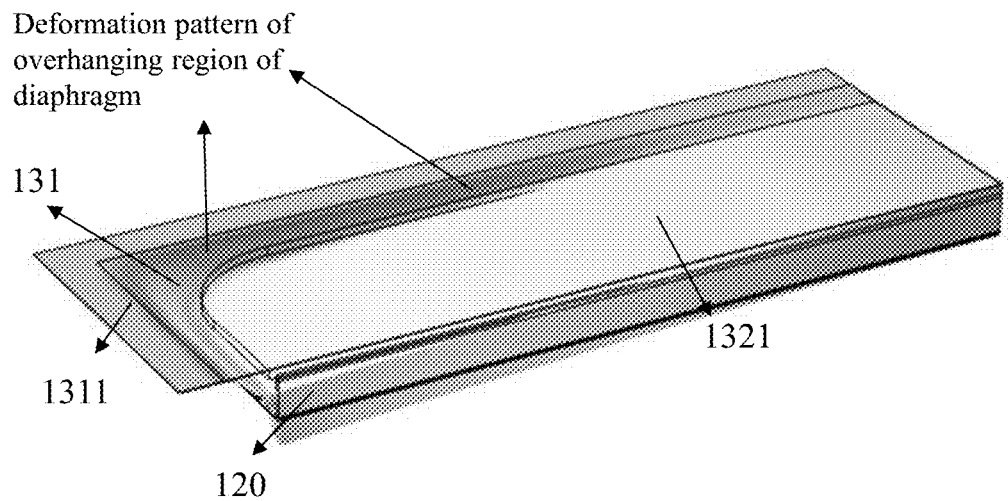
FIG. 40 is a deformation contour diagram illustrating a loudspeaker when ξ=0.9 according to some embodiments of the present disclosure.
Figure 41:
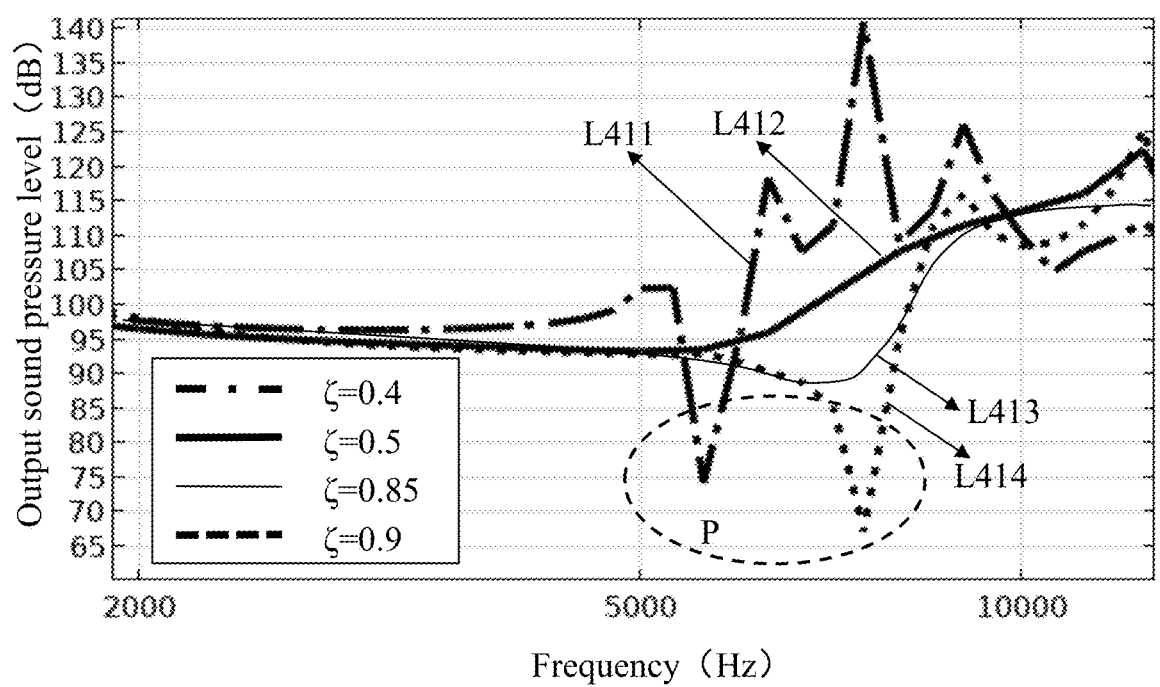
FIG. 41 is a schematic diagram illustrating the frequency response curves of a loudspeaker corresponding to different values of (according to some embodiments of the present disclosure.

FIG. 38A is a deformation contour diagram illustrating a loudspeaker when a parameter $\zeta=0.5$ according to some embodiments of the present disclosure. FIG. 38B is a deformation contour diagram illustrating another view of the loudspeaker shown in FIG. 38A of the present disclosure. FIG. 39A is a deformation contour diagram illustrating a loudspeaker when a parameter $\zeta=0.4$ according to some embodiments of the present disclosure. FIG. 39B is a deformation contour diagram illustrating another view of the loudspeaker in FIG. 39A of the present disclosure. FIG. 40 is a deformation contour diagram illustrating a loudspeaker when $\zeta=0.9$ according to some embodiments of the present disclosure. FIG. 41 is a schematic diagram illustrating frequency response curves of a loudspeaker corresponding to different values of $\zeta$ according to some embodiments of the present disclosure.

As shown in FIG. 38A and FIG. 38B, when $\zeta=0.5$, in a frequency band where the driving beam 122 generates a second-order mode, the vibration overhanging region 1322 may generate a localized mode, which in turn contributes to a diaphragm assembly pushing the air, and corresponds to the absence of valleys or improved valleys in a diagram of a frequency response curve (as shown a curve L412 shown in FIG. 41) in the frequency band. However, as shown in FIG. 39A and FIG. 39B, when $\zeta=0.4$, an area of the vibration overhanging region 1322 accounts for too large a proportion, resulting in different positions of the vibration overhanging region 1322 in a frequency band has produced movement modes with different directions, which corresponds to that a diagram of a frequency response curve (such as a curve L411 shown in FIG. 41) still has a valley in the frequency band. As shown in FIG. 40, when $\zeta=0.9$, the area of the vibration overhanging region 1322 is too small, resulting in the vibration overhanging region 1322 not generating a local mode in the frequency band, which corresponds to that a diagram of a frequency response curve (e.g., a curve L414 shown in FIG. 41) still has a low valley in the frequency band.

In some embodiments, by setting a side of the vibration overhanging region 1322, a stiffness of the diaphragm 131 may be adjusted, which in turn can adjust a low-frequency resonance frequency $f_0$ of the loudspeaker 100 in a low-frequency band. In some embodiments, by setting the size of the vibration overhanging region 1322, the stiffness of the diaphragm 131 may also be adjusted in a mid-to-high frequency band to achieve the adjustment of the local mode, and further cooperate with the driving unit 120 of the loudspeaker 100 to achieve the adjustment of peaks and valleys of a mid-to-high frequency response curve.

As shown in FIG. 41, the curve L411 indicates a frequency response curve corresponding to the loudspeaker 100 when $\zeta=0.4$; the curve L412 indicates a frequency response curve corresponding to the loudspeaker 100 when $\zeta=0.5$; a curve L413 indicates a frequency response curve corresponding to the loudspeaker 100 when $\zeta=0.85$; and a curve L414 indicates a frequency response curve corresponding to the loudspeaker 100 when $\zeta=0.9$.

As shown in FIG. 41, frequency response curves of the loudspeaker 100 (corresponding to the curve L411 and the curve L414) have a significant valley (i.e., valleys in a dashed coil P) in a mid-to-high frequency band when ζ=0.4 or 0.9. Frequency response curves of the loudspeaker 100 (e.g., the curve L412 and the curve L413) do not have significant valleys in the mid-to-high frequency band when ζ is in a range of 0.5 to 0.85. Therefore, in some embodiments, in order to make the frequency response curve of the loudspeaker 100 flatter in the mid-to-high frequency band, the value of ζ may be in a range of 0.5 to 0.85.

In some embodiments, one or more edges of the diaphragm 131 include an edge rounded corner, with the movable region 1314 having a length dimension in a direction extending from the fixed region 122-1 toward the overhanging region 122-2. In some embodiments, a ratio of a radius of the edge rounded corner to half of the length dimension of the movable region 1314 is in a range of 0 to 0.7.

In some embodiments, one or more edges of the diaphragm 131 are connected with the casing 110 of the loudspeaker 100. When there is a corner (e.g., a right angle, an acute angle) in the casing 110 of the loudspeaker 100, one of the edges of the diaphragm is connected with the casing 110 at the corner, at which time, during vibration of the diaphragm, it is easy to cause a stress concentration, which causes the diaphragm 131 to be wrinkled or even damaged and also causes an increase in the harmonic distortion of the loudspeaker 100, affecting the reliability of the loudspeaker 100. Thus, in some embodiments, a diaphragm edge rounded corner may be designed at a position of the corner, but the diaphragm edge rounded corner may cause an area of the vibration overhanging region 1322 of the loudspeaker to be changed around the particular position, thus affecting a localized mode of the vibration overhanging region 1322 at the mid-to-high frequencies. Therefore, a dimension of the diaphragm edge rounded corner needs to be designed to ensure that the vibration overhanging region 1322 at the mid-to-high frequencies can still effectively form the localized mode, and thus counteract the problem that an output frequency response of the loudspeaker has a low valley at the mid-to-high frequencies due to a small displacement of the diaphragm resulting from the second-order mode generated by the driving beam 122.

Figure 42:
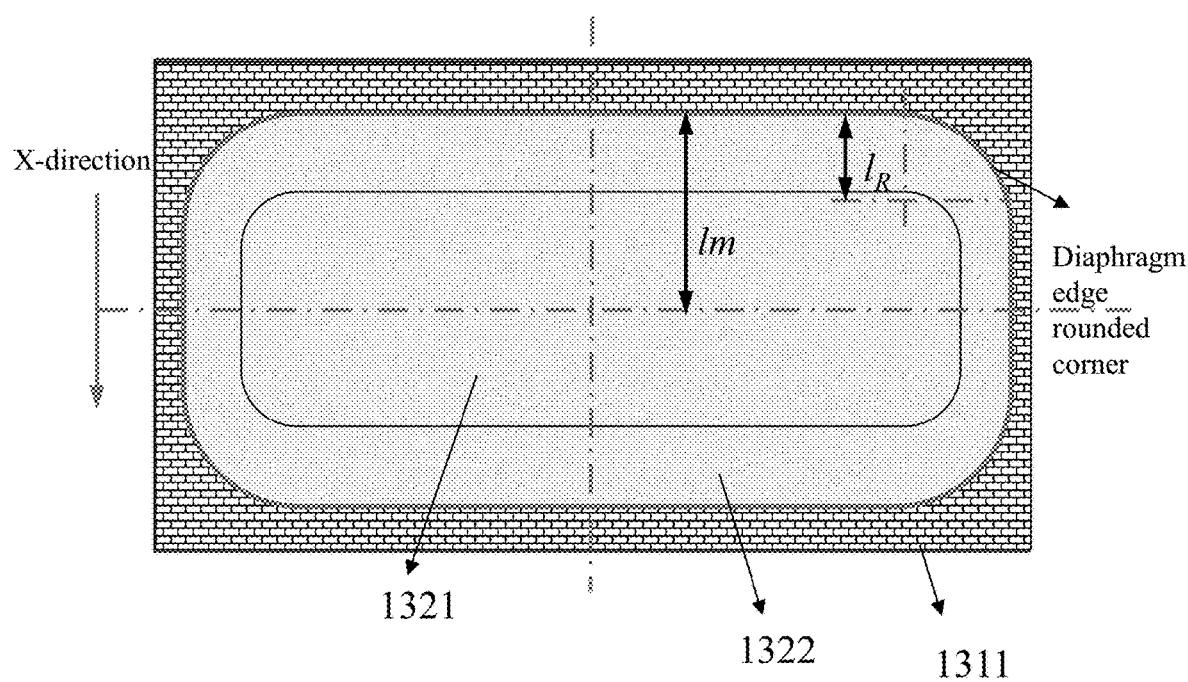
FIG. 42 is a schematic diagram illustrating a diaphragm according to some embodiments of the present disclosure.

FIG. 42 is a schematic diagram illustrating a diaphragm according to some embodiments of the present disclosure. In some embodiments, a parameter 2 may be defined as a ratio between a radius $l_R$ of the diaphragm edge rounded corner and half a length $l_m$ of a movable region of the diaphragm in a length direction of a driving beam (e.g., x-direction as illustrated in FIG. 42) as follows:

$$\lambda = \frac{l_R}{l_m}. \quad (15)$$

By designing the parameter λ, a proportion of an area of the vibration overhanging region 1322 around a position of a corner of the loudspeaker may be determined, thereby determining a resonance frequency of the loudspeaker 100 at mid-to-high frequencies and adjusting a localized mode of the diaphragm 131

Figure 43:
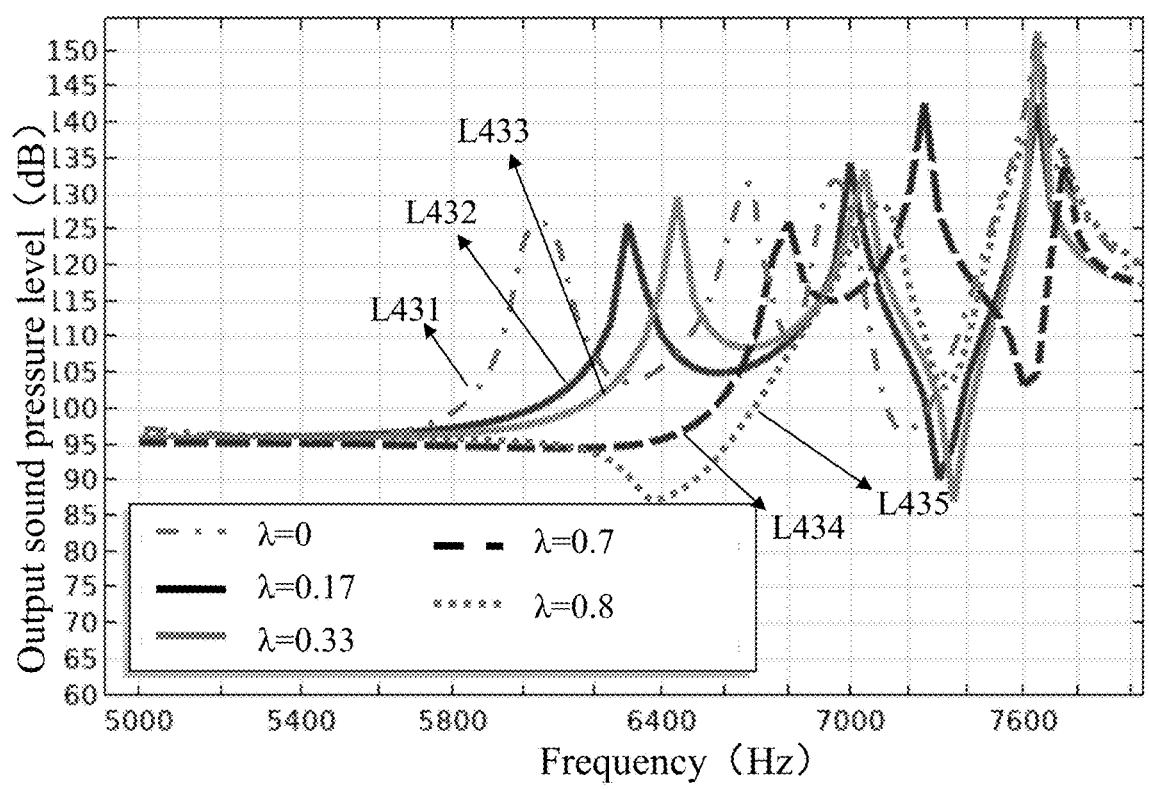
FIG. 43 is a schematic diagram illustrating the frequency response curves of a loudspeaker corresponding to different values of λ according to some embodiments of the present disclosure.

FIG. 43 is a schematic diagram illustrating frequency response curves of a loudspeaker corresponding to different values of λ according to some embodiments of the present disclosure. As shown in FIG. 43, a curve L431 represents a frequency response curve corresponding to the loudspeaker 100 when λ=0; a curve L432 represents a frequency response curve corresponding to the loudspeaker 100 when λ=0.17; a curve L433 represents a frequency response curve corresponding to the loudspeaker 100 when λ=0.33; a curve L434 represents a frequency response curve corresponding to the loudspeaker 100 when λ=0.7; and a curve L435 represents a frequency response curve corresponding to the loudspeaker 100 when λ=0.8.

As shown in FIG. 43, when λ is small, e.g., when λ=0 (corresponding to a square loudspeaker), there are no valleys on the frequency response curve of the loudspeaker near a frequency at which the driving beam generates a second-order mode. With the gradual increase of λ, a proportion of an area of the vibration overhanging region 1322 near positions of four corners of the loudspeaker gradually decreases, and a localized deformation amount produced by a diaphragm assembly in a mid-to-high frequency band (e.g., 7 kHz to 8 kHz) decreases, which may result in the loudspeaker generating a corresponding valley in the mid-to-high frequency band. For example, when 2 is increased to 0.8, a significant valley is produced on the corresponding curve L435. Additionally, as λ gradually increases, a stiffness of the diaphragm gradually increases, and a low-frequency resonance peak of the loudspeaker is gradually shifted to higher frequencies.

In some embodiments, the value of λ may be in a range of 0 to 0.7 to make the loudspeaker 100 have a flatter frequency response curve in the mid-to-high frequency band. In some embodiments, the value of λ may be in a range of 0.2 to 0.6. In some embodiments, the value of λ may be in a range of 0.3 to 0.5

In some embodiments, the reinforcement structure 1321 may be designed to modulate a stiffness of a region in which the driving unit 120 of the loudspeaker 100 is connected with the diaphragm assembly, thereby modulating a modal state of the diaphragm assembly.

In some embodiments, the reinforcement structure 1321 is provided with a perforation; alternatively, the reinforcement structure 1321 is provided with a notch in a periphery of the reinforcement structure 1321.

Figure 44A:
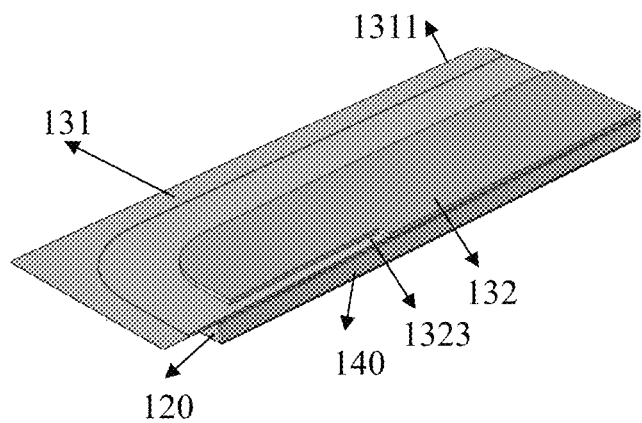
FIG. 44A to FIG. 44C are schematic diagrams illustrating a portion of a loudspeaker according to some embodiments of the present disclosure.
Figure 44B:
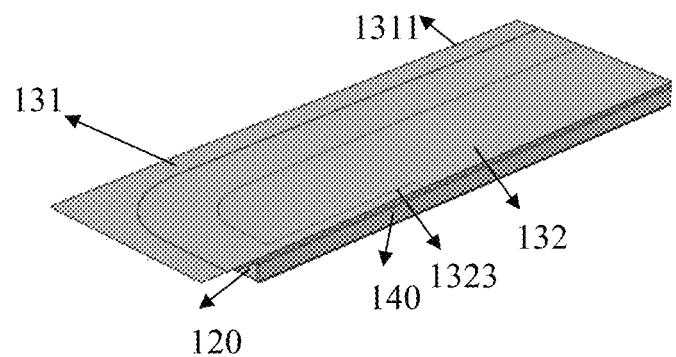
Figure 44C:
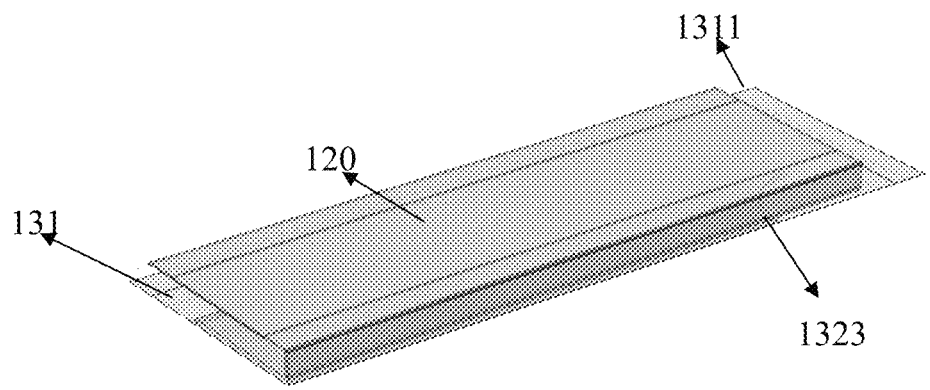

FIG. 44A, FIG. 44B, and FIG. 44C are schematic diagrams illustrating a portion of a loudspeaker according to some embodiments of the present disclosure.

As shown in FIG. 44A and FIG. 44B, in some embodiments, the center reinforcement member 132 may have a notch 1323 in a connection region between the driving unit 120 and a diaphragm assembly to effectively regulate a stiffness of the connection region between the driving unit 120 and the diaphragm assembly, thereby regulating a mode of the diaphragm assembly. In some embodiments, the notch 1323 may be located at a middle position in the connection region between the driving unit 120 and the diaphragm assembly. In some embodiments, the notch 1323 may be located at an edge position of the connection region between the driving unit 120 and the diaphragm assembly (as shown in FIG. 44A).

In some embodiments, when the notch 1323 is located at the middle position of the connection region between the driving unit 120 and the diaphragm assembly, a shape of the notch 1323 may be a circle, an ellipse, a quadrilateral (including, but not limited to, a square, a rectangle, a rhombus, etc.), a pentagon, a hexagon, an octagon, and other polygons, or the like. In some embodiments, when the notch 1323 is located at the edge position of the connection region between the driving unit 120 and the diaphragm assembly, a contour of the notch 1323 may be formed by a straight line (as shown in FIG. 44A) or by an arc (as shown in FIG. 44C).

In some embodiments, the driving unit 120 of the loudspeaker 100 and the vibration unit 130 may be of one-piece construction. For example, the driving unit 120 and the vibration unit 130 may be a one-piece structure both prepared using a microelectromechanical systems (MEMS) process. In some embodiments, the vibration unit 130 may be made of a semiconductor material, a polymer material, or the like. Exemplary semiconductor materials may include silicon (Si), silicon dioxide (SiO2), silicon nitride (SiNx), silicon carbide (SiC), or the like. Exemplary polymeric materials may include polyimide (Polyimide, PI), poly-p-xylene (Parylene), polydimethylsiloxane (Polydimethylsiloxane, PDMS), hydrogels, photoresists, silicone gels, silicone gels, silicone sealants, or the like. In some embodiments, an assembly connection is used between the driving unit 120, the vibration unit 130, and the casing 110.

In some embodiments, the driving unit 120 and the vibration unit 130 of the loudspeaker 100 may be of a split structure. For example, the driving unit 120 may be prepared using a MEMS process, and the vibration unit 130 may be prepared using a conventional process such as die casting, vacuum blistering, thermoforming, or injection molding. In some embodiments, the vibration unit 130 may be made of a rigid material. Exemplary rigid materials may include aluminum alloys, carbon fiber, magnesium-lithium alloys, stainless steel, plastics, or the like. In some embodiments, the driving unit 120 and the vibration unit 130 may be assembled using bonding, etc.

Figure 45:
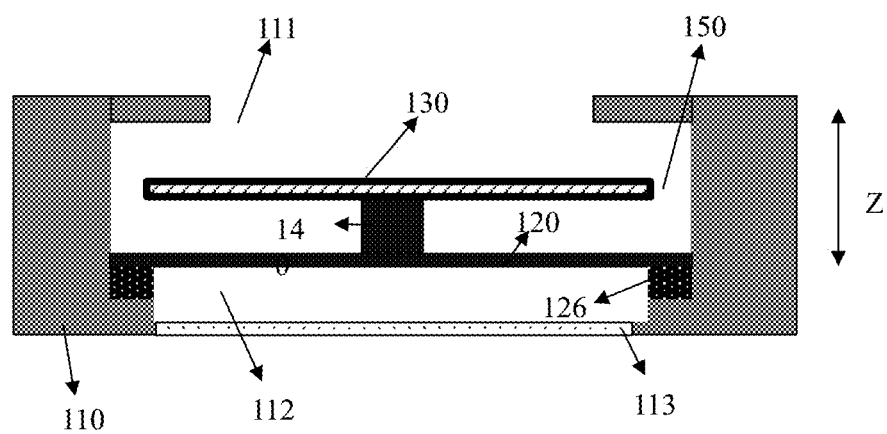
FIG. 45 is a schematic diagram illustrating an exemplary internal structure of a loudspeaker with a slit structure according to some embodiments of the present disclosure.

FIG. 45 is a schematic diagram illustrating an exemplary internal structure of a loudspeaker with a slit structure according to some embodiments of the present disclosure.

In some embodiments, the vibration unit 130 is not directly connected with the casing 110, as shown in FIG. 45, and there is a slit structure 150 between the vibration unit 130 and an inner wall of the casing 110. In some embodiments, the slit structure 150 is a 360° ring structure. By providing the slit structure 150 between the vibration unit 130 and the casing 110, a binding force of the vibration unit 130 during movement can be reduced, thereby increasing a movement stroke (a vibration amplitude) of the vibration unit 130, thereby enhancing an output sound pressure level of the loudspeaker 100.

Meanwhile, in some embodiments, in order to prevent acoustic leakage from the front cavity 111 and the rear cavity 112 when the vibration unit 130 moves, which results in an acoustic short-circuiting to reduce the output of the loudspeaker 100, a width of the slit structure 150 may be in a range of 5 μm to 30 μm. In some embodiments, in order to further prevent acoustic short-circuiting from leading to a reduction in the output of the loudspeaker 100, the width of the slit structure 150 may be in a range of 10 μm to 20 μm.

In some embodiments, in order to ensure that a vibration direction of the vibration unit 130 (e.g., the diaphragm 131) remains unchanged and is not deflected during movement, a shape and structure of the vibration transmission unit 140 may be designed to increase a contact area between the vibration transmission unit 140 and the vibration unit 130.

Figure 46A:
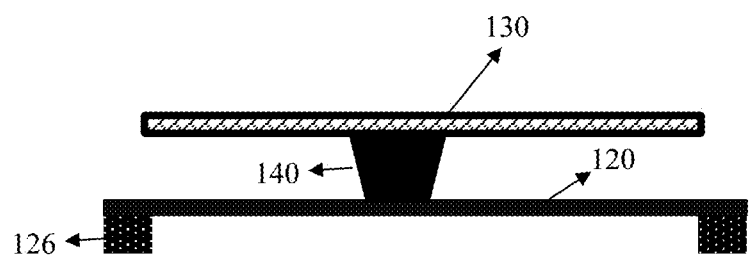
FIG. 46A to FIG. 46B are schematic diagrams illustrating a portion of a structure of a loudspeaker according to some embodiments of the present disclosure.
Figure 46B:
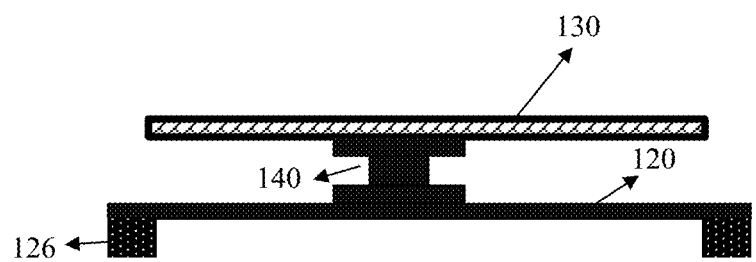

FIG. 46A to FIG. 46B are schematic diagrams illustrating a portion of a structure of a loudspeaker according to some embodiments of the present disclosure. In some embodiments, a loudspeaker shown in FIG. 46A is similar to the loudspeaker shown in FIG. 1A, with a difference that the vibration transmission unit of the loudspeaker shown in FIG. 46A has a trapezoidal structure. In some embodiments, a loudspeaker illustrated in FIG. 46B is similar to the loudspeaker illustrated in FIG. 1A, with a difference that the vibration transmission unit of the loudspeaker illustrated in FIG. 6B has a structure with a shape of a character "I".

In some embodiments, in order to avoid a localized deformation mode of the vibration unit 130 of the loudspeaker 100, a ratio of stiffness to mass of the vibration unit 130 may be increased.

Figure 47:
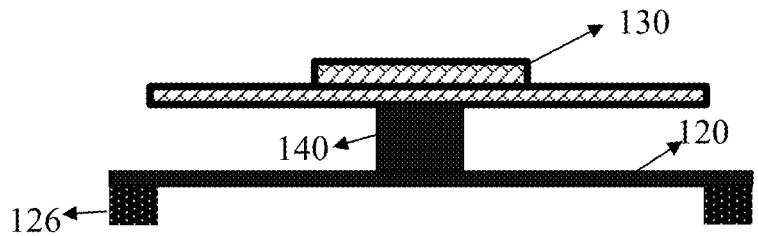
FIG. 47 is a schematic diagram illustrating a portion of a structure of a loudspeaker according to some other embodiments of the present disclosure.

FIG. 47 is a schematic diagram illustrating a portion of a structure of a loudspeaker according to some other embodiments of the present disclosure.

In some embodiments, a loudspeaker illustrated in FIG. 47 is similar to a loudspeaker illustrated in FIG. 1A, with a difference that the vibration unit 130 of the loudspeaker illustrated in FIG. 47 has a stepped structure. For example, as shown in FIG. 47, the vibration unit 130 with the stepped structure may be added a layer of diaphragm (not shown in the figure) at a center portion of the diaphragm 131. An area of the newly added diaphragm is smaller than an area of the original diaphragm 131.

Figure 48:
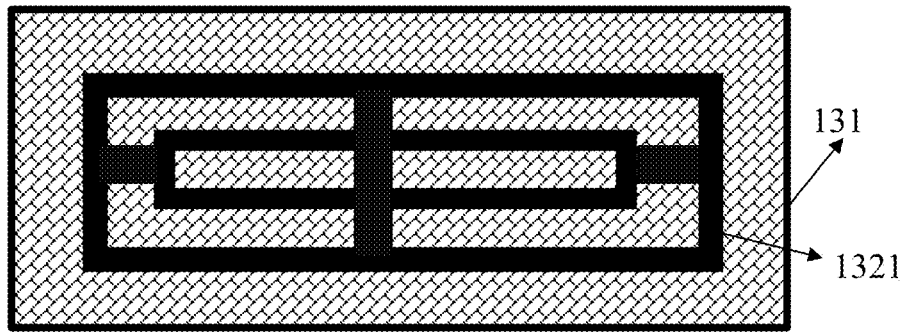
FIG. 48 is a diagram illustrating a projection of a vibration unit in a vibration direction of a diaphragm according to some embodiments of the present disclosure.

FIG. 48 is a diagram illustrating a projection of a vibration unit in a vibration direction of a diaphragm according to some embodiments of the present disclosure.

In some embodiments, a loudspeaker illustrated in FIG. 48 is similar to a loudspeaker illustrated in FIG. 1A, with a difference that the diaphragm 131 of the vibration unit 130 illustrated in FIG. 48 is provided with the reinforcement structure 1321. As shown in FIG. 48, the reinforcement structure 1321 may be arranged in a length direction and a width direction of the diaphragm 131, and a projection pattern of the reinforcement structure 1321 has one or more hollow structures. Further description of the reinforcement structure can be found elsewhere in the present disclosure (e.g., the description in connection with FIG. 35 to FIG. 37).

In some embodiments of the present disclosure, a ratio of stiffness to mass of the vibration unit 130 may be further increased by designing the vibration unit 130 with a stepped structure, and by designing the vibration unit 130 with the reinforcement structure, it can be ensured that the diaphragm always moves in a vibration direction (i.e., a z-direction) to avoid a localized deformation mode of the vibration unit 130.

In some embodiments, the driving beam 122 has a driving beam reinforcement layer.

Figure 49A:
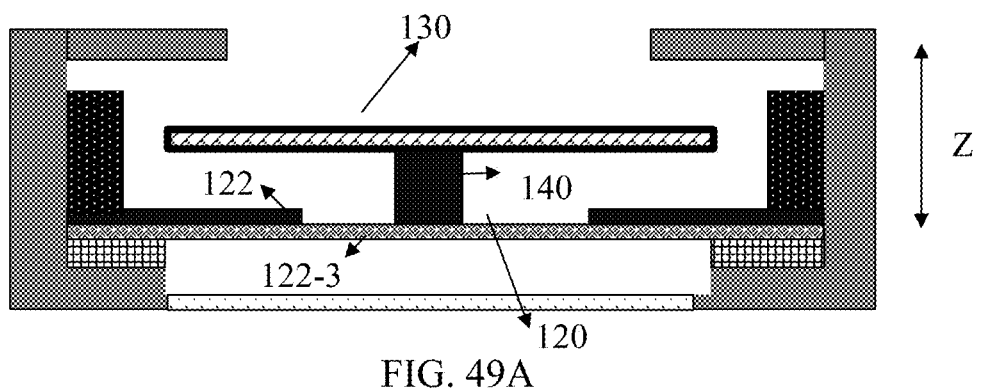
FIG. 49A is a schematic diagram illustrating a loudspeaker according to some embodiments of the present disclosure.

FIG. 49A is a schematic diagram illustrating a loudspeaker according to some embodiments of the present disclosure.

In some embodiments, a loudspeaker shown in FIG. 49A is similar to a loudspeaker shown in FIG. 1A, with a difference that the driving beam 122 of the loudspeaker shown in FIG. 49A is provided with a driving beam reinforcement layer 122-3. The driving beam reinforcement layer 122-3 may be disposed on a side of the driving beam 122 away from the vibration unit 130 to reinforce the driving beam 122. The driving beam reinforcement layer 122-3 may be connected with the overhanging region 122-2 of different driving beams 122, and a plurality of driving beams 122 are in drive-connection with the vibration transmission unit 140 or the vibration unit 130 through the driving beam reinforcement layer 122-3. In some embodiments, the driving beam reinforcement layer 122-3 may be made of a polymer material or a semiconductor material. Exemplary polymeric materials include polyimide, photoresist, Pyrex, hydrogel, or the like. Exemplary semiconductor materials include one or more composites of silicon, silicon nitride, silicon oxide, silicon carbide, or the like.

In some embodiments, in order for greater displacement of the driving beam 122, the slit structure 150 may be designed between the driving beam 122 and the substrate 126 of the driving unit 120 of the loudspeaker 100, or between different driving beams 122.

Figure 49B:
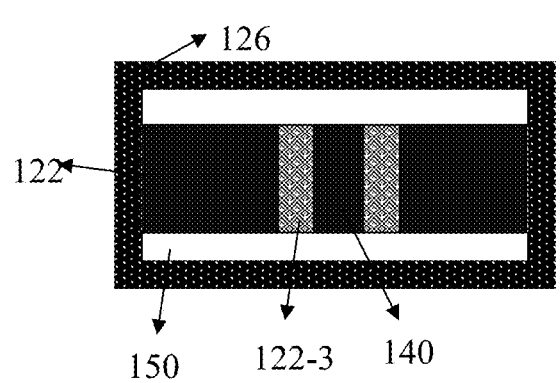
FIG. 49B is a diagram illustrating projections of a driving beam and a diaphragm in a vibration direction of a vibration unit according to some embodiments of the present disclosure.

FIG. 49B is a diagram illustrating projections of a driving beam and a diaphragm in a vibration direction of a vibration unit according to some embodiments of the present disclosure.

In some embodiments, a loudspeaker shown in FIG. 49B is similar to a loudspeaker shown in FIG. 49A, with a difference that the loudspeaker shown in FIG. 49B has the slit structure 150 between the driving beam 122 and the substrate 126.

In some embodiments, the slit structure is also present between adjacent driving beams, as shown in FIG. 21I, where the slit structure 150 is present between adjacent driving beams 122.

In some embodiments, the loudspeaker 100 may include a plurality of driving units 120 arranged side-by-side.

Figure 50A:
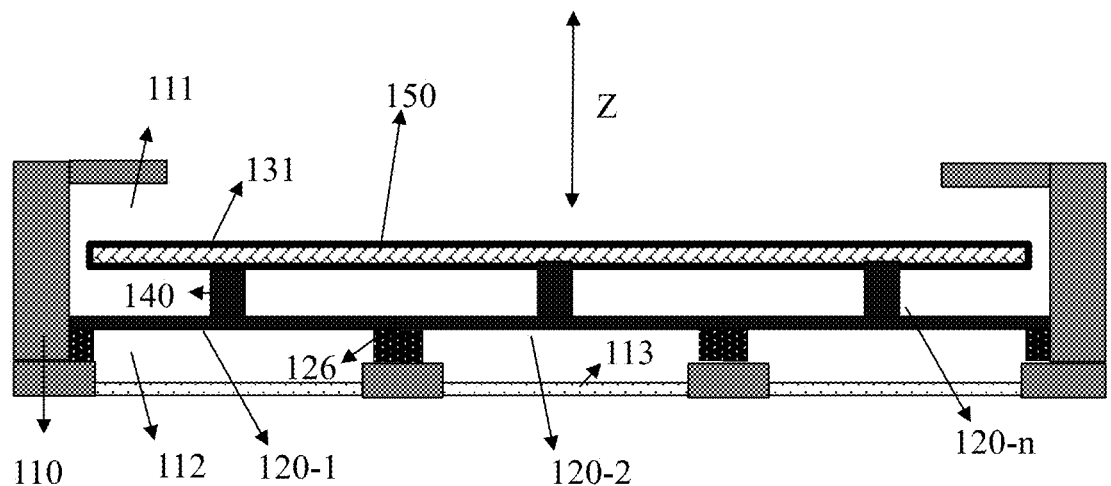
FIG. 50A to FIG. 50B are schematic diagrams illustrating a loudspeaker including a plurality of driving units arranged parallelly according to some embodiments of the present disclosure.
Figure 50B:
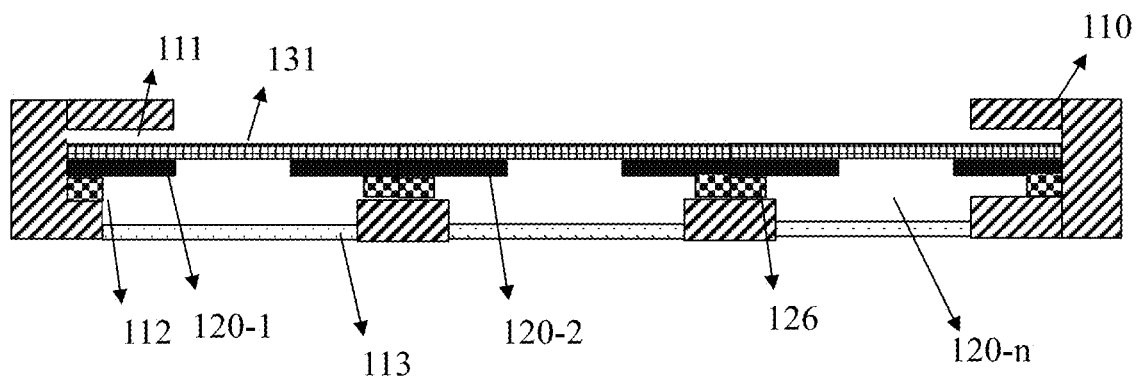

FIG. 50A to FIG. 50B are schematic diagrams illustrating a loudspeaker including a plurality of driving units arranged parallelly according to some embodiments of the present disclosure.

As shown in FIG. 50A, the loudspeaker 100 may include a plurality of driving units (e.g., driving units 120-1, 120-2, 120-n, etc.) arranged parallelly. The plurality of driving units are in drive-connection with the vibration unit 130 through corresponding vibration transmission units 140, respectively, and the plurality of driving units collectively provide a sufficiently large amount of driving force for the vibration of the vibration unit 130 to increase a vibration amplitude of the vibration unit 130 and enhance the output of the loudspeaker 100. Each driving beam of the plurality of driving units may be connected with a bottom wall of the casing 110 through the substrate 126, respectively. A portion between adjacent substrates 126 may be used as a driving unit, and a corresponding portion of the casing 110 is accordingly provided with an acoustic hole for sound output.

A loudspeaker shown in FIG. 50B is similar to the loudspeaker shown in FIG. 50A, with a difference that the loudspeaker 100 shown in FIG. 50B does not include the vibration transmission unit 140, and the plurality of driving units (e.g., the driving units 120-1, 120-2, 120-n, etc.) arranged parallelly are directly connected with the vibration unit 130 (e.g., the diaphragm 131).

In some embodiments of the present disclosure, by providing a plurality of driving units arranged parallelly in the loudspeaker, a distribution range of the sound output from the loudspeaker may be increased and a sound volume may be enhanced. Furthermore, different driving units may separately adapt to different frequencies of electrical signals and conversion of the sound signal, making the audio performance more comprehensive.

The basic concepts have been described above, and it is apparent to those skilled in the art that the foregoing detailed disclosure serves only as an example and does not constitute a limitation of the present disclosure. Although not explicitly stated here, those skilled in the art may make various modifications, improvements and amendments to the present disclosure. These alterations, improvements, and modifications are intended to be suggested by the present disclosure, and are within the spirit and scope of the exemplary embodiments of the present disclosure.

Moreover, certain terminology has been used to describe embodiments of the present disclosure. As in "one embodiment", "an embodiment", and/or "some embodiments" means a feature, structure, or characteristic associated with at least one embodiment of the present disclosure. Accordingly, it should be emphasized and noted that two or more references to "one embodiment" or "an embodiment" in different locations in the present disclosure do not necessarily refer to the same embodiment. In addition, some features, structures, or features in the present disclosure of one or more embodiments may be appropriately combined.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

Some embodiments use numbers to describe the number of components, attributes, and it should be understood that such numbers used in the description of the embodiments are modified in some examples by the modifiers "about", "approximately", or "substantially". Unless otherwise noted, the terms "about", "approximately", or "substantially" indicates that a ±20% variation in the stated number is allowed. Correspondingly, in some embodiments, the numerical parameters used in the present disclosure and claims are approximations, which approximations are subject to change depending on the desired characteristics of individual embodiments. In some embodiments, the numerical parameters should take into account the specified number of valid digits and employ general place-keeping. While the numerical domains and parameters used to confirm the breadth of their ranges in some embodiments of the present disclosure are approximations, in specific embodiments, such values are set to be as precise as possible within a feasible range.

For each patent, patent application, patent application disclosure, and other material cited in the present disclosure, such as articles, books, specifications, publications, documents, etc., the entire contents of which are hereby incorporated herein by reference. Except for application history documents that are inconsistent with or conflict with the contents of the present disclosure, and except for documents (currently or hereafter appended to the present disclosure) that limit the broadest scope of the claims of the present disclosure. It should be noted that to the extent that there is an inconsistency or conflict between the descriptions, definitions, and/or use of terms in the materials appurtenant to this application and those set forth herein, the descriptions, definitions, and/or use of terms in this application shall prevail.

At last, it should be understood that the embodiments described in the present disclosure are merely illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A loudspeaker, comprising: a casing, a driving unit, and a vibration unit, wherein:
    the driving unit is fixed to the casing and is drivingly connected with the vibration unit;
    the driving unit includes a plurality of driving beams, each of the plurality of driving beams includes a fixed region and an overhanging region, each of the plurality of driving beams is connected with the casing through its fixed region, and each of the plurality of driving beams is connected with the vibration unit through its overhanging region; and each of the plurality of driving beams includes a substrate layer, a first electrode layer, a piezoelectric layer, a second electrode layer, and a reinforcement layer stacked in a vibration direction of the vibration unit, and a ratio of a thickness of the substrate layer to a thickness of the piezoelectric layer is in a range of 0 to 2, wherein each of the plurality of driving beams is connected with a vibration transmission unit, respectively, the vibration transmission unit is connected with the vibration unit, and each of the plurality of driving beams transmits vibration to the vibration unit through the vibration transmission unit.

2. The loudspeaker of claim 1, wherein, for each of the plurality of driving beams, in a direction extending from the fixed region to the overhanging region, the overhanging region has a length dimension;

in the vibration direction of the vibration unit, the overhanging region has a thickness dimension; and a square root of a ratio of the thickness dimension of the overhanging region to a square of the length dimension of the overhanging region is in a range of 0.01 to 0.3.

3. The loudspeaker of claim 1, wherein each of the plurality of driving beams includes a piezoelectric structure and one or more reinforcement layers stacked in the vibration direction of the vibration unit, and a slot structure is provided on a reinforcement layer that is furthest away from the piezoelectric structure; wherein the slot structure includes a plurality of slots in a direction extending from the fixed region to the overhanging region, and a dimension of a slot that is proximate to the fixed region is greater than a dimension of a slot that is further away from the fixed region; or the slot structure includes a plurality of reinforcement members spaced apart in a direction extending from the fixed region to the overhanging region, a slot is provided between any two adjacent reinforcement members, and a width of a reinforcement member that is further away from the fixed region is greater than a width of a reinforcement member that is proximate to the fixed region.

4. The loudspeaker of claim 1, wherein the driving unit includes two sets of driving beams disposed on opposite sides of the casing, each of the two sets of driving beams includes one or more driving beams, and a shape of the one or more driving beams includes a rectangle, a trapezoid, or a rounded chamfered corner.

5. The loudspeaker of claim 4, wherein the driving unit further includes two sets of driving beams located on another pair of opposite sides of the casing.

6. The loudspeaker of claim 5, wherein the vibration transmission unit includes a ring structure, and each set of the driving beams is connected with a different region of the vibration transmission unit.

7. The loudspeaker of claim 6, wherein a second driving beam is connected with the vibration transmission unit and is indirectly connected with the casing, the vibration unit further includes a mass element, one end of the second driving beam away from the vibration transmission unit is directly connected with the mass element; or the end of the second driving beam away from the vibration transmission unit is connected with the mass element through a coupled elastic structure.

8. The loudspeaker of claim 6, wherein the vibration unit further includes a mass element, and the vibration transmission unit is connected with the mass element through a coupled elastic structure.

9. The loudspeaker of claim 4, wherein the two sets of driving beams extend in a staggered type, the vibration transmission unit includes a folded structure, and each set of the two sets of driving beams is connected with a different region of the vibration transmission unit.

10. The loudspeaker of claim 9, wherein each set of the two sets of driving beams is directly connected with the vibration transmission unit; or each set of the two sets of driving beams is connected with the vibration transmission unit through a coupled elastic structure.

11. The loudspeaker of claim 4, wherein each set of the two sets of driving beams includes one driving beam with a bent structure, and each driving beam with a bent structure has an end away from its fixed region, two ends of the two driving beams each with a bent structure are coupled to a same vibration transmission unit.

12. The loudspeaker of claim 1, wherein each of the plurality of driving beams is stacked in a different region of the vibration unit.

13. The loudspeaker of claim 12, wherein the vibration unit includes a suspension region not covered by the driving beams, in a direction extending from the fixed region to the overhanging region, the overhanging region has a length dimension, a sum of a length of each of the driving beams and half of a length of the suspension region is defined as a first parameter, and a ratio of the length dimension of the overhanging region to the first parameter is in a range of 0.7 to 1; or in a direction perpendicular to a direction extending from the fixed region to the overhanging region, a ratio of a width dimension of the overhanging region to a width dimension of the suspension region is in a range of 0.5 to 0.95.

14. The loudspeaker of claim 12, wherein different driving beams are connected with each other through a coupled elastic structure.

15. The loudspeaker of claim 1, wherein the overhanging region of each of the plurality of driving beams includes a non-electrode-covered region, at least a portion of the non-electrode-covered region is located at an end portion of the driving beam away from the fixed region.

16. The loudspeaker of claim 15, wherein the overhanging region of each of the plurality of driving beams includes an electrode-covered region, in a direction extending from the fixed region to the overhanging region, a ratio of a length dimension of the electrode-covered region to a length dimension of the overhanging region is in a range of 0.3 to 1; or a ratio of an area of the electrode-covered region to an area of the overhanging region is in a range of 0.3 to 1.

17. The loudspeaker of claim 1, wherein each of the plurality of driving beams is connected with the vibration transmission unit through a coupled elastic structure.

18. The loudspeaker of claim 1, wherein the vibration unit includes a movable region, the movable region is provided with a reinforcement structure, at least a portion of the reinforcement structure covers the movable region, and a projection of a center of the reinforcement structure coincides with a projection of a center of the movable region in the vibration direction of the vibration unit.

19. The loudspeaker of claim 18, wherein the reinforcement structure is provided with a hollow structure; or the reinforcement structure is provided with a notch along a periphery of the reinforcement structure.

* * * * *